(12) United States Patent
Kubota et al.

(10) Patent No.: US 12,349,576 B2
(45) Date of Patent: Jul. 1, 2025

(54) DISPLAY APPARATUS, DISPLAY MODULE, AND ELECTRONIC DEVICE

(71) Applicant: Semiconductor Energy Laboratory Co., Ltd., Kanagawa-ken (JP)

(72) Inventors: Daisuke Kubota, Kanagawa (JP); Ryo Hatsumi, Kanagawa (JP); Taisuke Kamada, Saitama (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 84 days.

(21) Appl. No.: 17/766,859

(22) PCT Filed: Sep. 30, 2020

(86) PCT No.: PCT/IB2020/059123
§ 371 (c)(1),
(2) Date: Apr. 6, 2022

(87) PCT Pub. No.: WO2021/070008
PCT Pub. Date: Apr. 15, 2021

(65) Prior Publication Data
US 2024/0074272 A1 Feb. 29, 2024

(30) Foreign Application Priority Data
Oct. 11, 2019 (JP) .................................. 2019-187949

(51) Int. Cl.
*H10K 59/65* (2023.01)
*H10K 59/35* (2023.01)
(Continued)

(52) U.S. Cl.
CPC ........... *H10K 59/65* (2023.02); *H10K 59/351* (2023.02); *H10K 59/352* (2023.02);
(Continued)

(58) Field of Classification Search
CPC .. H10K 59/353; H10K 59/351; H10K 59/352; H10K 59/40; H10K 59/876;
(Continued)

(56) References Cited

U.S. PATENT DOCUMENTS 7,936,342 B2    5/2011  Tateuchi et al.
8,816,992 B2    8/2014  Tateuchi et al.
(Continued)

FOREIGN PATENT DOCUMENTS

CN    101162416 A    4/2008
CN    104934008 A    9/2015
(Continued)

OTHER PUBLICATIONS

Liu, Po Tsun et al., "Highly Responsive Blue Light Sensor with Amorphous Indium-Zinc-Oxide Thin-Film Transistor based Architecture", Sci Rep, vol. 8, All Pages. (Year: 2018).*
(Continued)

*Primary Examiner* — Fernando L Toledo
*Assistant Examiner* — Marshall Mu-Nuo Hatfield
(74) *Attorney, Agent, or Firm* — Husch Blackwell LLP

(57) ABSTRACT

A display apparatus having a light detection function is provided. The display apparatus includes a first pixel and a second pixel. The first pixel includes a first subpixel and a second subpixel. The second pixel includes a third subpixel. The first subpixel is a subpixel that emits light with the shortest wavelength (e.g., blue light or light with a shorter wavelength than blue light) in subpixels included in the first pixel. The second subpixel has a function of receiving the light emitted by the first subpixel. The third subpixel is a subpixel that emits light with the shortest wavelength in subpixels included in the second pixel. The wavelength of the light emitted by the first subpixel is shorter than the wavelength of the light emitted by the third subpixel.

18 Claims, 21 Drawing Sheets

(51) Int. Cl.
  *H10K 59/40* (2023.01)
  *H10K 59/80* (2023.01)
(52) U.S. Cl.
  CPC .......... *H10K 59/353* (2023.02); *H10K 59/40* (2023.02); *H10K 59/876* (2023.02)
(58) Field of Classification Search
  CPC .... H10K 59/65; H10K 59/121; H10K 59/122; H10K 59/60; H10K 59/38; H10K 50/19; G02B 5/20; G06F 3/042; G09F 9/30; G09F 9/302; H05B 33/12; H05B 33/24
  See application file for complete search history.

(56) References Cited

U.S. PATENT DOCUMENTS

| | | | |
|---|---|---|---|
| 8,827,488 | B2 | 9/2014 | Weaver et al. |
| 9,385,167 | B2 | 7/2016 | Hack et al. |
| 9,465,429 | B2 | 10/2016 | Kitchens, II et al. |
| 9,494,995 | B2 | 11/2016 | Kitchens, II et al. |
| 9,559,151 | B2 | 1/2017 | Hack et al. |
| 9,606,606 | B2 | 3/2017 | Kitchens, II et al. |
| 9,798,372 | B2 | 10/2017 | Kitchens, II et al. |
| 10,031,602 | B2 | 7/2018 | Kitchens, II et al. |
| 10,177,201 | B2 | 1/2019 | Hack et al. |
| 10,192,936 | B1 | 1/2019 | Hack et al. |
| 10,296,775 | B2 * | 5/2019 | Reinhold ................ G06F 3/042 |
| 10,388,706 | B2 | 8/2019 | Lee et al. |
| 10,431,634 | B2 | 10/2019 | Uchida et al. |
| 10,985,220 | B2 | 4/2021 | Lee et al. |
| 11,188,728 | B2 * | 11/2021 | Park ..................... G09G 3/3208 |
| 2004/0042707 | A1 | 3/2004 | Imai et al. |
| 2005/0219229 | A1 | 10/2005 | Yamaguchi et al. |
| 2005/0253790 | A1 | 11/2005 | Uchida |
| 2008/0084402 | A1 | 4/2008 | Tateuchi et al. |
| 2008/0252223 | A1 | 10/2008 | Toyoda et al. |
| 2009/0141004 | A1 | 6/2009 | Yamazaki |
| 2010/0033450 | A1 | 2/2010 | Koyama et al. |
| 2010/0085331 | A1 | 4/2010 | Kurokawa et al. |
| 2010/0117991 | A1 | 5/2010 | Koyama et al. |
| 2010/0156850 | A1 | 6/2010 | Kurokawa |
| 2010/0182282 | A1 | 7/2010 | Kurokawa et al. |
| 2010/0220041 | A1 | 9/2010 | Smith |
| 2010/0225252 | A1 | 9/2010 | Weaver et al. |
| 2010/0225615 | A1 | 9/2010 | Kurokawa |
| 2011/0001725 | A1 | 1/2011 | Kurokawa |
| 2011/0043464 | A1 | 2/2011 | Lee et al. |
| 2011/0043473 | A1 | 2/2011 | Kozuma |
| 2011/0069020 | A1* | 3/2011 | Kim ..................... G06F 3/0412 345/173 |
| 2011/0096009 | A1 | 4/2011 | Kurokawa et al. |
| 2011/0148835 | A1 | 6/2011 | Yamazaki |
| 2012/0085890 | A1 | 4/2012 | Kurokawa |
| 2012/0119073 | A1 | 5/2012 | Kurokawa et al. |
| 2013/0075761 | A1 | 3/2013 | Akiyama |
| 2013/0299789 | A1 | 11/2013 | Yamazaki et al. |
| 2014/0085277 | A1 | 3/2014 | Iwaki |
| 2014/0340363 | A1 | 11/2014 | Ikeda et al. |
| 2014/0354597 | A1 | 12/2014 | Kitchens, II et al. |
| 2015/0346897 | A1 | 12/2015 | Irri et al. |
| 2016/0093678 | A1 | 3/2016 | Seo et al. |
| 2016/0174847 | A1 | 6/2016 | Tsuchiya |
| 2017/0025444 | A1 | 1/2017 | Hirakata |
| 2017/0032728 | A1 | 2/2017 | Shima et al. |
| 2017/0098689 | A1 | 4/2017 | Ikeda et al. |
| 2017/0235381 | A1 | 8/2017 | Katagiri |
| 2017/0242533 | A1 | 8/2017 | Liu et al. |
| 2017/0365224 | A1 | 12/2017 | Okamoto |
| 2017/0373036 | A1 | 12/2017 | Yamazaki et al. |
| 2018/0012943 | A1 | 1/2018 | Ikeda et al. |
| 2018/0040665 | A1 | 2/2018 | Ohmae et al. |
| 2018/0151638 | A1* | 5/2018 | Luo ..................... H10K 59/353 |
| 2018/0247981 | A1 | 8/2018 | Yamaoka et al. |
| 2019/0042823 | A1 | 2/2019 | He et al. |
| 2019/0067379 | A1 | 2/2019 | Uchida et al. |
| 2019/0073938 | A1* | 3/2019 | Shi ..................... G09G 3/3275 |
| 2019/0237521 | A1* | 8/2019 | Ju ......................... H10K 59/12 |
| 2019/0319168 | A1* | 10/2019 | Kim ..................... H10K 59/131 |
| 2020/0168674 | A1* | 5/2020 | Tan ..................... G02F 1/1333 |
| 2020/0194502 | A1* | 6/2020 | Joo ..................... H10K 50/865 |
| 2020/0279892 | A1* | 9/2020 | Chen ................... G09G 3/3225 |
| 2020/0357863 | A1 | 11/2020 | Nakamura et al. |
| 2021/0327979 | A1 | 10/2021 | Kamada et al. |

FOREIGN PATENT DOCUMENTS

| | | |
|---|---|---|
| CN | 105229580 A | 1/2016 |
| CN | 108029163 A | 5/2018 |
| CN | 109492520 A | 3/2019 |
| EP | 3 005 023 A | 4/2016 |
| EP | 3144972 A | 3/2017 |
| EP | 3373355 A | 9/2018 |
| EP | 3751618 A | 12/2020 |
| EP | 3761370 A | 1/2021 |
| JP | 10-171375 A | 6/1998 |
| JP | 2003-330383 A | 11/2003 |
| JP | 2005-301373 A | 10/2005 |
| JP | 2008-116921 A | 5/2008 |
| JP | 2008-262569 A | 10/2008 |
| JP | 2009-271308 A | 11/2009 |
| JP | 2012-504852 | 2/2012 |
| JP | 2014-197522 A | 10/2014 |
| JP | 2016-524755 | 8/2016 |
| JP | 2018-037356 A | 3/2018 |
| JP | 2018-147877 A | 9/2018 |
| KR | 2016-0014708 A | 2/2016 |
| WO | WO-2010/039938 | 4/2010 |
| WO | WO-2011/123134 | 10/2011 |
| WO | WO-2012/138999 | 10/2012 |
| WO | WO 2014/197243 A2 | 12/2014 |
| WO | WO 2014/197245 A1 | 12/2014 |
| WO | WO 2014/197247 A1 | 12/2014 |
| WO | WO 2014/197252 A2 | 12/2014 |
| WO | WO-2016/152321 | 9/2016 |
| WO | WO 2017/005147 A1 | 1/2017 |
| WO | WO 2017/043245 A1 | 3/2017 |

OTHER PUBLICATIONS

International Search Report (Application No. PCT/IB2020/059123) Dated Dec. 28, 2020.

Written Opinion (Application No. PCT/IB2020/059123) Dated Dec. 28, 2020.

Akkerman, H. et al., "Printed Organic Photodetector Arrays and their use in Palmprint Scanners," SID Digest '18: SID International Symposium Digest of Technical Papers, May 22, 2018, vol. 49, No. 1, pp. 494-497.

Gandhi, J. et al., "56.1: Sunlight Readability of Digital Micro Shutter Based Display Technology," SID Digest '10: SID International Symposium Digest of Technical Papers, 2010, vol. 41, pp. 834-837.

* cited by examiner

DISPLAY APPARATUS, DISPLAY MODULE, AND ELECTRONIC DEVICE

This application is a 371 of international application PCT/IB2020/059123 filed on Sep. 30, 2020 which is incorporated herein by reference.

TECHNICAL FIELD

One embodiment of the present invention relates to a display apparatus, a display module, and an electronic device. One embodiment of the present invention relates to a display apparatus including a light-receiving device (also referred to as a light-receiving element) and a light-emitting device (also referred to as a light-emitting element). Furthermore, one embodiment of the present invention relates to a display apparatus including a light-emitting and light-receiving device (also referred to as a light-emitting and light-receiving element) and a light-emitting device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Recent display apparatuses have been expected to be applied to a variety of uses. Examples of uses for large-size display apparatuses include a television device for home use (also referred to as a TV or a television receiver), digital signage, and a PID (Public Information Display). In addition, a smartphone and a tablet terminal including a touch panel are being developed as portable information terminals.

Light-emitting apparatuses including light-emitting devices have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a direct-current low voltage source, and have been used in display apparatuses. For example, Patent Document 1 discloses a flexible light-emitting apparatus using an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having a light detection function. An object of one embodiment of the present invention is to increase the resolution of a display apparatus having a light detection function. An object of one embodiment of the present invention is to provide a highly convenient display apparatus. An object of one embodiment of the present invention is to provide a multifunctional display apparatus. An object of one embodiment of the present invention is to provide a display apparatus with a high aperture ratio. An object of one embodiment of the present invention is to provide a novel display apparatus.

Note that the description of these objects does not preclude the existence of other objects. One embodiment of the present invention does not need to achieve all these objects. Other objects can be derived from the description of the specification, the drawings, and the claims.

Means for Solving the Problems

A display apparatus of one embodiment of the present invention includes a first pixel and a second pixel. The first pixel includes a first subpixel and a second subpixel. The second pixel includes a third subpixel. The first subpixel is a subpixel that emits light with the shortest wavelength (e.g., blue light or light with a shorter wavelength than blue light) in subpixels included in the first pixel. The second subpixel has a function of receiving the light emitted by the first subpixel. The third subpixel is a subpixel that emits light with the shortest wavelength in subpixels included in the second pixel. The wavelength of the light emitted by the first subpixel is shorter than the wavelength of the light emitted by the third subpixel.

A display apparatus of another embodiment of the present invention includes a first pixel, a second pixel, and a third pixel. The first pixel includes a first subpixel. The second pixel includes a second subpixel. The third pixel includes a third subpixel. The first subpixel is a subpixel that emits light with the shortest wavelength in subpixels included in the first pixel. The second subpixel has a function of receiving the light emitted by the first subpixel. The third subpixel is a subpixel that emits light with the shortest wavelength in subpixels included in the third pixel. The wavelength of the light emitted by the first subpixel is shorter than the wavelength of the light emitted by the third subpixel.

The first subpixel preferably includes a first light-emitting device. The third subpixel preferably includes a second light-emitting device. The first light-emitting device preferably has a microcavity structure that intensifies light with a first wavelength. The second light-emitting device preferably has a microcavity structure that intensifies light with a second wavelength. The first wavelength is preferably shorter than the second wavelength.

Alternatively, the first subpixel preferably includes a first light-emitting device and a coloring layer. The third subpixel preferably includes a second light-emitting device. The coloring layer preferably overlaps with a light-emitting region of the first light-emitting device. The coloring layer preferably has a function of absorbing part of light emitted by the first light-emitting device. The first light-emitting device and the second light-emitting device preferably include the same light-emitting layer.

Alternatively, the first subpixel preferably includes a first light-emitting device. The third subpixel preferably includes a second light-emitting device. The first light-emitting device preferably includes a first light-emitting layer. The second light-emitting device preferably includes a second light-emitting layer. The first light-emitting device preferably emits light with a shorter wavelength than light emitted by the second light-emitting device.

The second subpixel preferably includes a light-receiving device that receives light emitted by the first subpixel and converts the light into an electric signal.

Alternatively, the second subpixel preferably includes a light-emitting and light-receiving device. The light-emitting and light-receiving device preferably has a function of emitting light with a longer wavelength than light emitted by the first subpixel. The light-emitting and light-receiving device preferably has a function of receiving the light emitted by the first subpixel and converting the light into an electric signal.

The third subpixel preferably emits blue light. The first subpixel preferably emits blue light or light with a shorter wavelength than blue light.

One embodiment of the present invention is a module or the like that includes the display apparatus having any of the above structures and that is provided with a connector such as a flexible printed circuit (hereinafter referred to as an FPC) or a TCP (Tape Carrier Package) or an integrated circuit (IC) by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display apparatus having a light detection function. One embodiment of the present invention can increase the resolution of a display apparatus having a light detection function. One embodiment of the present invention can provide a highly convenient display apparatus. One embodiment of the present invention can provide a multifunctional display apparatus. One embodiment of the present invention can provide a display apparatus with a high aperture ratio. One embodiment of the present invention can provide a novel display apparatus.

Note that the description of these effects does not preclude the existence of other effects. One embodiment of the present invention does not need to have all these effects. Other effects can be derived from the description of the specification, the drawings, and the claims.

MODE FOR CARRYING OUT THE INVENTION

Figure 1A:
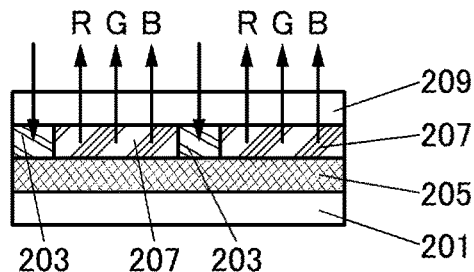
FIG. 1A to FIG. 1D and FIG. 1F are cross-sectional views each illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for portions having similar functions, and the portions are not especially denoted by reference numerals in some cases.

In addition, the position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, unless otherwise specified, in describing a structure including a plurality of elements (e.g., pixels, light-emitting devices, and light-emitting layers), alphabets are not added when a common part of the elements is described. For example, when a common part of a pixel 300*a*, a pixel 300*b*, and the like is described, the pixels are referred to as the pixel 300, in some cases.

Embodiment 1

In this embodiment, a display apparatus of one embodiment of the present invention will be described with reference to FIG. 1 to FIG. 17.

A display apparatus of one embodiment of the present invention includes a first pixel and a second pixel. The first pixel includes a first subpixel and a second subpixel. The second pixel includes a third subpixel. The first subpixel is a subpixel that emits light with the shortest wavelength in subpixels included in the first pixel. The second subpixel has a function of receiving the light emitted by the first subpixel. The third subpixel is a subpixel that emits light with the shortest wavelength in subpixels included in the second pixel. The wavelength of the light emitted by the first subpixel is shorter than the wavelength of the light emitted by the third subpixel.

A display apparatus of another embodiment of the present invention includes a first pixel, a second pixel, and a third pixel. The first pixel includes a first subpixel. The second pixel includes a second subpixel. The third pixel includes a third subpixel. The first subpixel is a subpixel that emits light with the shortest wavelength in subpixels included in the first pixel. The second subpixel has a function of receiving the light emitted by the first subpixel. The third subpixel is a subpixel that emits light with the shortest wavelength in subpixels included in the third pixel. The wavelength of the light emitted by the first subpixel is shorter than the wavelength of the light emitted by the third subpixel.

Since the wavelength of the light emitted by the first subpixel is shorter than the wavelength of the light emitted by the third subpixel, the light emitted by the first subpixel is not easily perceived by a user of the display apparatus, and a change in the amount of the light is not easily recognized by the user.

In the display apparatus of one embodiment of the present invention, at least some of pixels have a light-receiving function, which enables the touch or approach of an object to be detected while an image is displayed. For example, all the subpixels included in the display apparatus can display an image; alternatively, some subpixels can emit light as a light source and the other subpixels can display an image. In that case, when the first subpixel is used as a subpixel used as a light source, light as the light source is not easily perceived by the user to achieve natural image display.

The first subpixel and the third subpixel each preferably include a light-emitting device. The second subpixel preferably includes a light-receiving device or a light-emitting and light-receiving device.

First, the display apparatus including light-receiving devices and light-emitting devices is described.

The display apparatus of one embodiment of the present invention includes light-receiving devices and light-emitting devices. In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light in the display portion, an image can be captured or the approach or touch of an object (e.g., a finger or a stylus) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted by the light-emitting device included in the display portion, the light-receiving device can detect the reflected light (or the scattered light); thus, image capturing and touch detection are possible even in a dark place.

The display apparatus of one embodiment of the present invention has a function of displaying an image using the light-emitting devices. That is, the light-emitting devices function as display devices (also referred to as display elements).

As the light-emitting devices, EL devices such as OLEDs (Organic Light Emitting Diodes) and QLEDs (Quantum-dot Light Emitting Diodes) are preferably used. Examples of a light-emitting substance included in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (thermally activated delayed fluorescent (TADF) material). An LED such as a micro-LED (Light Emitting Diode) can also be used as the light-emitting device.

The display apparatus of one embodiment of the present invention has a function of detecting light using the light-receiving devices.

In the case where the light-receiving devices are used as the image sensor, the display apparatus can capture an image with the use of the light-receiving devices. For example, the display apparatus of this embodiment can be used as a scanner.

For example, data on biological information of a fingerprint, a palm print, or the like can be acquired with the image sensor. That is, a biological authentication sensor can be incorporated in the display apparatus. When the display apparatus incorporates a biological authentication sensor, the number of components of an electronic device can be reduced as compared to the case where a biological authentication sensor is provided separately from the display apparatus; thus, the size and weight of the electronic device can be reduced.

In the case where the light-receiving devices are used as the touch sensor, the display apparatus can detect the approach or touch of an object with the use of the light-receiving devices.

As the light-receiving devices, pn photodiodes or pin photodiodes can be used, for example. The light-receiving devices function as photoelectric conversion devices (also referred to as photoelectric conversion elements) that detect light entering the light-receiving devices and generate electric charge. The amount of electric charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL devices and the organic photodiodes can be formed over one substrate. Thus, the organic photodiodes can be incorporated in the display apparatus including the organic EL devices.

If all the layers of the organic EL devices and the organic photodiodes are formed separately, the number of deposition steps becomes extremely large. Since a large number of layers in the organic photodiodes can have structures in common with the layers in the organic EL devices, forming the layers having common structures concurrently can inhibit an increase in the number of deposition steps.

For example, one of a pair of electrodes (a common electrode) can be a layer shared by the light-receiving devices and the light-emitting devices. As another example, at least one of a hole-injection layer, a hole-transport layer, an electron-transport layer, and an electron-injection layer is preferably shared by the light-receiving devices and the light-emitting devices. As another example, the light-receiving devices and the light-emitting devices can have the same structure except that the light-receiving devices include active layers and the light-emitting devices include light-emitting layers. In other words, the light-receiving devices can be manufactured by only replacing the light-emitting layers of the light-emitting devices with active layers. When the light-receiving devices and the light-emitting devices include common layers in such a manner, the number of deposition steps and the number of masks can be reduced, thereby reducing the number of manufacturing steps and the manufacturing cost of the display apparatus. Furthermore, the display apparatus including the light-receiving devices can be manufactured using an existing manufacturing apparatus and an existing manufacturing method for the display apparatus.

Note that a layer shared by the light-receiving devices and the light-emitting devices might have different functions in the light-emitting devices and the light-receiving devices. In this specification, the name of a component is based on its function in the light-emitting devices. For example, a hole-injection layer functions as a hole-injection layer in the light-emitting devices and functions as a hole-transport layer in the light-receiving devices. Similarly, an electron-injection layer functions as an electron-injection layer in the light-emitting devices and functions as an electron-transport layer in the light-receiving devices. A layer shared by the light-receiving devices and the light-emitting devices might have the same function in both the light-emitting devices and the light-receiving devices. The hole-transport layer functions as a hole-transport layer in both the light-emitting devices and the light-receiving devices, and the electron-transport layer functions as an electron-transport layer in both the light-emitting devices and the light-receiving devices.

Next, a display apparatus including light-emitting and light-receiving devices and light-emitting devices is described.

In a display apparatus of one embodiment of the present invention, instead of the light-emitting device, a light-emitting and light-receiving device is provided in a subpixel that exhibits any color. The light-emitting and light-receiving device has both a function of emitting light (a light-emitting function) and a function of detecting incident light and converting the light into an electric signal (a light-receiving function). For example, in the case where a pixel includes three subpixels of red, green, and blue, at least one of the subpixels includes a light-emitting and light-receiving device and the other subpixels each include a light-emitting device. When the light-emitting and light-receiving device serves as both a light-emitting device and a light-receiving device, a light-receiving function can be given to the pixel without increasing the number of subpixels included in the pixel. Thus, the display portion of the display apparatus can be provided with one or both of an image capturing function and a sensing function while keeping the aperture ratio of the pixel (aperture ratio of each subpixel) and the resolution of the display apparatus.

In the display apparatus of one embodiment of the present invention, the light-emitting and light-receiving devices and the light-emitting devices are arranged in a matrix in the display portion, and an image can be displayed on the display portion. The display portion can be used as an image sensor or a touch sensor. In the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted by the light-emitting device included in the display portion, the light-emitting and light-receiving device can detect the reflected light (or the scattered light); thus, image capturing and touch detection are possible even in a dark place.

The light-emitting and light-receiving device can be manufactured by combining an organic EL device and an organic photodiode. For example, by adding an active layer of an organic photodiode to a layered structure of an organic EL device, the light-emitting and light-receiving device can be manufactured. Furthermore, in the light-emitting and light-receiving device manufactured by combining an organic EL device and an organic photodiode, concurrently forming layers that can be shared with the organic EL device can inhibit an increase in the number of deposition steps.

For example, one of a pair of electrodes (a common electrode) can be a layer shared by the light-emitting and light-receiving devices and the light-emitting devices. As another example, at least one of a hole-injection layer, a hole-transport layer, an electron-transport layer, and an electron-injection layer is preferably shared by the light-emitting and light-receiving devices and the light-emitting devices. As another example, the light-receiving devices and the light-emitting and light-receiving devices can have the same structure except that the light-receiving devices include active layers. In other words, the light-emitting and light-receiving devices can be manufactured by only adding the active layer of the light-receiving devices to the light-emitting device. When the light-emitting and light-receiving devices and the light-emitting devices include common layers in such a manner, the number of deposition steps and the number of masks can be reduced, thereby reducing the number of manufacturing steps and the manufacturing cost of the display apparatus. Furthermore, the display apparatus including the light-emitting and light-receiving devices can be manufactured using an existing manufacturing apparatus and an existing manufacturing method for the display apparatus.

Note that layers included in the light-emitting and light-receiving devices might have different functions between the case where the light-emitting and light-receiving devices function as the light-receiving devices and the case where the light-emitting and light-receiving devices function as the light-emitting devices. In this specification, the name of a component is based on its function of the case where the light-emitting and light-receiving devices function as the light-emitting devices. For example, a hole-injection layer functions as a hole-injection layer in the case where the light-emitting and light-receiving devices function as the light-emitting devices, and functions as a hole-transport layer in the case where the light-emitting and light-receiving devices function as the light-receiving devices. Similarly, an electron-injection layer functions as an electron-injection layer in the case where the light-emitting and light-receiving devices function as the light-emitting devices, and functions as an electron-transport layer in the case where the light-emitting and light-receiving devices function as the light-receiving devices. A layer included in the light-emitting and light-receiving devices might have the same function in both the case where the light-emitting and light-receiving devices function as the light-receiving devices and the case where the light-emitting and light-receiving devices function as the light-emitting devices. The hole-transport layer functions as a hole-transport layer in the case where the light-emitting and light-receiving devices function as either the light-emitting devices or the light-receiving devices, and the electron-transport layer functions as an electron-transport layer in the case where the light-emitting and light-receiving devices function as either the light-emitting devices or the light-receiving devices.

The display apparatus of this embodiment has a function of displaying an image using the light-emitting devices and the light-emitting and light-receiving devices. That is, the light-emitting devices and the light-emitting and light-receiving devices function as display devices The display apparatus of this embodiment has a function of detecting light using the light-emitting and light-receiving devices. The light-emitting and light-receiving device can detect light having a shorter wavelength than light emitted by the light-emitting and light-receiving device itself.

In the case where the light-emitting and light-receiving devices are used as the image sensor, the display apparatus of this embodiment can capture an image using the light-emitting and light-receiving devices. For example, the display apparatus of this embodiment can be used as a scanner.

In the case where the light-emitting and light-receiving devices are used as the touch sensor, the display apparatus of this embodiment can detect the approach or touch of an object with the use of the light-emitting and light-receiving devices.

The light-emitting and light-receiving devices function as photoelectric conversion devices that detect light entering the light-emitting and light-receiving devices and generate electric charge. The amount of electric charge generated from the light-emitting and light-receiving devices depends on the amount of light entering the light-emitting and light-receiving devices.

The light-emitting and light-receiving device can be manufactured by adding an active layer of the light-receiving device to the above-described structure of the light-emitting device.

The light-emitting and light-receiving devices can employ a pn or pin photodiode structure, for example.

In particular, an active layer of an organic photodiode including a layer containing an organic compound is preferably used for the light-emitting and light-receiving device. An organic photodiode, which is easily made thin, light-weight, and large in area and has a high degree of freedom for shape and design, can be used in a variety of display apparatuses.

The display apparatus of one embodiment of the present invention is more specifically described below with reference to drawings.

[Display Apparatus]

FIG. 1A to FIG. 1D and FIG. 1F are cross-sectional views of display apparatuses of embodiments of the present invention.

A display apparatus 200A illustrated in FIG. 1A includes a layer 203 including a light-receiving device, a functional layer 205, and a layer 207 including a light-emitting device between a substrate 201 and a substrate 209.

The display apparatus 200A has a structure in which red (R) light, green (G) light, and blue (B) light are emitted from the layer 207 including a light-emitting device.

The light-receiving device included in the layer 203 including a light-receiving device can detect light that enters from the outside of the display apparatus 200A.

Figure 1B:
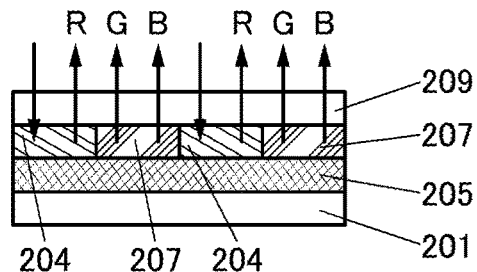

A display apparatus 200B illustrated in FIG. 1B includes a layer 204 including a light-emitting and light-receiving device, the functional layer 205, and the layer 207 including a light-emitting device between the substrate 201 and the substrate 209.

The display apparatus 200B has a structure in which green (G) light and blue (B) light are emitted from the layer 207 including a light-emitting device and red (R) light is emitted from the layer 204 including a light-emitting and light-receiving device. Note that in the display apparatus of one embodiment of the present invention, the color of light emitted from the layer 204 including a light-emitting and light-receiving device is not limited to red. Furthermore, the color of light emitted from the layer 207 including a light-emitting device is not limited to the combination of green and blue.

The light-emitting and light-receiving device included in the layer 204 including a light-emitting and light-receiving device can detect light that enters from the outside of the display apparatus 200B. The light-emitting and light-receiving device can detect one or both of green light and blue light, for example.

The functional layer 205 includes a circuit for driving the light-receiving device or the light-emitting and light-receiving device and a circuit for driving the light-emitting device. A switch, a transistor, a capacitor, a resistor, a wiring, a terminal, and the like can be provided in the functional layer 205. Note that in the case where the light-emitting device the light-receiving device are driven by a passive-matrix method, a structure not provided with a switch or a transistor may be employed.

Figure 1C:
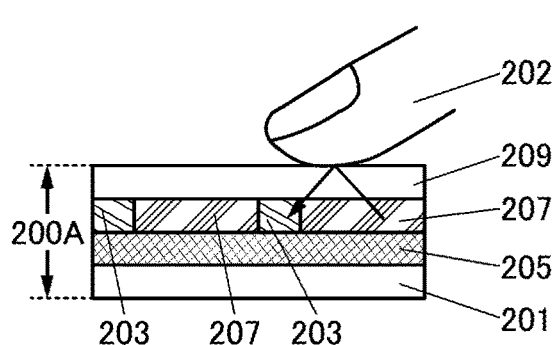

The display apparatus of one embodiment of the present invention may have a function of detecting an object such as a finger that is touching the display apparatus (a function of a touch panel). For example, light emitted by the light-emitting device in the layer 207 including a light-emitting device is reflected by a finger 202 that is touching the display apparatus 200A as illustrated in FIG. 1C; then, the light-receiving device in the layer 203 including a light-receiving device detects the reflected light. Thus, the touch of the finger 202 on the display apparatus 200A can be detected. Furthermore, in the display apparatus 200B, light emitted by the light-emitting device in the layer 207 including a light-emitting device is reflected by a finger that is touching the display apparatus 200B; then, the light-emitting and light-receiving device in the layer 204 including a light-emitting and light-receiving device can detect the reflected light. Although a case where light emitted by the light-emitting device is reflected by an object is described below as an example, light might be scattered by an object.

Figure 1D:
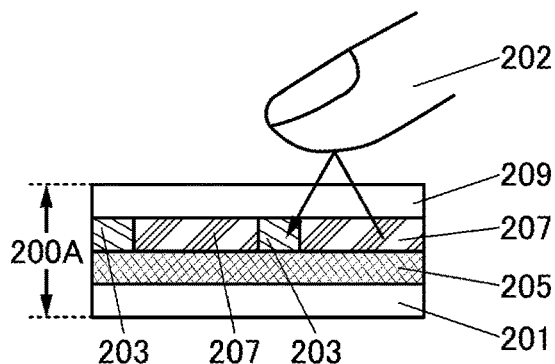

The display apparatus of one embodiment of the present invention may have a function of detecting an object that is approaching (but is not touching) the display apparatus as illustrated in FIG. 1D or capturing an image of such an object.

Figures 1E, 1F:
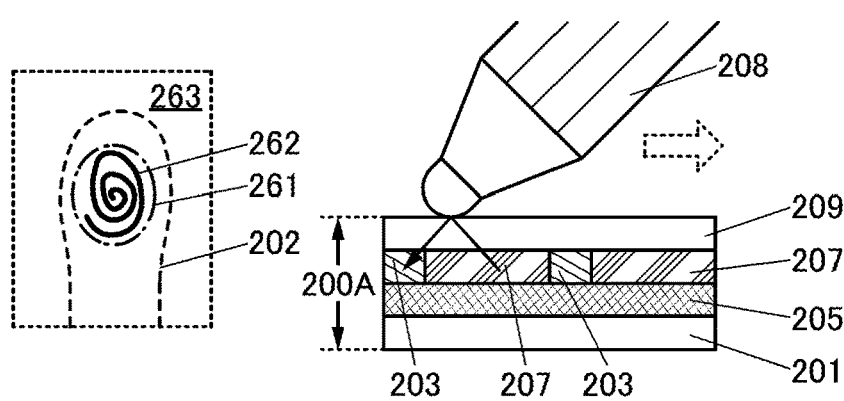
FIG. 1E and FIG. 1G are diagrams each illustrating an example of an image captured by the display apparatus.

The display apparatus of one embodiment of the present invention may have a function of detecting a fingerprint of the finger 202. FIG. 1E illustrates a diagram of an image captured by the display apparatus of one embodiment of the present invention. In an image-capturing range 263 in FIG. 1E, the outline of the finger 202 is indicated by a dashed line and the outline of a contact portion 261 is indicated by a dashed-dotted line. In the contact portion 261, a high-contrast image of a fingerprint 262 can be captured owing to a difference in the amount of light entering the light-receiving device (or the light-emitting and light-receiving device).

The display apparatus of one embodiment of the present invention can also function as a pen tablet. FIG. 1F illustrates a state in which a tip of a stylus 208 slides in a direction indicated by a dashed arrow while the tip of the stylus 208 touches the substrate 209.

As illustrated in FIG. 1F, when the scattered light scattered by the contact surface between the tip of the stylus 208 and the substrate 209 enters the layer 203 including a light-receiving device that is positioned in a portion overlapping with the contact surface, the position of the tip of the stylus 208 can be detected with high accuracy.

Figure 1G:
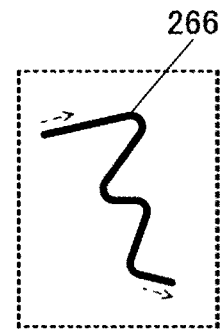

FIG. 1G illustrates an example of a path 266 of the stylus 208 that is detected by the display apparatus of one embodiment of the present invention. The display apparatus of one embodiment of the present invention can detect the position of an object such as the stylus 208 with high position accuracy, so that high-resolution drawing can be performed using a drawing application or the like. Unlike in the case where a capacitive touch sensor, an electromagnetic induction touch pen, or the like is used, even the position of a highly insulating object can be detected; thus, the material of a tip portion of the stylus 208 is not limited, and a variety of writing materials (e.g., a brush, a glass pen, a quill pen, and the like) can be used.

[Pixel]

The display apparatus of one embodiment of the present invention includes a plurality of pixels arranged in a matrix. One pixel includes a plurality of subpixels. One subpixel includes one light-emitting device, one light-emitting and light-receiving device, or one light-receiving device.

The plurality of pixels each include one or more of a subpixel including a light-emitting device, a subpixel including a light-receiving device, and a subpixel including a light-emitting and light-receiving device.

For example, the pixel includes a plurality of (e.g., three or four) subpixels each including a light-emitting device and one subpixel including a light-receiving device.

Note that the light-receiving device may be provided in all the pixels or may be provided in some of the pixels. In addition, one pixel may include a plurality of light-receiving devices. One light-receiving device may be provided across a plurality of pixels. The resolution of the light-receiving device may be different from the resolution of the light-emitting device.

In the case where the pixel includes three subpixels each including a light-emitting device, as the three subpixels, subpixels of three colors of R, G, and B, subpixels of three colors of yellow (Y), cyan (C), and magenta (M), and the like can be given. In the case where the pixel includes four subpixels each including a light-emitting device, as the four subpixels, subpixels of four colors of R, G, B, and white (W), subpixels of four colors of R, G, B, and Y, and the like can be given.

FIG. 1H, FIG. 1J, FIG. 1K, and FIG. 1L illustrate examples of a pixel which includes a plurality of subpixels each including a light-emitting device and includes one subpixel including a light-receiving device. Note that the arrangement of subpixels is not limited to the illustrated order in this embodiment. For example, the positions of a subpixel (B) and a subpixel (G) may be reversed.

Figure 1H:
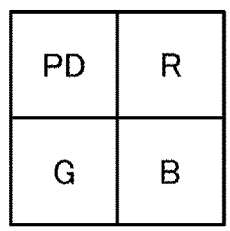
FIG. 1H and FIG. 1J to FIG. 1L are top views each illustrating an example of a pixel.
Figure 1J:
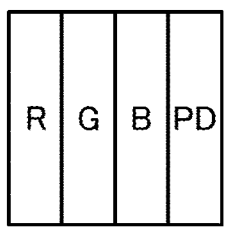
Figure 1K:
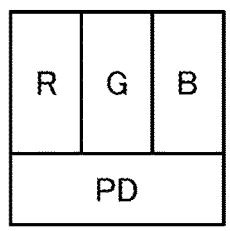

The pixels illustrated in FIG. 1H, FIG. 1J, and FIG. 1K each include a subpixel (PD) having a light-receiving function, a subpixel (R) that emits red light, a subpixel (G) that emits green light, and a subpixel (B) that emits blue light.

Matrix arrangement is applied to the pixel illustrated in FIG. 1H, and stripe arrangement is applied to the pixel illustrated in FIG. 1J. FIG. 1K illustrates an example in which the subpixel (R) that emits red light, the subpixel (G) that emits green light, and the subpixel (B) that emits blue light are arranged laterally in one row and the subpixel (PD) having a light-receiving function is arranged thereunder. In other words, in FIG. 1K, the subpixel (R), the subpixel (G), and the subpixel (B) are arranged in the same row, which is different from the row in which the subpixel (PD) is provided.

Figure 1L:
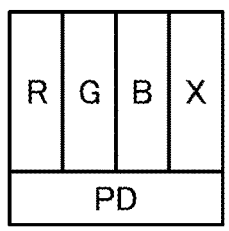

The pixel illustrated in FIG. 1L includes a subpixel (X) that emits light of a color other than R, G, and B, in addition to the components of the pixel illustrated in FIG. 1K. The light of a color other than R, G, and B can be white (W) light, yellow (Y) light, cyan (C) light, magenta (M) light, infrared light (IR), or the like. In the case where the subpixel (X) emits infrared light, the subpixel (PD) having a light-receiving function preferably has a function of detecting infrared light. The subpixel (PD) having a light-receiving function may have a function of detecting both visible light and infrared light. A subpixel detecting visible light and a subpixel detecting infrared light may be included. The wavelength of light detected by the light-receiving device can be determined depending on the application of a sensor.

Alternatively, for example, the pixel includes a plurality of subpixels each including a light-emitting device and one subpixel including a light-emitting and light-receiving device.

The display apparatus including the light-emitting and light-receiving device has no need to change the pixel arrangement when incorporating a light-receiving function into pixels; thus, a display portion can be provided with one or both of an image capturing function and a sensing function without reductions in aperture ratio and resolution.

Note that the light-emitting and light-receiving device may be provided in all the pixels or may be provided in some of the pixels. In addition, one pixel may include a plurality of light-emitting and light-receiving devices.

FIG. 2A to FIG. 2D illustrate examples of a pixel which includes a plurality of subpixels each including a light-emitting device and includes one subpixel including a light-emitting and light-receiving device.

Figure 2A:
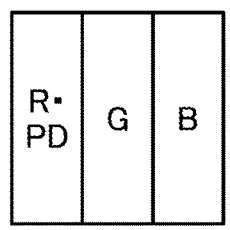
FIG. 2A to FIG. 2G are top views each illustrating an example of a pixel.

A pixel illustrated in FIG. 2A employs stripe arrangement and includes a subpixel (R•PD) that emits red light and has a light-receiving function, a subpixel (G) that emits green light, and a subpixel (B) that emits blue light. In a display apparatus including a pixel composed of three subpixels of R, G, and B, a light-emitting device used in the R subpixel can be replaced with a light-emitting and light-receiving device, so that the display apparatus can have a light-receiving function in the pixel.

Figure 2B:
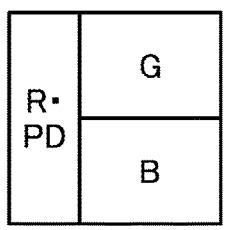

A pixel illustrated in FIG. 2B includes a subpixel (R•PD) that emits red light and has a light-receiving function, a subpixel (G) that emits green light, and a subpixel (B) that emits blue light. The subpixel (R•PD) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red and may be green or blue.

Figure 2E:
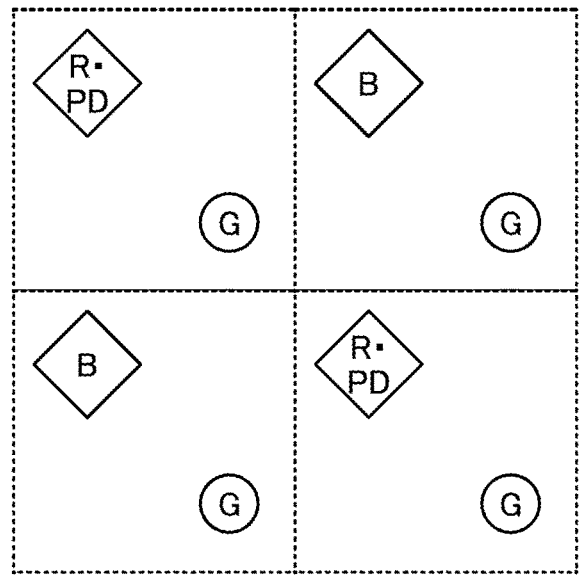
Figure 2C:
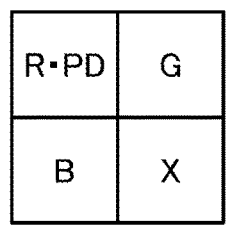

A pixel illustrated in FIG. 2C employs matrix arrangement and includes a subpixel (R•PD) that emits red light and has a light-receiving function, a subpixel (G) that emits green light, a subpixel (B) that emits blue light, and a subpixel (X) that emits light of a color other than R, G, and B. Also in a display apparatus including a pixel composed of four subpixels of R, G, B, and X, a light-emitting device used in the R subpixel can be replaced with a light-emitting and light-receiving device, so that the display apparatus can have a light-receiving function in the pixel.

Figure 2D:
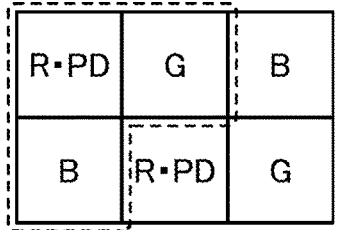

FIG. 2D illustrates two pixels, each of which is composed of three subpixels surrounded by dotted lines. The pixels illustrated in FIG. 2D each include a subpixel (R•PD) that emits red light and has a light-receiving function, a subpixel (G) that emits green light, and a subpixel (B) that emits blue light. In the pixel on the left in FIG. 2D, the subpixel (G) is positioned in the same row as the subpixel (R•PD), and the subpixel (B) is positioned in the same column as the subpixel (R•PD). In the pixel on the right in FIG. 2D, the subpixel (G) is positioned in the same row as the subpixel (R•PD), and the subpixel (B) is positioned in the same column as the subpixel (G). In every odd-numbered row and every even-numbered row of the pixel layout illustrated in FIG. 2D, the subpixel (R•PD), the subpixel (G), and the subpixel (B) are repeatedly arranged. In addition, subpixels of different colors are arranged in the odd-numbered row and the even-numbered row in every column.

Figure 2F:
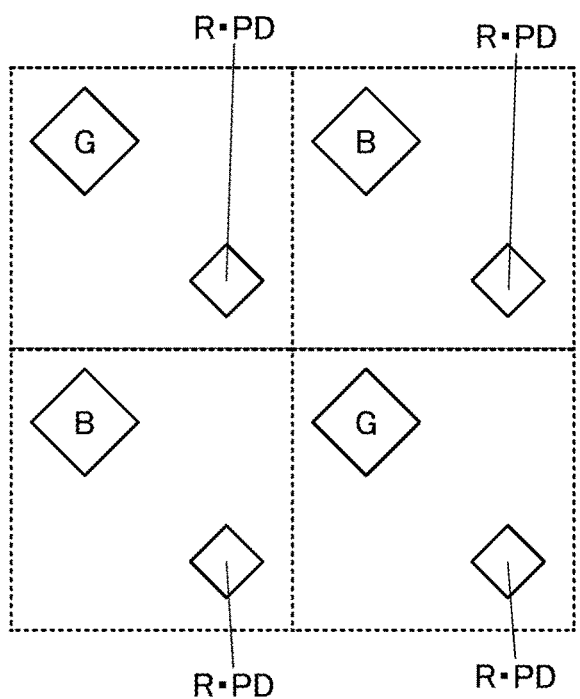

FIG. 2E illustrates four pixels which employ pentile arrangement; adjacent two pixels each have a different combination of two subpixels that emit light of different colors. Note that the shape of the subpixels illustrated in FIG. 2E indicates a top-surface shape of the light-emitting devices and the light-emitting and light-receiving devices included in the subpixels. FIG. 2F is a modification example of the pixel arrangement of FIG. 2E.

The upper-left pixel and the lower-right pixel illustrated in FIG. 2E each include a subpixel (R•PD) that emits red light and has a light-receiving function and a subpixel (G) that emits green light. The lower-left pixel and the upper-right pixel illustrated in FIG. 2E each include a subpixel (G) that emits green light and a subpixel (B) that emits blue light.

The upper-left pixel and the lower-right pixel illustrated in FIG. 2F each include a subpixel (R•PD) that emits red light and has a light-receiving function and a subpixel (G) that emits green light. The lower-left pixel and the upper-right pixel illustrated in FIG. 2F each include a subpixel (R•PD) that emits red light and has a light-receiving function and a subpixel (B) that emits blue light.

In FIG. 2E, the subpixel (G) that emits green light is provided in each pixel. Meanwhile, in FIG. 2F, the subpixel (R•PD) that emits red light and has a light-receiving function is provided in each pixel. The structure illustrated in FIG. 2F achieves higher-resolution image capturing than the structure illustrated in FIG. 2E because of having a subpixel having a light-receiving function in each pixel. Thus, the accuracy of biometric authentication can be increased, for example.

The top-surface shape of the light-emitting devices and the light-emitting and light-receiving devices is not particularly limited and can be a circular shape, an elliptical shape, a polygonal shape, a polygonal shape with rounded corners, or the like. The top-surface shape of the light-emitting devices included in the subpixels (G) is circular in the example in FIG. 2E and square in the example in FIG. 2F. The top surface shape of the light-emitting devices and the light-emitting and light-receiving devices may vary depending on the color thereof, or the light-emitting devices and the light-emitting and light-receiving devices of some colors or every color may have the same top-surface shape.

The aperture ratio of subpixels may vary depending on the color of the subpixels, or may be the same among the subpixels of some colors or every color. For example, the aperture ratio of a subpixel of a color provided in each pixel (the subpixel (G) in FIG. 2E, and the subpixel (R•PD) in FIG. 2F) may be made lower than those of subpixels of the other colors.

Figure 2G:
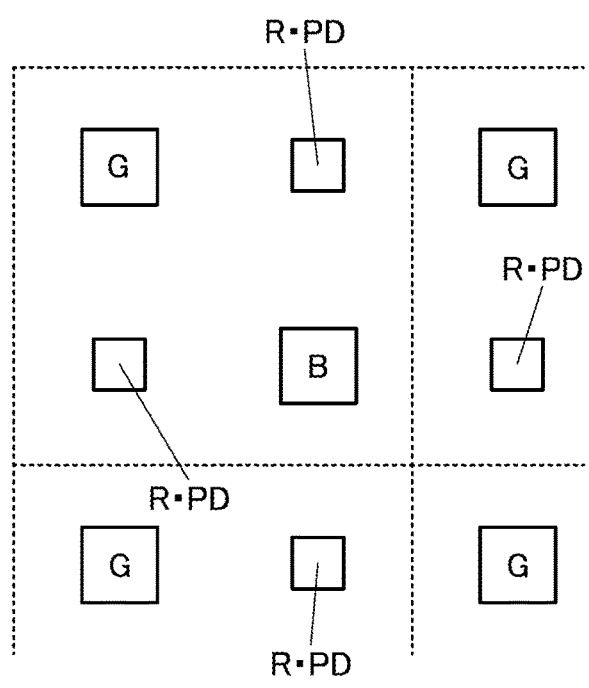

FIG. 2G is a modification example of the pixel arrangement of FIG. 2F. Specifically, the structure of FIG. 2G is obtained by rotating the structure of FIG. 2F by 45°. Although one pixel is regarded as being formed of two subpixels in FIG. 2F, one pixel can be regarded as being formed of four subpixels as illustrated in FIG. 2G.

In the description with reference to FIG. 2G, one pixel is regarded as being formed of four subpixels surrounded by dotted lines. A pixel includes two subpixels (R•PD), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus which employs the structure illustrated in FIG. 2F or FIG. 2G includes p (p is an integer greater than or equal to 2) first light-emitting devices, q (q is an integer greater than or equal to 2) second light-emitting devices, and r (r is an integer greater than p and q) light-emitting and light-receiving devices. As for p and r, r=2p is satisfied. As for p, q, and r, r=p+q is satisfied. Either the first light-emitting devices or the second light-emitting devices emit green light, and the other light-emitting devices emit blue light. The light-emitting and light-receiving devices emit red light and have a light-receiving function.

In the case where touch detection is performed with the light-emitting and light-receiving devices, for example, it is preferable that light emitted by a light source be hard for a user to perceive. Since blue light has lower visibility than green light, light-emitting devices that emit blue light are preferably used as a light source. Accordingly, the light-emitting and light-receiving devices preferably have a function of receiving blue light and converting the light into an electric signal.

As described above, the display apparatus of this embodiment can employ any of various types of pixel arrangements.

[Touch Panel]

Next, the case where the display apparatus of this embodiment functions as a touch panel is described.

With the display apparatus of this embodiment, an image of a fingerprint, a palm print, or the like is captured and biometric authentication can be performed. To strengthen the security function, high definition is required in capturing an image of a fingerprint or a palm print. Thus, imaging data obtained with the light-receiving device or the light-emitting and light-receiving device is preferably read out one (pixel) by one (pixel) from all the pixels.

In the case where the display apparatus functions as a touch panel, a definition as high as that required for biometric authentication is not required, but a high-speed reading operation is required.

For example, the driving frequency can be increased when touch detection is performed all at once in a plurality of pixels. The pixels in which simultaneous reading is performed can be determined as appropriate to be 4 pixels (2×2 pixels), 9 pixels (3×3 pixels), or 16 pixels (4×4 pixels), for example.

As another example, the driving frequency can be increased when touch detection is performed using only some pixels. For example, pixels used for touch detection can be determined as appropriate to be 1 pixel out of 4 pixels (2×2 pixels), 1 pixel out of 9 pixels (3×3 pixels), 1 pixel out of 16 pixels (4×4 pixels), 1 pixel out of 100 pixels (10×10 pixels), 1 pixel out of 900 pixels (30×30 pixels), or the like.

In the display apparatus of one embodiment of the present invention, the structure of a subpixel used as a light source for touch detection is different from the structure of a subpixel that is not used as a light source. Specifically, the wavelength of light emitted by the subpixel used as a light source for touch detection is shorter than the wavelength of light emitted by the subpixel that is not used as a light source. Thus, light as the light source is not easily perceived by a user to achieve natural image display.

Figure 3A:
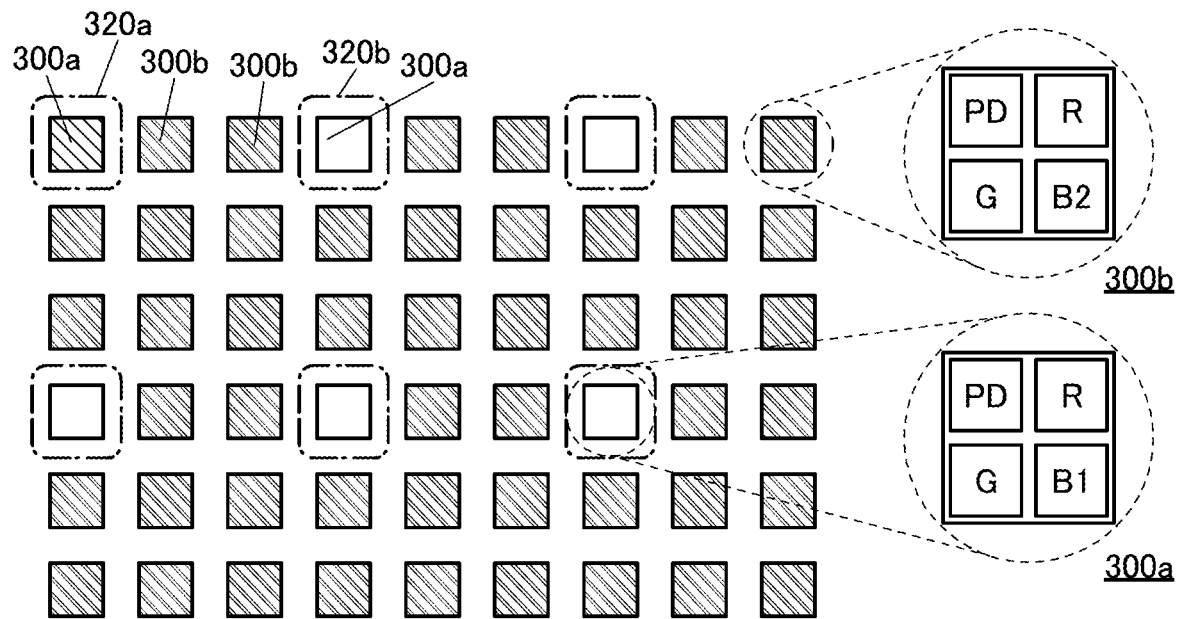
FIG. 3A and FIG. 3B are diagrams each showing an example of a driving method of a display apparatus.
Figure 3B:
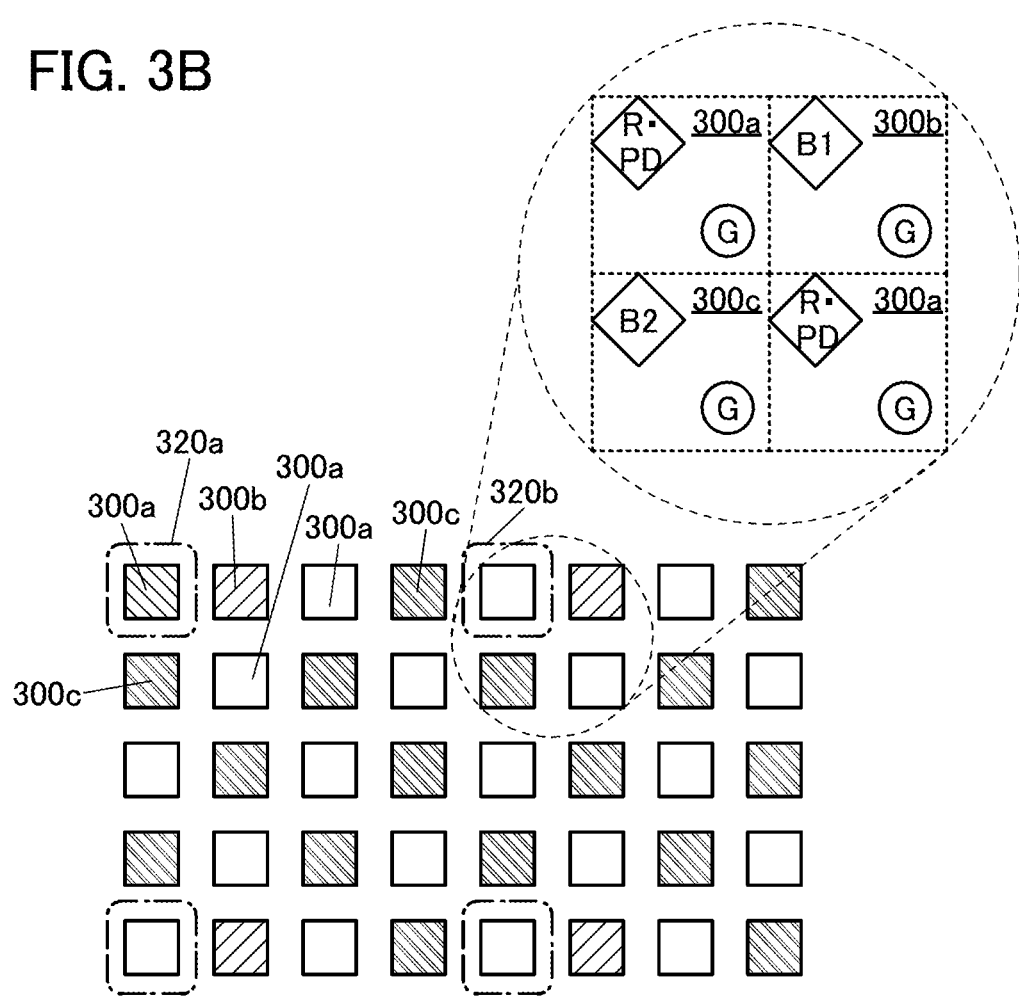

FIG. 3A and FIG. 3B illustrate examples of touch detection using some pixels.

FIG. 3A illustrates an example where the structure illustrated in FIG. 1H is applied to pixels 300.

Pixels 300a each include a subpixel PD having a light-receiving function, a subpixel R that emits red light, a subpixel G that emits green light, and a subpixel B1 that emits blue light. Pixels 300b each include the subpixel PD having a light-receiving function, the subpixel R that emits red light, the subpixel G that emits green light, and a subpixel B2 that emits blue light. Target pixels 320 that are reading targets are only the pixels 300a surrounded by dashed-dotted lines. Imaging data is not read out from the pixels 300b. FIG. 3A illustrates an example in which the number of target pixels 320 used for touch detection is 1 pixel out of 9 pixels (3×3 pixels); however, the number of target pixels 320 is not particularly limited. First, imaging data of a target pixel 320a is read out, and imaging data of a target pixel 320b is then read out. Thus, the number of times of reading can be smaller than that in the case where imaging data is read pixel by pixel from all the pixels, and the driving frequency can be increased.

The wavelength of light emitted by the subpixel B1 is shorter than the wavelength of light emitted by the subpixel B2. The user perceives the light emitted by the subpixel B2 more easily than the light emitted by the subpixel B1. It is thus preferable that the subpixel B1 be used as a light source for touch detection and the subpixel B2 be used for image display. In other words, it is preferable that the subpixel B1 be used as subpixels that emit blue light and are included in the target pixels 320, and the subpixel B2 be used as subpixels that emit blue light and are included in the other pixels. In such a structure, the number of subpixels B1 is adequately smaller than that of subpixels B2 and light emitted by the subpixels B1 is not easily perceived by the user, achieving natural image display. In this manner, the display apparatus of one embodiment of the present invention can detect the touch or approach of an object while displaying an image.

Note that in this embodiment, the subpixel B1 is referred to as a subpixel that emits blue light; however, the light emitted by the subpixel B1 may be any light having a shorter wavelength than the light emitted by the subpixel B2, for example, light having a shorter wavelength than blue light (e.g., navy, violet, or ultraviolet light).

FIG. 3B illustrates an example employing the structure illustrated in FIG. 2E: a pixel including a subpixel R-PD that emits red light and has a light-receiving function and a pixel including a subpixel B that emits blue light are alternately arranged.

The pixels 300a each include the subpixel R-PD that emits red light and has a light-receiving function and a subpixel G that emits green light. The pixels 300b each include the subpixel G that emits green light and the subpixel B1 that emits blue light. Pixels 300c each include the subpixel G that emits green light and the subpixel B2 that emits blue light. The target pixels 320 that are reading targets are only the pixels 300a surrounded by dashed-dotted lines. FIG. 3B illustrates an example in which the number of target pixels 320 used for touch detection is 1 pixel out of 16 pixels (4×4 pixels); however, the number of target pixels 320 is not particularly limited. First, imaging data of the target pixel 320a is read out, and imaging data of the target pixel 320b is then read out. No imaging data is read out from the pixel 300a between the target pixel 320a and the target pixel 320b. Thus, the number of times of reading can be smaller than that in the case where imaging data is read pixel by pixel from all the pixels, and the driving frequency can be increased.

The wavelength of light emitted by the subpixel B1 is shorter than the wavelength of light emitted by the subpixel B2. It is thus preferable that the subpixel B1 be used as a light source for touch detection and the subpixel B2 be used for image display. FIG. 3B illustrates an example in which the subpixel B1 is used in the pixel 300b and the subpixel B2 is used in the pixel 300c. FIG. 3B illustrates an example in which the pixel 300b is positioned on the right of the target pixel 320; however, the position of the pixel 300b is not limited thereto. In the plan view, the pixel 300b is preferably adjacent to the target pixel 320 and may be positioned on the left, right, top, and bottom of the target pixel 320. In such a structure, the number of subpixels B1 is adequately smaller than that of subpixels B2 and light emitted by the subpixels B1 is not easily perceived by the user, achieving natural image display. In this manner, the display apparatus of one embodiment of the present invention can detect the touch or approach of an object while displaying an image.

The display apparatus of one embodiment of the present invention preferably has two or more kinds of operation modes of the pixel so that switching therebetween is possible. For example, switching between a mode of performing reading from all the pixels and a mode of performing reading from some of the pixels is preferably possible. Thus, image capturing at a high definition can be performed in fingerprint image capturing, and touch sensing at a high driving frequency can be performed in displaying an image. The operation mode is changed in accordance with the usage, so that the functionality of the display apparatus can be increased.

Furthermore, the influence of ambient light which is noise in touch detection is preferably removed.

For example, lighting and non-lighting of the light-emitting device are made to repeat periodically in some pixels, and a difference in detection intensity of the light-receiving device or the light-emitting and light-receiving device between a lighting period and a non-lighting period is obtained, so that the influence of ambient light can be removed. Preferably, the number of pixels where lighting and non-lighting repeat be two or more within the range not affecting images displayed on the display apparatus. Furthermore, lighting and non-lighting of the light-emitting device are preferably switched at intervals of one frame; for example, a lighting pixel and a non-lighting pixel may be exchanged between an odd-numbered frame and an even-numbered frame. Note that the emission color in the lighting period is not particularly limited.

In the display apparatus of one embodiment of the present invention, the structure of a subpixel including a light-emitting device (e.g., a blue-light-emitting device) that periodically repeats lighting and non-lighting is different from the structure of another subpixel including a blue-light-emitting device. Specifically, the wavelength of light emitted by the subpixel including the light-emitting device that periodically repeats lighting and non-lighting is shorter than the wavelength of light emitted by the subpixel not including the light-emitting device. Thus, repeating of lighting and non-lighting of the light-emitting device is not easily recognized by the user.

Figure 4A:
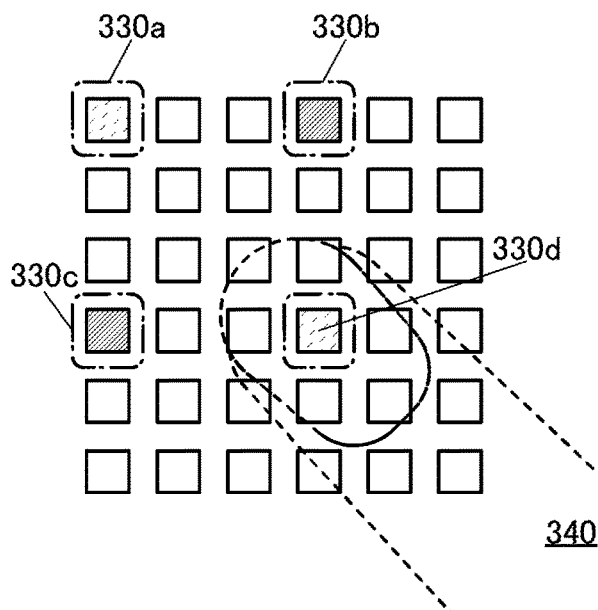
FIG. 4A to FIG. 4F are diagrams each showing an example of a driving method of a display apparatus.
Figure 4B:
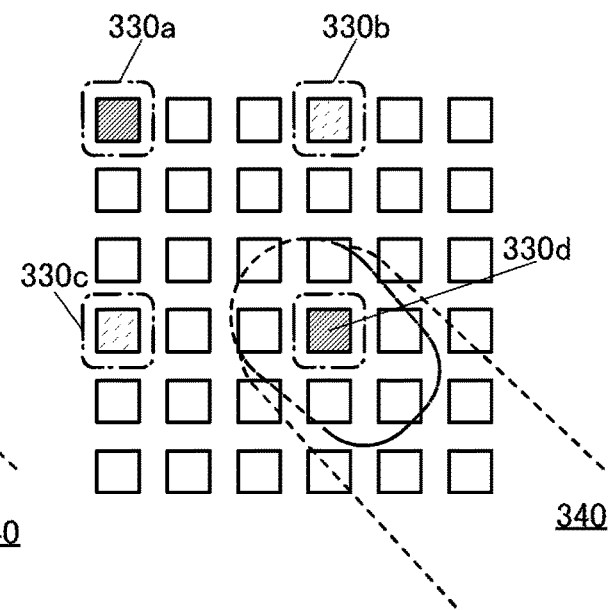

FIG. 4A and FIG. 4B illustrate arrangement examples in which 1 pixel out of 9 pixels (3×3 pixels) is a pixel where lighting and non-lighting repeat.

FIG. 4A illustrates an example in which a pixel 330a and a pixel 330d are in a non-lighting state and a pixel 330b and a pixel 330c are in a lighting state. FIG. 4B illustrates an example in which the pixel 330a and the pixel 330d are in a lighting state and the pixel 330b and the pixel 330c are in a non-lighting state.

The pixel 330d is in a portion touched by a finger 340 in the display apparatus, and the pixels 330a to 330c are in a portion not touched by the finger 340.

Figure 4C:
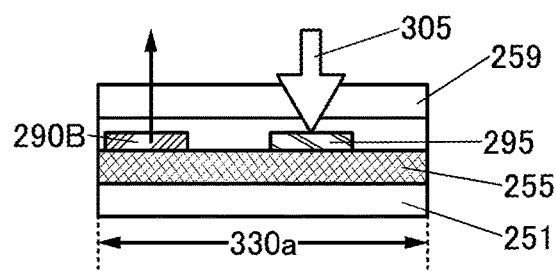
Figure 4D:
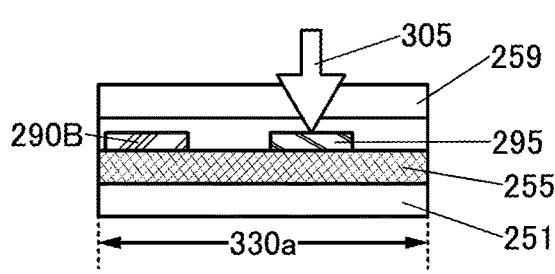
Figure 4E:
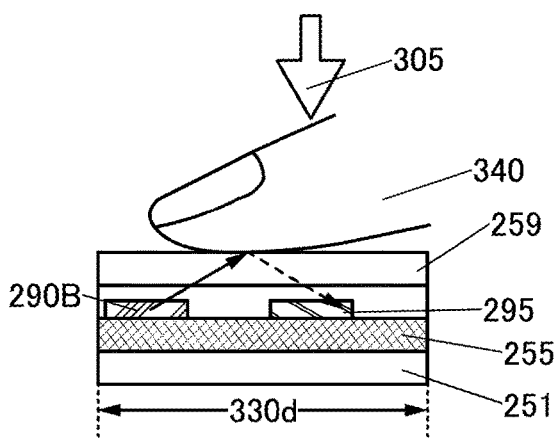
Figure 4F:
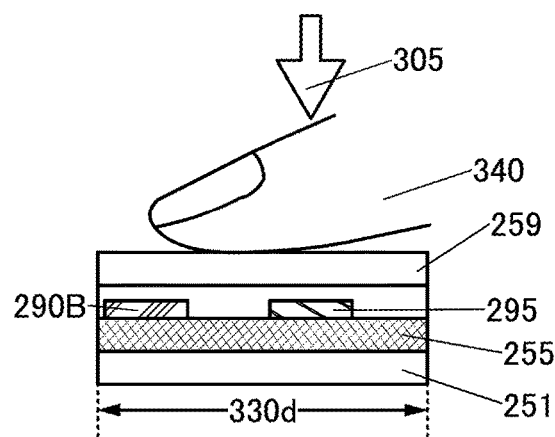

FIG. 4C and FIG. 4D are cross-sectional views of the pixel 330a in the display apparatus, and FIG. 4E and FIG. 4F are cross-sectional views of the pixel 330d.

The display apparatus illustrated in FIG. 4C to FIG. 4F includes a functional layer 255, a light-emitting device 290B, and a light-receiving device 295 between a substrate 251 and a substrate 259. Here, a case where the light-emitting device 290B emits blue light and the light-receiving device 295 receives blue light and converts the light into an electric signal is taken as an example. The display apparatus may include a light-emitting and light-receiving device instead of the light-receiving device.

In such a structure, the number of light-emitting devices 290B that periodically repeat lighting and non-lighting is adequately smaller than the total number of subpixels emitting blue light, and furthermore, light emitted by the subpixels 330 including the light-emitting devices 290B that periodically repeat lighting and non-lighting is not easily perceived by the user, achieving natural image display. In this manner, the display apparatus of one embodiment of the present invention can detect the touch or approach of an object while displaying an image.

FIG. 4C and FIG. 4E illustrate the display apparatus in a state where the light source is lighting (the light-emitting device 290B is emitting light), and FIG. 4D and FIG. 4F illustrate the display apparatus in a state where the light source is non-lighting (the light-emitting device 290B is not emitting light).

FIG. 4C illustrates a state in which the finger is not touching the pixel 330a and light emitted by the light-emitting device 290B does not enter the light-receiving device 295. In FIG. 4D, the light-emitting device 290B is not emitting light and light from the light-emitting device 290B does not enter the light-receiving device 295. As illustrated in FIG. 4C and FIG. 4D, in both the lighting period and the non-lighting period of the light source, ambient light 305 enters the light-receiving device 295. Accordingly, when the light amount of the ambient light 305 is constant, the detection intensity of the light-receiving device 295 included in the pixel 330a does not change between the lighting period and the non-lighting period of the light source.

FIG. 4E and FIG. 4F illustrate a state in which the ambient light 305 is blocked by the finger 340 and does not reach the light-receiving device 295 in both the lighting period and the non-lighting period of the light source. In the lighting period of the light source, light emitted by the light-emitting device 290B is reflected by the finger 340 and then enters the light-receiving device 295 as illustrated in FIG. 4E. In FIG. 4F, the light-emitting device 290B is not emitting light and light from the light-emitting device 290B does not enter the light-receiving device 295. Accordingly, the detection intensity of the light-receiving device 295 included in the pixel 330d changes between the lighting period and the non-lighting period of the light source.

At the light-receiving device 295, the change in detection intensity derived from the ambient light 305 between the lighting period and the non-lighting period of the light source is small, and the change in detection intensity derived from an object such as the finger 340 between the lighting period and the non-lighting period of the light source is large. Utilizing this difference in detection intensity between the lighting period and the non-lighting period, the influence of ambient light can be removed and an object can be detected at high accuracy.

Although the example of utilizing the difference in detection intensity between the lighting period and the non-lighting period of the light source is shown above, the light source is not necessarily turned off. For example, it is possible to utilize the difference in detection intensity between the period at which the light source emits intense light and the period at which the light source emits weak light.

[Subpixel]

Next, specific structures of subpixels in the display apparatus of one embodiment of the present invention are described. Furthermore, specific structures of a light-emitting device, a light-receiving device, and a light-emitting and light-receiving device, which can be used in the display apparatus of one embodiment of the present invention, are described.

The wavelength of light emitted by a subpixel can be equal or substantially equal to the wavelength of light emitted by the light-emitting device. Alternatively, the wavelength of light emitted by a subpixel can be the wavelength of light that is emitted by the light-emitting device and extracted through a coloring layer, a color conversion layer, or the like.

The display apparatus of one embodiment of the present invention can have any of the following structures: a top-emission structure in which light is emitted in a direction opposite to the substrate where the light-emitting device is formed; a bottom-emission structure in which light is emitted toward the substrate where the light-emitting device is formed; and a dual-emission structure in which light is emitted toward both surfaces.

In this embodiment, a top-emission display apparatus is described as an example.

Figure 5A:
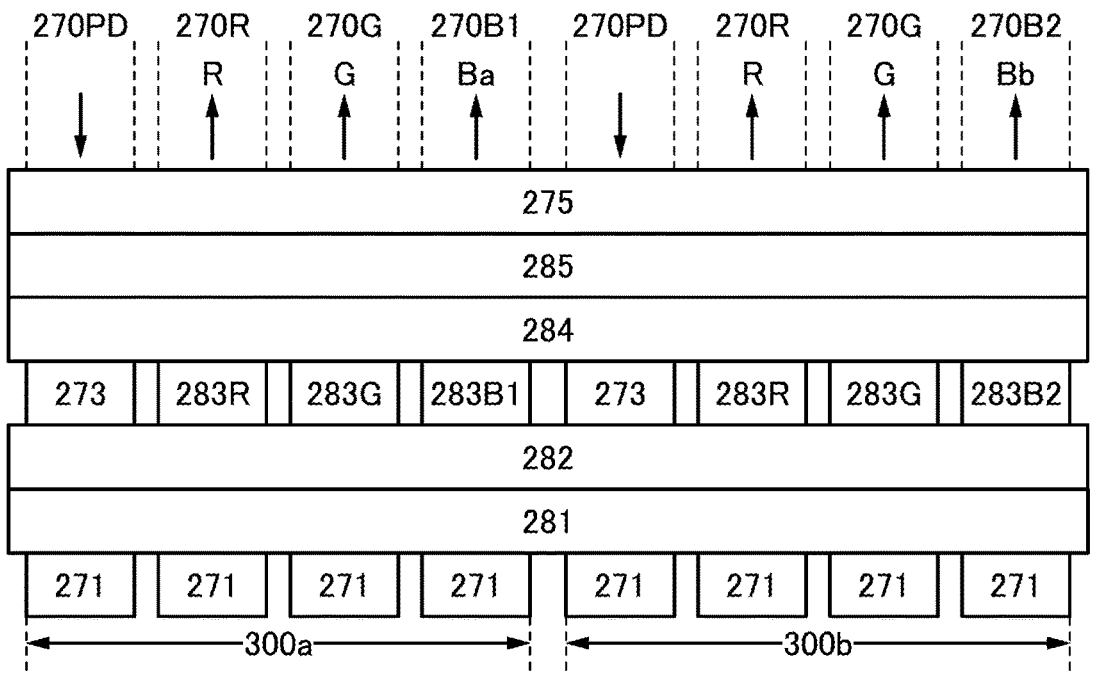
FIG. 5A and FIG. 5B are cross-sectional views each illustrating an example of a display apparatus.
Figure 5B:
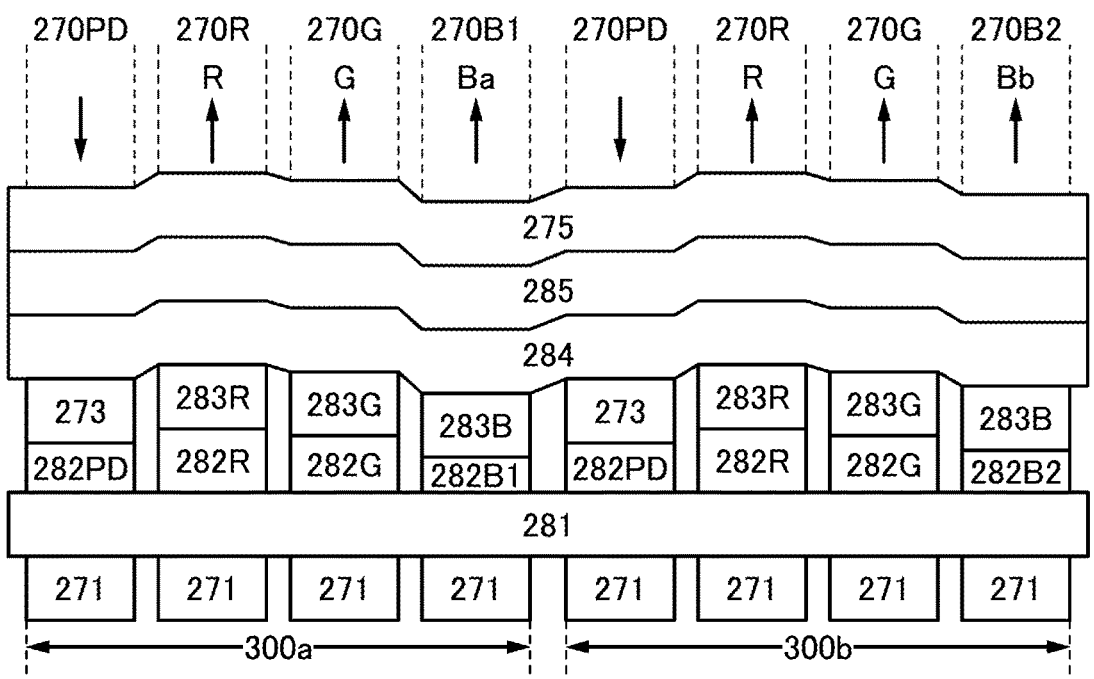
Figure 6:
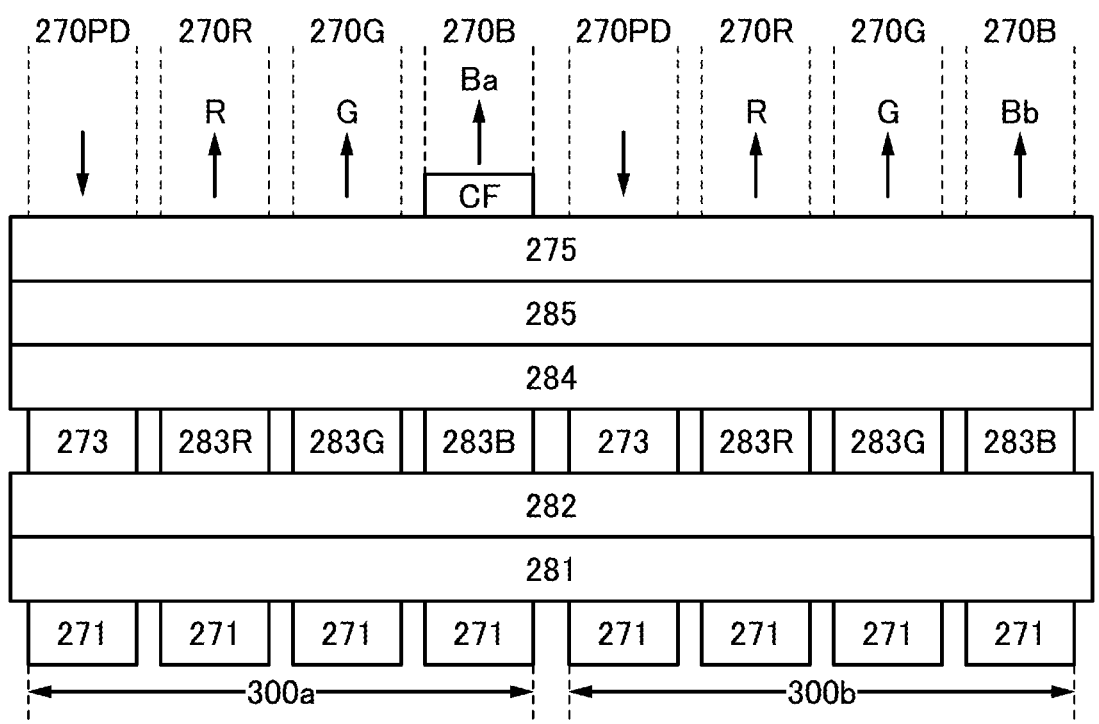
FIG. 6 is a cross-sectional view illustrating an example of a display apparatus.

A display apparatus 280A, a display apparatus 280B, and a display apparatus 280C illustrated in FIG. 5A, FIG. 5B, and FIG. 6, respectively, each include the pixel 300a and the pixel 300b.

The pixel 300a includes a subpixel including a light-receiving device 270PD, a subpixel including a light-emitting device 270R emitting red light (R), a subpixel including a light-emitting device 270G emitting green light (G), and a subpixel including a light-emitting device 270B1 emitting blue light (Ba).

The pixel 300b includes a subpixel including the light-receiving device 270PD, a subpixel including the light-emitting device 270R emitting red light (R), a subpixel including the light-emitting device 270G emitting green light (G), and a subpixel including a light-emitting device 270B2 emitting blue light (Bb).

An example of red light (R) is light having a maximum peak wavelength in the emission spectrum of greater than or equal to 580 nm and less than 750 nm. An example of blue light (Bb) is light having a maximum peak wavelength in the emission spectrum of greater than or equal to 400 nm and less than or equal to 480 nm. Green light (G) can have, for example, a wavelength between the maximum peak wavelength of red light (R) and the maximum peak wavelength of blue light (Bb). An example of green light (G) is light having a maximum peak wavelength in the emission spectrum of greater than or equal to 480 nm and less than 580 nm.

Here, the wavelength of blue light Ba extracted from the pixel 300a is shorter than that of blue light Bb extracted from the pixel 300b. Thus, it is preferable that blue light Ba be used for a light source for touch detection and blue light Bb be used for image display. This inhibits light from the light source from being easily perceived by a user to achieve natural image display. The maximum peak wavelength in the emission spectrum of blue light (Ba) can be, for example, greater than or equal to 400 nm and less than the maximum peak wavelength of blue light (Bb). Alternatively, the maximum peak wavelength in the emission spectrum of blue light (Ba) may be less than 400 nm.

Each of the light-emitting devices illustrated in FIG. 5A includes a pixel electrode 271, a hole-injection layer 281, a hole-transport layer 282, a light-emitting layer, an electron-transport layer 284, an electron-injection layer 285, and a common electrode 275 which are stacked in this order. The light-emitting device 270R includes a light-emitting layer 283R, the light-emitting device 270G includes a light-emitting layer 283G, the light-emitting device 270B1 includes a light-emitting layer 283B1, and the light-emitting device 270B2 includes a light-emitting layer 283B2. The light-emitting layer 283R includes a light-emitting substance that emits red light, the light-emitting layer 283G includes a light-emitting substance that emits green light, and the light-emitting layer 283B1 and the light-emitting layer 283B2 each include a light-emitting substance that emits blue light. The pixel electrodes 271 included in the light-emitting devices are electrically insulated (or electrically separated) from each other. The common electrode 275 is shared by the light-emitting devices.

The light-emitting substance included in the light-emitting layer 283B1 preferably emits shorter-wavelength light than the light-emitting substance included in the light-emitting layer 283B2. When the light-emitting layers of the blue-light-emitting devices are separately formed in this manner, two kinds of blue subpixels having different visibility can be provided in the display apparatus.

The light-emitting devices are electroluminescent devices that emit light to the common electrode 275 side by voltage application between the pixel electrodes 271 and the common electrode 275.

The light-receiving device 270PD includes the pixel electrode 271, the hole-injection layer 281, the hole-transport layer 282, an active layer 273, the electron-transport layer 284, the electron-injection layer 285, and the common electrode 275 which are stacked in this order.

The light-receiving device 270PD is a photoelectric conversion device that receives light entering from the outside of the display apparatus 280A and converts the light into an electric signal.

In the description made in this embodiment, the pixel electrode 271 functions as an anode and the common electrode 275 functions as a cathode in both the light-emitting device and the light-receiving device. In other words, when the light-receiving device is driven by application of reverse bias between the pixel electrode 271 and the common electrode 275, light entering the light-receiving device can be detected and charge can be generated and extracted as current.

In the display apparatus of this embodiment, an organic compound is used for the active layer 273 of the light-receiving device 270PD. In the light-receiving device 270PD, the layers other than the active layer 273 can have structures in common with the layers in the light-emitting devices. Therefore, the light-receiving device 270PD can be formed concurrently with formation of a light-emitting device only by adding a step of depositing the active layer 273 in the manufacturing process of the light-emitting device. In addition, the light-emitting device and the light-receiving device 270PD can be formed over the same substrate. Accordingly, the light-receiving device 270PD can be incorporated into the display apparatus without a significant increase in the number of manufacturing steps.

The display apparatus 280A shows an example in which the light-receiving device 270PD and the light-emitting devices have a common structure except that the active layer 273 of the light-receiving device 270PD and the light-emitting layers 283 of the light-emitting devices are separately formed. Note that the structures of the light-receiving device 270PD and the light-emitting devices are not limited thereto. The light-receiving device 270PD and the light-emitting devices may have a separately formed layer in addition to the active layer 273 and the light-emitting layers 283. The light-receiving device 270PD and the light-emitting devices preferably include at least one layer used in common (common layer). Thus, the light-receiving device 270PD can be incorporated into the display apparatus without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting devices included in the display apparatus of this embodiment preferably employ a microcavity structure. Therefore, one of the pair of electrodes of the light-emitting devices is preferably an electrode having properties of transmitting and reflecting visible light (a transflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1 \times 10^{-2}$ $\Omega$cm or lower. Note that in the case where any of the light-emitting devices emits near-infrared light (light with a wavelength greater than or equal to 750 nm and less than or equal to 1300 nm), the near-infrared light transmittance and reflectivity of these electrodes preferably satisfy the above-described numerical ranges of the visible light transmittance and reflectivity.

The light-emitting devices include at least the light-emitting layers 283. In addition to the light-emitting layers 283, the light-emitting devices may further include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

For example, the light-emitting devices and the light-receiving device can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting devices and the light-receiving device.

The hole-injection layer is a layer that injects holes from an anode to the hole-transport layer and contains a material with a high hole-injection property. As the material with a high hole-injection property, an aromatic amine compound and a composite material containing a hole-transport material and an acceptor material (an electron-accepting material) can be used.

In the light-emitting devices, the hole-transport layer transports holes that are injected from the anode by the hole-injection layer, to the light-emitting layer. In the light-receiving device, the hole-transport layer transports holes that are generated in the active layer on the basis of incident light, to the anode. The hole-transport layer contains a hole-transport material. The hole-transport material preferably has a hole mobility of $10^{-6}$ cm$^2$/Vs or higher. Note that other substances can also be used as long as the substances have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting devices, the electron-transport layer transports electrons that are injected from the cathode by the electron-injection layer, to the light-emitting layer. In the light-receiving device, the electron-transport layer transports electrons that are generated in the active layer on the basis of incident light, to the cathode. The electron-transport layer contains an electron-transport material. As the electron-transport material, a substance having an electron mobility of $1 \times 10^{-6}$ cm$^2$/Vs or higher is preferable. Note that other substances can also be used as long as the substances have a property of transporting more electrons than holes. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 contains a light-emitting substance. The light-emitting layer 283 can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine skeleton including an electron-withdrawing group as a ligand; a platinum complex; and a rare earth metal complex.

The light-emitting layer 283 may contain one or more kinds of organic compounds (e.g., a host material or an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 283 preferably includes a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In a combination of materials for forming an exciplex, the HOMO level (the highest occupied molecular orbital level) of the hole-transport material is preferably higher than or equal to that of the electron-transport material. The LUMO level (the lowest unoccupied molecular orbital level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectrum of each of the materials (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the materials, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

The active layer 273 includes a semiconductor. Examples of the semiconductor include an inorganic semiconductor such as silicon and an organic semiconductor including an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material included in the active layer 273 are electron-accepting organic semiconductor materials such as fullerene (e.g., $C_{60}$ and $C_{70}$) and fullerene derivatives. Fullerene has a soccer ball-like shape; this shape is stable in terms of energy. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material included in the active layer 273 are electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Furthermore, a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinyl carbazole derivative, a polythiophene derivative, and the like can be given as examples of the p-type semiconductor material.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 273 is preferably formed by co-evaporation of an n-type semiconductor and a p-type semiconductor.

Either a low molecular compound or a high molecular compound can be used for the light-emitting devices and the light-receiving device, and an inorganic compound may also be included. The light-emitting devices and the light-receiving device may also be fabricated using a premix material. Each of the layers included in the light-emitting devices and the light-receiving device can be formed by an evaporation method (including a vacuum evaporation method), a transfer method, a printing method, an inkjet method, a coating method, or the like.

The display apparatus 280B illustrated in FIG. 5B is different from the display apparatus 280A in that the hole-transport layer is formed separately in each device and the light-emitting device 270B1 and the light-emitting device 270B2 include the same light-emitting layer 283B. Note that in the following description of display apparatuses, the description of components similar to those of the above-described display apparatuses is omitted in some cases.

The light-receiving device 270PD includes a hole-transport layer 282PD, the light-emitting device 270R includes a hole-transport layer 282R, the light-emitting device 270G includes a hole-transport layer 282G, the light-emitting device 270B1 includes a hole-transport layer 282B1, and the light-emitting device 270B2 includes a hole-transport layer 282B2.

The hole-transport layers 282PD, 282R, 282G, 282B1, and 282B2 each have a function of an optical adjustment layer. Specifically, the thickness of the hole-transport layer 282B1 is preferably adjusted so that the optical distance between the pair of electrodes in the light-emitting device 270B1 can become an optical distance that intensifies blue light. Similarly, the thickness of the hole-transport layer 282B2 is preferably adjusted so that the optical distance between the pair of electrodes in the light-emitting device 270B2 can become an optical distance that intensifies blue light.

The light-emitting device 270B1 is preferably configured to intensify shorter-wavelength light than the light-emitting device 270B2. Thus, even when the light-emitting device 270B1 and the light-emitting device 270B2 include the same light-emitting layer 283B, two kinds of blue subpixels having different visibility can be provided in the display apparatus.

Note that in the display apparatus such as the display apparatus 280A where the light-emitting layers are separately formed in the blue-light-emitting devices, the wavelength of the light to be intensified may be different between the two kinds of blue subpixels, so that a difference in visibility between the two kinds of blue subpixels can be further increased.

In order to obtain the structure in which the light-emitting device 270B1 intensifies shorter-wavelength light than the light-emitting device 270B2, for example, the thickness of the hole-transport layer 282B1 is preferably smaller than that of the hole-transport layer 282B2. Alternatively, only the hole-transport layer 282B2 may be provided while the hole-transport layer 282B1 is omitted.

The thickness of the hole-transport layer 282G is preferably adjusted so that the optical distance between the pair of electrodes in the light-emitting device 270G can become an optical distance that intensifies green light. The thickness of the hole-transport layer 282R is preferably adjusted so that the optical distance between the pair of electrodes in the light-emitting device 270R can become an optical distance that intensifies red light. Furthermore, the thickness of the hole-transport layer 282PD is preferably adjusted so that the optical distance between the pair of electrodes in the light-receiving device 270PD can become an optical distance that chiefly intensifies light of a reception-target wavelength.

Note that the layer used as the optical adjustment layer is not limited to the hole-transport layer.

The display apparatus 280C illustrated in FIG. 6 is different from the display apparatus 280A in that the pixel 300a and the pixel 300b include the same light-emitting device 270B, and light emission from the light-emitting device 270B is extracted through a coloring layer CF.

The light-emitting device 270B includes a light-emitting layer 283B. In the pixel 300a, light emission from the light-emitting device 270B is extracted through the coloring layer CF. In the pixel 300b, light emission from the light-emitting device 270B is extracted without passing through the coloring layer CF.

The coloring layer CF preferably cuts off light on the longer-wavelength side of blue light emitted by the light-emitting device 270B and allows light on the shorter-wavelength side to be extracted. Thus, the blue subpixel included in the pixel 300a can emit shorter-wavelength light than the blue subpixel included in the pixel 300b. That is, even when the blue-light-emitting devices in the pixel 300a and the pixel 300b have the same structure, two kinds of blue subpixels having different visibility can be provided in the display apparatus. Furthermore, light emitted by the light-emitting device 270B in the pixel 300b may be extracted through a coloring layer that can extract longer-wavelength light than the coloring layer CF.

Also in the case where the blue-light-emitting devices in the pixel 300a and the pixel 300b have different structures as in the display apparatuses 280A and 280B, a structure for extracting light through the coloring layer can be employed. A difference in visibility between the two kinds of blue subpixels may be further increased by extracting light with different wavelengths with the use of the coloring layer.

Although only one pixel is illustrated in each of a display apparatus 280D to a display apparatus 280G described below, each display apparatus includes at least two kinds of pixels, and a blue subpixel included in one of the pixels emits shorter-wavelength light than a blue subpixel included in the other pixel. As described above, when the two blue subpixels employ one or more structures where different light-emitting substances are used, optical adjustment layers have different thicknesses, and light is extracted through a coloring layer, the two kinds of blue subpixels having different visibility can be provided in the display apparatus.

Figure 7A:
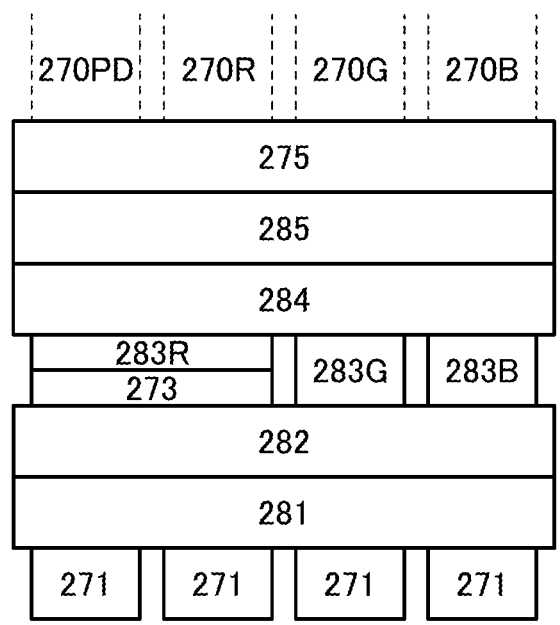
FIG. 7A to FIG. 7C are cross-sectional views each illustrating an example of a display apparatus.

The display apparatus 280D illustrated in FIG. 7A is different from the display apparatus 280A in that the light-receiving device 270PD and the light-emitting device 270R have the same structure.

The light-receiving device 270PD and the light-emitting device 270R share the active layer 273 and the light-emitting layer 283R.

Here, it is preferable that the light-receiving device 270PD have a structure in common with the light-emitting device that emits light with a longer wavelength than the light desired to be detected. For example, the light-receiving device 270PD having a structure in which blue light is detected can have a structure which is similar to that of one or both of the light-emitting device 270R and the light-emitting device 270G. For example, the light-receiving device 270PD having a structure in which green light is detected can have a structure similar to that of the light-emitting device 270R.

When the light-receiving device 270PD and the light-emitting device 270R have a common structure, the number of deposition steps and the number of masks can be reduced from those in the structure in which the light-receiving device 270PD and the light-emitting device 270R include separately formed layers. As a result, the number of manufacturing steps and the manufacturing cost of the display apparatus can be reduced.

When the light-receiving device 270PD and the light-emitting device 270R have a common structure, a margin for misalignment can be narrower than that for the structure in which the light-receiving device 270PD and the light-emitting device 270R include separately formed layers. Accordingly, the aperture ratio of a pixel can be increased, so that the light extraction efficiency of the display apparatus can be increased. This can extend the life of the light-emitting device. Furthermore, the display apparatus can exhibit a high luminance. Moreover, the resolution of the display apparatus can also be increased.

The light-emitting layer 283R includes a light-emitting substance that emits red light. The active layer 273 contains an organic compound that absorbs light with a shorter wavelength than red light (e.g., one or both of green light and blue light). The active layer 273 preferably contains an organic compound that does not easily absorb red light and that absorbs light with a shorter wavelength than red light. In this way, red light can be efficiently extracted from the light-emitting device 270R, and the light-receiving device 270PD can detect light with a shorter wavelength than red light at high accuracy.

Although the light-emitting device 270R and the light-receiving device 270PD have the same structure in an example of the display apparatus 280B, the light-emitting device 270R and the light-receiving device 270PD may include optical adjustment layers with different thicknesses.

Figure 7B:
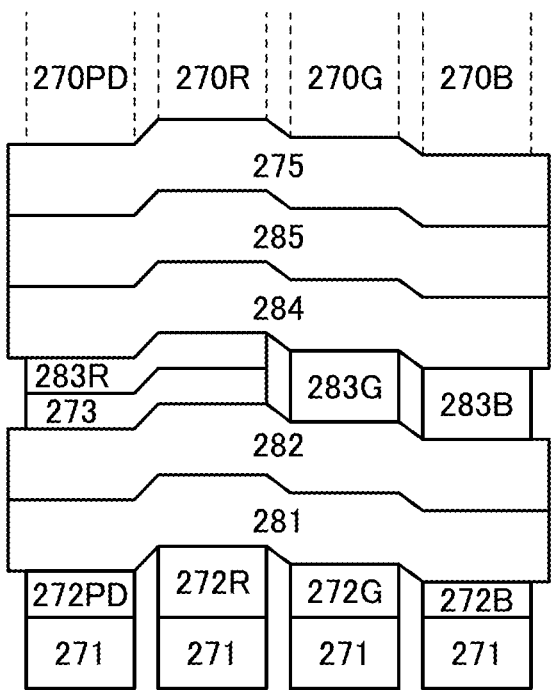

For example, as in a display apparatus 280E illustrated in FIG. 7B, optical adjustment layers are preferably provided over the pixel electrodes 271 and the thickness of the optical adjustment layers is preferably made to vary between the light-emitting device 270R and the light-receiving device 270PD for optical adjustment.

Specifically, an optical adjustment layer 272R is preferably provided so that the optical distance between the pair of electrodes in the light-emitting device 270R can become an optical distance that intensifies red light, and an optical adjustment layer 272PD is preferably provided so that the optical distance between the pair of electrodes in the light-receiving device 270PD can become an optical distance that intensifies light of a sensing-target wavelength. In this way, red light can be efficiently extracted from the light-emitting device 270R, and the light-receiving device 270PD can detect light at high accuracy.

For example, a reflective electrode can be used as the pixel electrode 271, and a transparent electrode can be used as the optical adjustment layer 272. In this case, the optical adjustment layer 272 can be regarded as part of the pixel electrode 271.

The light-emitting device 270G is preferably optically adjusted with an optical adjustment layer 272G so that the optical distance between the pair of electrodes can become an optical distance that intensifies green light. Similarly, the light-emitting device 270B is preferably optically adjusted with an optical adjustment layer 272B so that the optical distance between the pair of electrodes can become an optical distance that intensifies blue light.

Also in the display apparatus 280E, the light-receiving device 270PD and the light-emitting device 270R share the active layer 273 and the light-emitting layer 283R. Consequently, the manufacturing steps and the manufacturing costs of the display apparatus can be reduced.

Figure 7C:
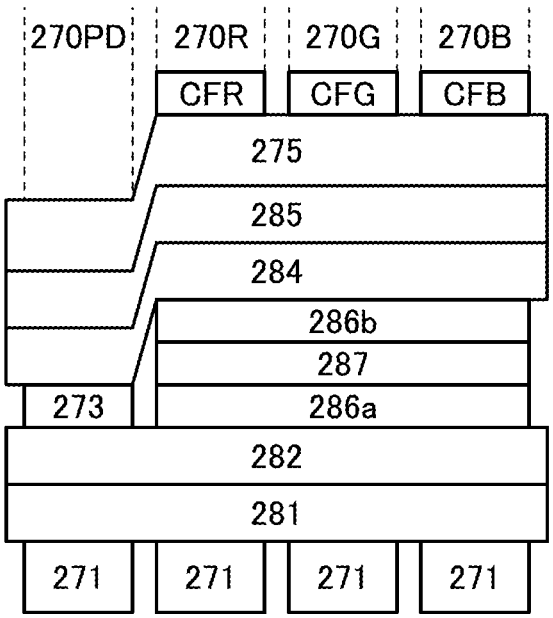

A display apparatus 280F illustrated in FIG. 7C is different from the display apparatus 280A in including a light-emitting device with a tandem structure that includes a plurality of EL layers.

The light-receiving device 270PD included in the display apparatus 280F has a structure similar to that of the light-receiving device 270PD included in the display apparatus 280A.

The light-emitting devices 270R, 270G, and 270B included in the display apparatus 280F have a common structure. Light emitted by the light-emitting device 270R is extracted from the display apparatus 280F through a coloring layer CFR as red light. Furthermore, light emitted by the light-emitting device 270G is extracted from the display apparatus 280F through a coloring layer CFG as green light. Moreover, light emitted by the light-emitting device 270B is extracted from the display apparatus 280F through a coloring layer CFB as blue light.

The light-emitting devices 270R, 270G, and 270B included in the display apparatus 280F include a unit 286a, an intermediate layer 287, and a unit 286b which are stacked in this order over the hole-transport layer 282. The electron-transport layer 284 is provided over the unit 286b.

The unit 286a and the unit 286b each have a single-layer structure or a stacked-layer structure including at least one light-emitting layer. It is preferable that white light be obtained from the combination of lights emitted by two or more light-emitting layers in total included in the unit 286a and the unit 286b. For example, the unit 286a is provided with a light-emitting layer including a light-emitting substance that emits blue light, and the unit 286b is provided with a light-emitting layer including a light-emitting substance that emits green light and a light-emitting layer including a light-emitting substance that emits red light, whereby white light can be emitted from the light-emitting devices as a whole.

The intermediate layer 287 includes at least a charge-generation region. On application of a voltage higher than the threshold voltage of the light-emitting devices to the pair of electrodes, holes and electrons are generated in the intermediate layer 287, holes move to the unit 286b, and electrons move to the unit 286a. The holes injected into the unit 286b are recombined with electrons injected from the common electrode 275 side, so that the light-emitting substance included in the unit 286b emits light. Furthermore, the electrons injected into the unit 286a are recombined with holes injected from the pixel electrode 271 side, so that the light-emitting substance included in the unit 286a emits light. Thus, the holes and electrons generated in the intermediate layer 287 cause light emission in different units. The intermediate layer 287 may include a hole-transport layer or an electron-transport layer in addition to the charge-generation region.

When the light-emitting devices 270R, 270G, and 270B have a common structure, the number of deposition steps and the number of masks can be reduced from those in the structure in which the light-emitting devices 270R, 270G, and 270B include separately formed layers. As a result, the number of manufacturing steps and the manufacturing cost of the display apparatus can be reduced.

When the light-emitting devices 270R, 270G, and 270B have a common structure, a space provided to allow for misalignment can be reduced as compared with the structure in which the light-emitting devices 270R, 270G, and 270B include separately formed layers. Accordingly, the aperture ratio of pixels can be increased and the light extraction efficiency of the display apparatus can be increased. When the aperture ratio of pixels becomes higher, the luminance of a subpixel necessary to obtain a certain luminance in the display apparatus can be reduced. This can extend the life of the light-emitting device. Furthermore, the display apparatus can exhibit a high luminance. Moreover, the resolution of the display apparatus can also be increased.

Note that the optical adjustment layers of the light-emitting devices 270R, 270G, and 270B may have different thicknesses from one another.

Figure 8A:
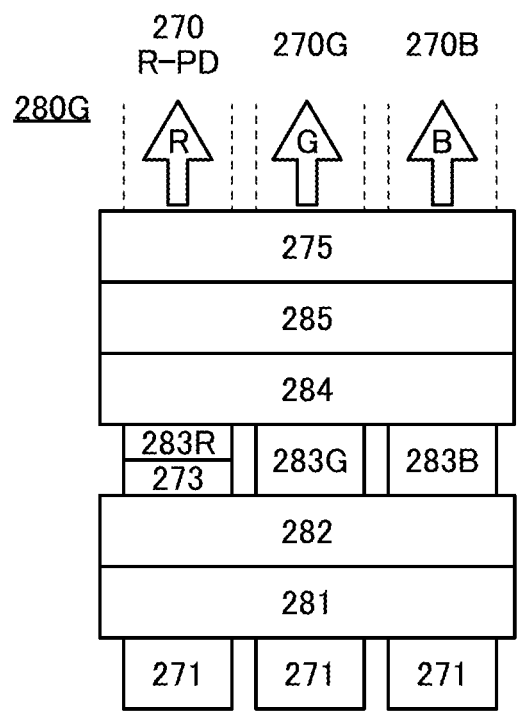
FIG. 8A and FIG. 8B are cross-sectional views each illustrating an example of a display apparatus.
Figure 8B:
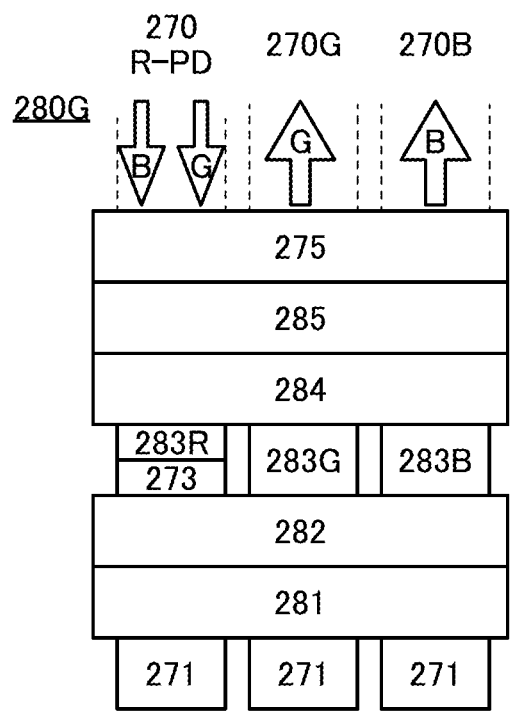

The display apparatus 280G illustrated in FIG. 8A and FIG. 8B includes a light-emitting and light-receiving device 270R-PD that emits red (R) light and has a light-receiving function, the light-emitting device 270G that emits green (G) light, and the light-emitting device 270B that emits blue (B) light.

Each of the light-emitting devices includes the pixel electrode 271, the hole-injection layer 281, the hole-transport layer 282, a light-emitting layer, the electron-transport layer 284, the electron-injection layer 285, and the common electrode 275 which are stacked in this order. The light-emitting device 270G includes the light-emitting layer 283G, and the light-emitting device 270B includes the light-emitting layer 283B. The light-emitting layer 283G includes a light-emitting substance that emits green light, and the light-emitting layer 283B includes a light-emitting substance that emits blue light.

The light-emitting and light-receiving device 270R-PD includes the pixel electrode 271, the hole-injection layer 281, the hole-transport layer 282, the active layer 273, the light-emitting layer 283R, the electron-transport layer 284, the electron-injection layer 285, and the common electrode 275 which are stacked in this order.

Note that the light-emitting and light-receiving device 270R-PD included in the display apparatus 280G has the same structure as the light-emitting device 270R and the light-receiving device 270PD included in the display apparatus 280D. Furthermore, the light-emitting devices 270G and 270B included in the display apparatus 280G also have the same structures as the light-emitting devices 270G and 270B, respectively, which are included in the display apparatus 280D.

FIG. 8A illustrates a case where the light-emitting and light-receiving device 270R-PD functions as a light-emitting device. FIG. 8A illustrates an example in which the light-emitting device 270B emits blue light, the light-emitting device 270G emits green light, and the light-emitting and light-receiving device 270R-PD emits red light.

FIG. 8B illustrates a case where the light-emitting and light-receiving device 270R-PD functions as a light-receiving device. FIG. 8B illustrates an example in which blue light emitted by the light-emitting device 270B and green light emitted by the light-emitting device 270G are detected by the light-emitting and light-receiving device 270R-PD.

The light-emitting device 270B, the light-emitting device 270G, and the light-emitting and light-receiving device 270R-PD each include the pixel electrode 271 and the common electrode 275. In this embodiment, the case where the pixel electrode 271 functions as an anode and the common electrode 275 functions as a cathode is described as an example.

This embodiment is described assuming that the pixel electrode 271 functions as an anode and the common electrode 275 functions as a cathode in the light-emitting and light-receiving device 270R-PD as in the light-emitting devices. In other words, when the light-emitting and light-receiving device 270R-PD is driven by application of reverse bias between the pixel electrode 271 and the common electrode 275, light entering the light-emitting and light-receiving device 270R-PD can be detected and charge can be generated and extracted as current.

Note that the light-emitting and light-receiving device 270R-PD illustrated in FIG. 8A and FIG. 8B can be regarded as having a structure in which the active layer 273 is added to the light-emitting device. That is, the light-emitting and light-receiving device 270R-PD can be formed concurrently with formation of a light-emitting device only by adding a step of depositing the active layer 273 in the manufacturing process of the light-emitting device. In addition, the light-emitting device and the light-emitting and light-receiving device 270R-PD can be formed over the same substrate. Thus, one or both of an image capturing function and a sensing function can be provided to the display portion without a significant increase in the number of manufacturing steps.

[Light-Emitting and Light-Receiving Device]

FIG. 8C to FIG. 8F illustrate examples of a stacked-layer structure of the light-emitting and light-receiving device.

The light-emitting and light-receiving device includes at least an active layer and a light-emitting layer between a pair of electrodes.

In addition to the active layer and the light-emitting layer, the light-emitting and light-receiving device may further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron- and hole-transport property), or the like.

Figure 8C:
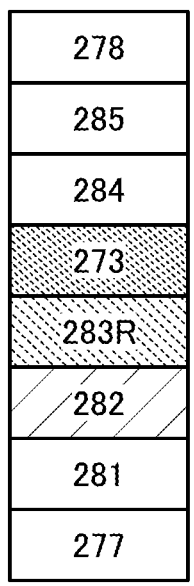
FIG. 8C to FIG. 8F are cross-sectional views each illustrating an example of a light-emitting and light-receiving device.
Figure 8D:
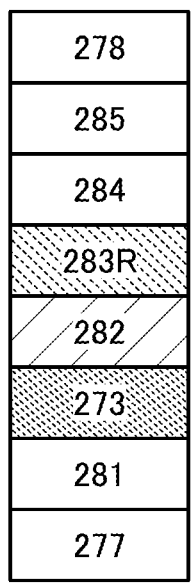

The light-emitting and light-receiving devices illustrated in FIG. 8C and FIG. 8D each include a first electrode 277, the hole-injection layer 281, the hole-transport layer 282, the light-emitting layer 283R, the active layer 273, the electron-transport layer 284, the electron-injection layer 285, and a second electrode 278.

The stacking order of the light-emitting layer 283R and the active layer 273 is not limited. FIG. 8A and FIG. 8B each illustrate an example in which the active layer 273 is provided over the hole-transport layer 282, and the light-emitting layer 283R is provided over the active layer 273. FIG. 8C illustrates an example in which the light-emitting layer 283R is provided over the hole-transport layer 282, and the active layer 273 is provided over the light-emitting layer 283R. FIG. 8D illustrates an example in which the hole-transport layer 282 is provided over the active layer 273, and the light-emitting layer 263R is provided over the hole-transport layer 282.

As illustrated in FIG. 8A to FIG. 8C, the active layer 273 and the light-emitting layer 283R may be in contact with each other. As illustrated in FIG. 8D, a buffer layer is preferably provided between the active layer 273 and the light-emitting layer 283R. As the buffer layer, at least one layer of a hole-injection layer, a hole-transport layer, an electron-transport layer, an electron-injection layer, a hole-blocking layer, an electron-blocking layer, and the like can be used. FIG. 8D illustrates an example in which the hole-transport layer 282 is used as the buffer layer.

The buffer layer provided between the active layer 273 and the light-emitting layer 283R can inhibit transfer of excitation energy from the light-emitting layer 283R to the active layer 273. Furthermore, the optical path length (cavity length) of the microcavity structure can be adjusted with the buffer layer. Thus, a high emission efficiency can be obtained from the light-emitting and light-receiving device including the buffer layer between the active layer 273 and the light-emitting layer 283R.

Figure 8E:
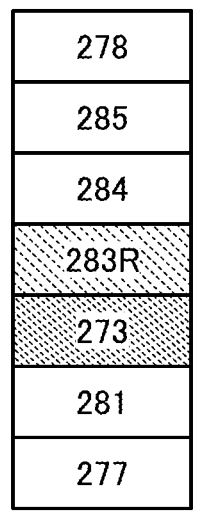

The light-emitting and light-receiving device illustrated in FIG. 8E is different from the light-emitting and light-receiving devices illustrated in FIG. 8A to FIG. 8D in not including the hole-transport layer 282. The light-emitting and light-receiving device may exclude at least one layer of the hole-injection layer 281, the hole-transport layer 282, the electron-transport layer 284, and the electron-injection layer 285. Furthermore, the light-emitting and light-receiving device may include another functional layer such as a hole-blocking layer or an electron-blocking layer.

Figure 8F:
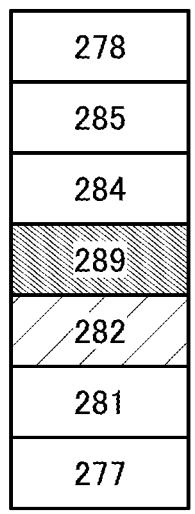

The light-emitting and light-receiving device illustrated in FIG. 8F is different from the light-emitting and light-receiving devices illustrated in FIG. 8A to FIG. 8E in including a layer 289 serving as both a light-emitting layer and an active layer instead of including the active layer 273 and the light-emitting layer 283R.

As the layer 289 serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving device, a conductive film that transmits visible light is used as the electrode through which light is extracted. A conductive film that reflects visible light is preferably used as the electrode through which light is not extracted.

The functions and materials of the layers constituting the light-emitting and light-receiving device are similar to those of the layers constituting the light-emitting devices and the light-receiving device and not described in detail here.

[Driving Method]

Next, an example of a method for driving the display apparatus of one embodiment of the present invention is described with reference to FIG. 9 to FIG. 11. A method for performing touch detection (image capturing) while displaying an image is described below. Note that the following description is made on the case of employing the touch detection method described with reference to FIG. 4, where the influence of ambient light which is noise is removed, for example.

Figure 9A:
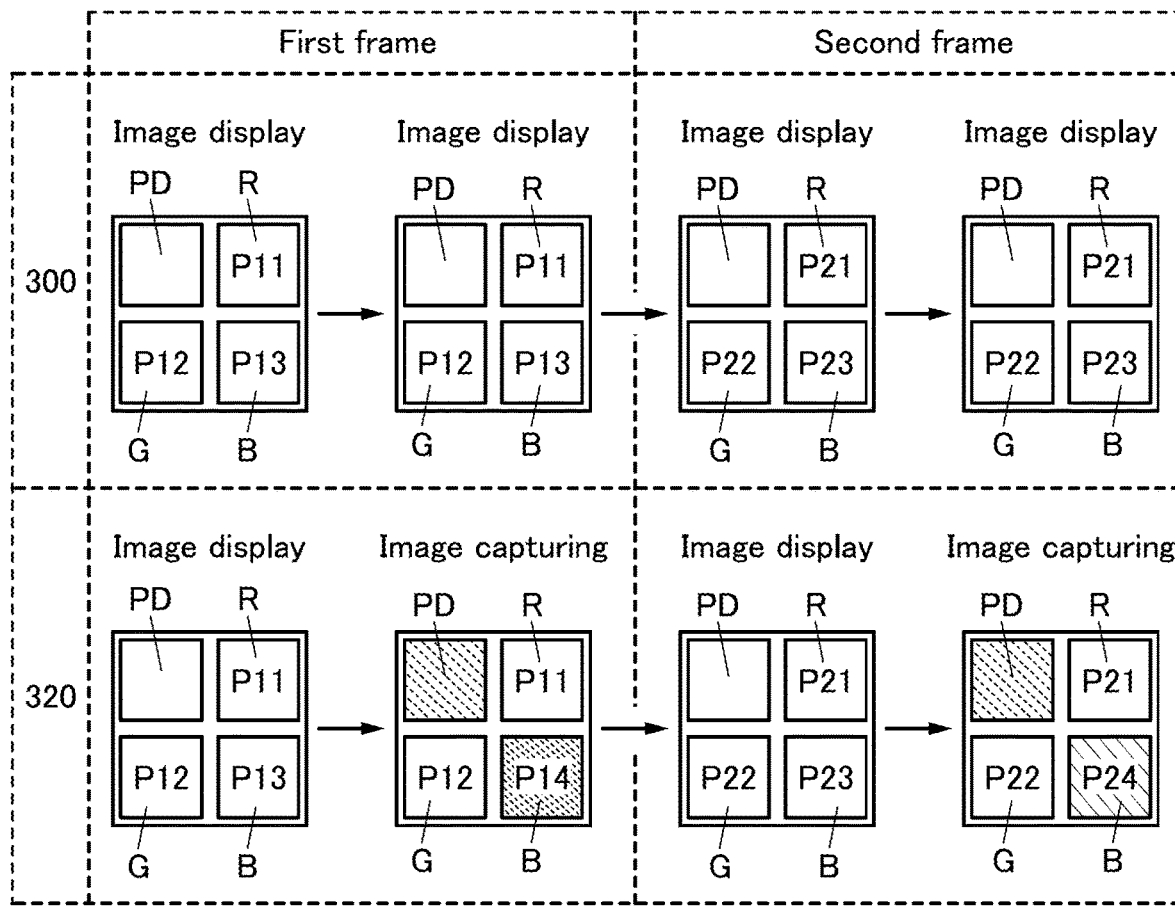
FIG. 9A is a diagram illustrating an example of a driving method of a display apparatus.

A method for driving the pixel 300 and the target pixel 320 in two frames is described with reference to FIG. 9A to FIG. 9C.

The pixel 300 is used for image display. The target pixel 320 is used for both image display and touch detection.

Each frame can be divided into two subframes: a period in which an image is displayed and a period in which image capturing is performed while an image is displayed.

The pixel 300 performs image display in both of the two subframes. As for the luminance value of each subpixel in the first frame illustrated in FIG. 9A, the luminance value of the subpixel R is P11, the luminance value of the subpixel G is P12, and the luminance value of the subpixel B is P13. As for the luminance value of each subpixel in the second frame illustrated in FIG. 9A, the luminance value of the subpixel R is P21, the luminance value of the subpixel G is P22, and the luminance value of the subpixel B is P23. Note that image capturing is not performed in the subpixel PD included in the pixel 300.

The luminance value of each subpixel may differ between the first frame and the second frame. Here, for simplification of the description, the case where the luminance value P11 is equal to the luminance value P21, the luminance value P12 is equal to the luminance value P22, and the luminance value P13 is equal to the luminance value P23 is described as an example.

Figure 9B:
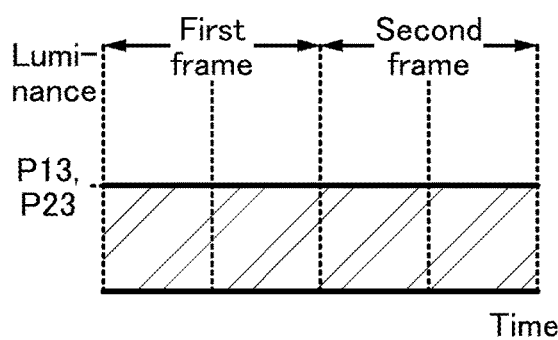
FIG. 9B and FIG. 9C are diagrams showing time integral values of luminance in pixels.
Figure 9C:
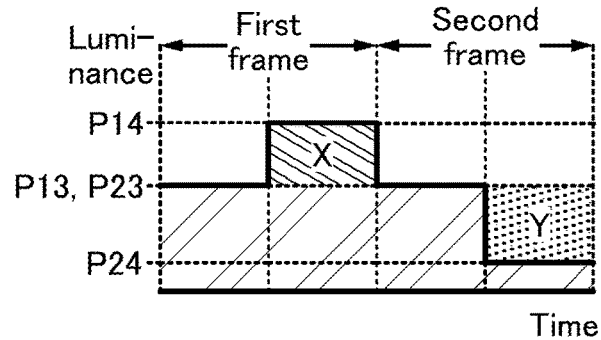

As illustrated in FIG. 9B, the luminance of the subpixel B emitting blue light is constant in both the first frame and the second frame in the pixel 300.

In the target pixel 320, image display is performed in one of the two subframes and image capturing is performed in the other subframe. FIG. 9A shows an example in which image display is performed first in the first subframe and image capturing is performed in the second subframe.

Note that the luminance value of the pixel 300 may be different from that of the target pixel 320 in each frame. Here, for simplification of the description, the case where the pixel 300 and the target pixel 320 have the same luminance value in both the first frame and the second frame is described as an example.

The luminance values of the subpixel R and the subpixel G in the target pixel 320 are the same as those in the pixel 300: in the first frame, the subpixel R and the subpixel G have the luminance value P11 and the luminance value P12, respectively; and in the second frame, the subpixel R and the subpixel G have the luminance value P21 and the luminance value P22, respectively.

The luminance values of the subpixel B (the luminance value P13 and the luminance value P23) in the first subframe of each frame are the same as those in the pixel 300. Note that in the first subframe of each frame, image capturing is not performed in the subpixel PD included in the target pixel 320.

In the second subframe of each frame, image capturing is performed in the subpixel PD included in the target pixel 320. As illustrated in FIG. 9A and FIG. 9C, the luminance value P14 of the subpixel B in the second subframe of the first frame is larger than the luminance value P24 of the subpixel B in the second subframe of the second frame. Note that the luminance value P24 may be zero (the light-emitting device may emit no light). There is no limitation on the magnitude relationship between the luminance value P13 and the luminance value P14. Similarly, there is no limitation on the magnitude relationship between the luminance value P23 and the luminance value P24.

When a difference in detection intensity in the subpixel PD between the first frame image capturing and the second frame image capturing is obtained, the influence of ambient light can be removed to achieve accurate touch detection.

In the case where high luminance emission and low luminance emission are successively performed in an extremely short emission time, the human's eyes cannot distinguish the two types of emission and perceive that light with their intermediate luminance is emitted. The luminance perceived by the human's eyes depend on the time integral value of luminance.

Hence, the luminance of the subpixel B in the first frame seems higher in the target pixel 320 than in the pixel 300. Specifically, the time integral value of luminance in the target pixel 320 is larger than that in the pixel 300 by a difference X between the luminance value P13 and the luminance value P14 in the second subframe of the first frame.

On the other hand, the luminance of the subpixel B in the second frame seems lower in the target pixel 320 than in the pixel 300. Specifically, the time integral value of luminance in the target pixel 320 is smaller than that in the pixel 300 by a difference Y between the luminance value P23 and the luminance value P24 in the second subframe of the second frame.

Thus, in order that the time integral value of luminance in the target pixel 320 is set to a desired value (here, is equal to the time integral value of luminance in the pixel 300), the sum of the time integral value of luminance in the target pixel 320 in the first subframe and the time integral value of luminance in the target pixel 320 in the second subframe is preferably adjusted in each frame.

Figure 10A:
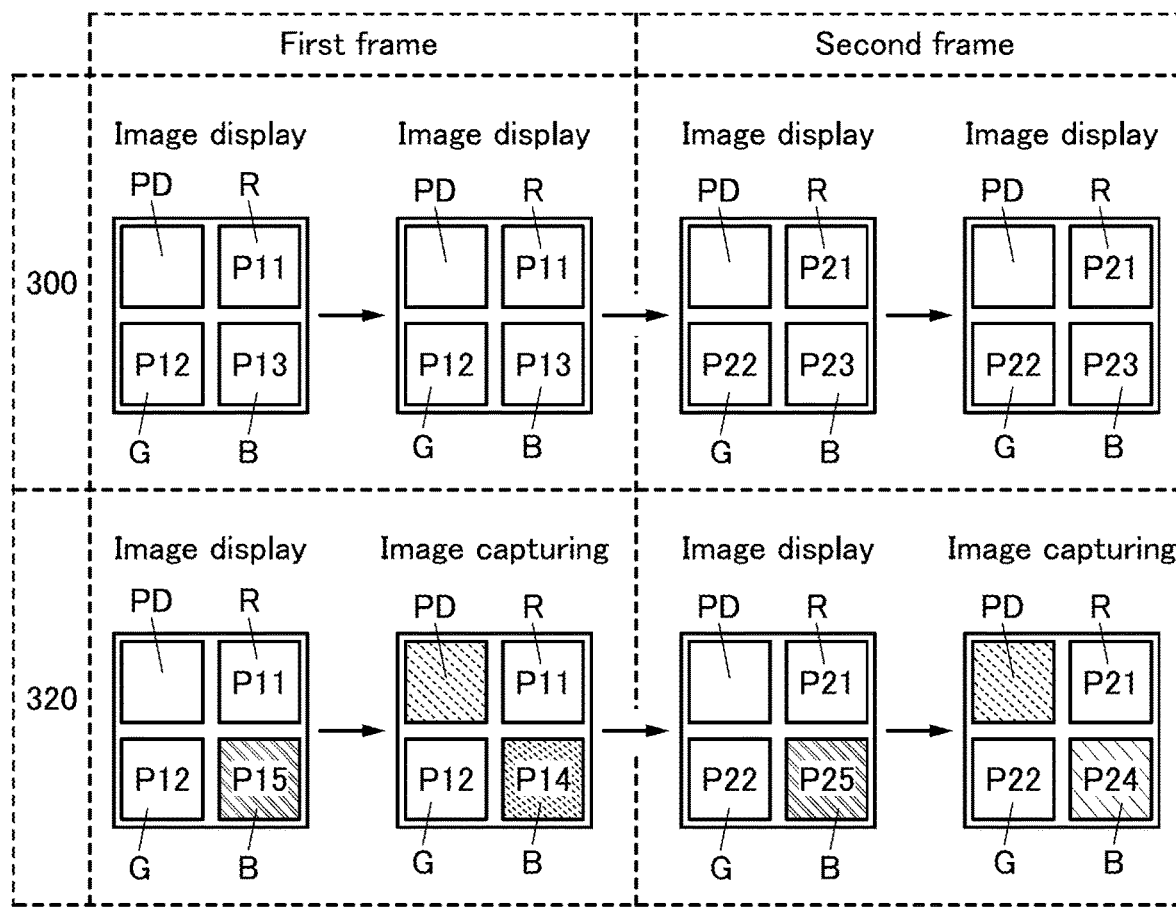
FIG. 10A is a diagram illustrating an example of a driving method of a display apparatus.
Figure 10B:
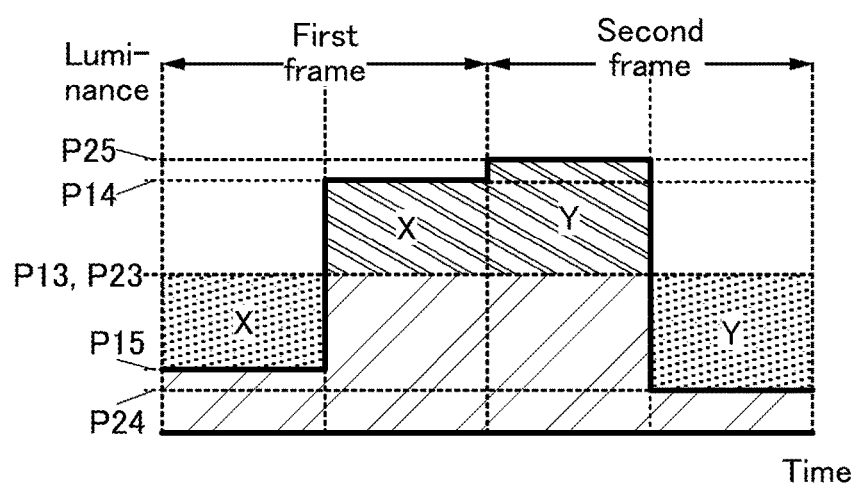
FIG. 10B is a diagram showing time integral values of luminance in pixels.

FIG. 10A and FIG. 10B show an example in which the sum of the time integral value of luminance in the first subframe and the time integral value of luminance in the second subframe in the pixel 300 is equal to that in the target pixel 320.

As described above, in FIG. 9A, the luminance values of the subpixel B (the luminance value P13 and the luminance value P23) in the first subframe of each frame are the same as those in the pixel 300. On the other hand, in FIG. 10A, the luminance values of the subpixel B in the first subframe of each frame differ between the pixel 300 (the luminance value P13 and the luminance value P23) and the target pixel 320 (a luminance value P15 and a luminance value P25).

The luminance value P15 is preferably a value obtained by subtracting the difference X from the luminance value P13. The luminance value P25 is preferably a value obtained by adding the difference Y to the luminance value P13.

As described above, in the case where the desired luminance value in the pixel 300 is equal to that in the target pixel 320, the sum of the time integral value of luminance in the first subframe and the time integral value of luminance in the second subframe in the pixel 300 is made equal to that in the target pixel 320, so that natural image display can be performed even when the target pixel 320 emits light as a light source.

Even in the case where the desired luminance value in the pixel 300 is different from that in the target pixel 320, the luminance of the target pixel 320 can be set to a desired value by adjusting the sum of the time integral value of luminance in the first subframe and the time integral value of luminance in the second subframe.

Note that one frame may be divided into two subframes: a period in which an image is displayed and a period in which touch detection is performed while a black image is displayed.

Figure 11:
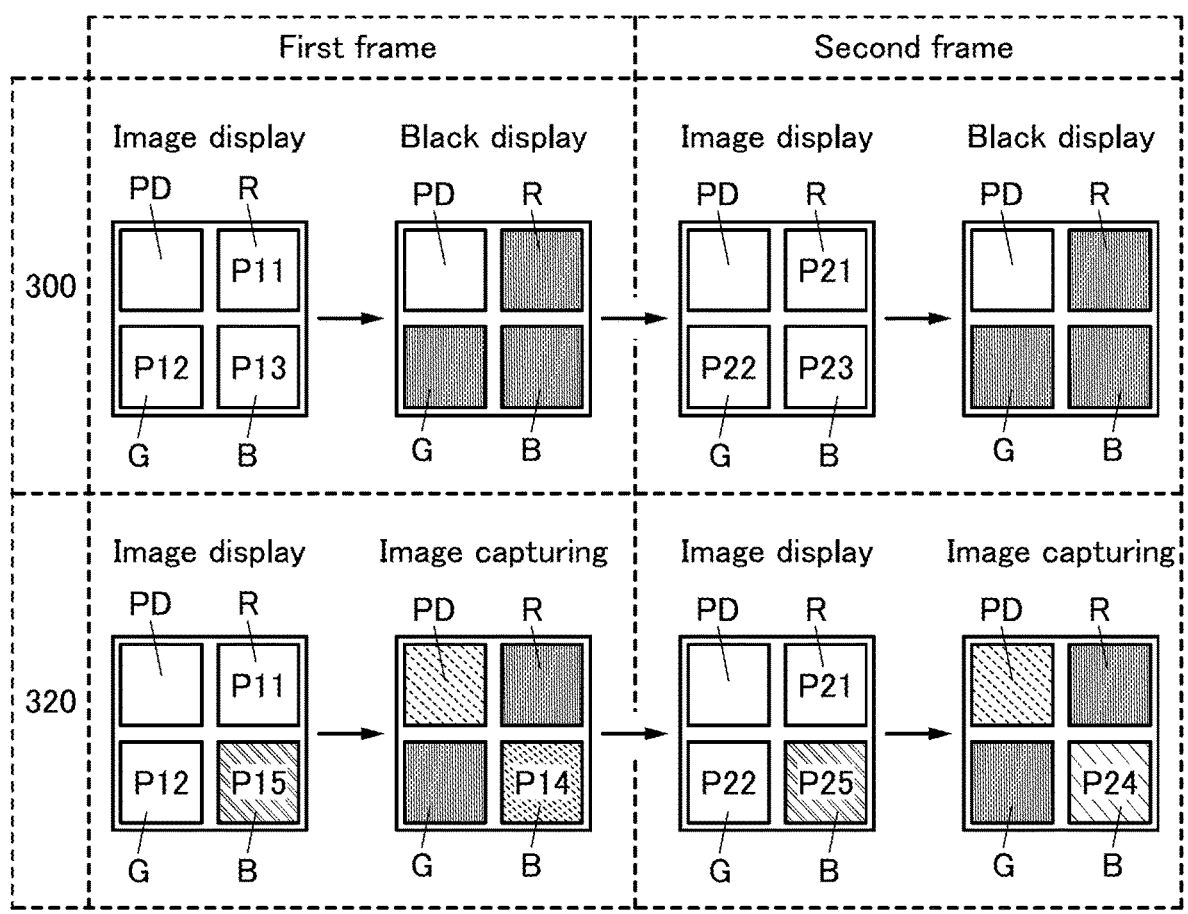
FIG. 11 is a diagram illustrating an example of a driving method of a display apparatus.

As illustrated in FIG. 11, the pixel 300 may perform black display (also referred to as black image insertion or black insertion) in a subframe where the target pixel 320 performs image capturing. When a black image is inserted between subframes where an image is displayed, motion blur and afterimages of the display device can be reduced.

Detailed structures of the display apparatus of one embodiment of the present invention are described below with reference to FIG. 12 and FIG. 13.

[Display Apparatus 100A]

Figure 12A:
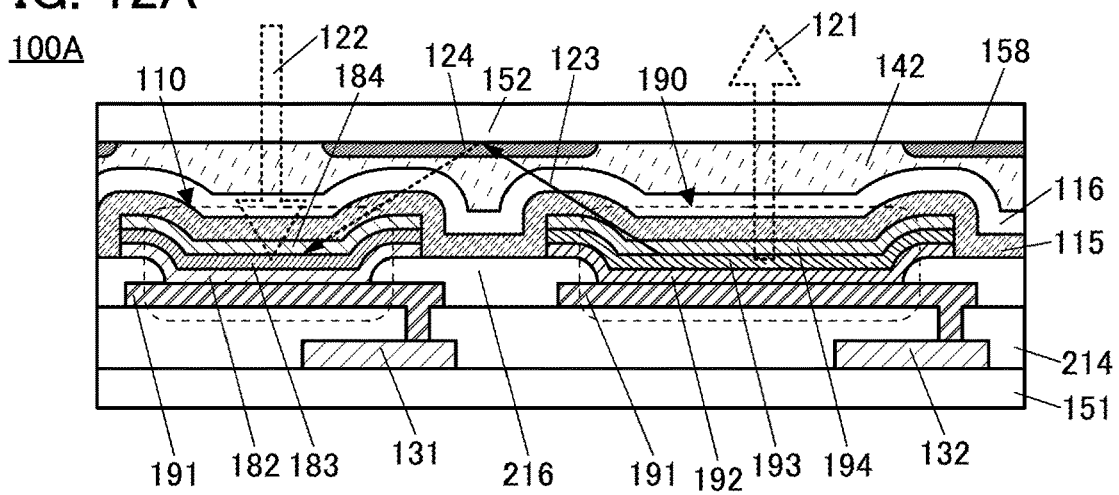
FIG. 12A to FIG. 12C are cross-sectional views each illustrating an example of a display apparatus.

FIG. 12A illustrates a cross-sectional view of a display apparatus 100A.

The display apparatus 100A includes a light-receiving device 110 and a light-emitting device 190.

The light-emitting device 190 includes a pixel electrode 191, a buffer layer 192, a light-emitting layer 193, a buffer layer 194, and a common electrode 115 which are stacked in this order. The buffer layer 192 can include one or both of a hole-injection layer and a hole-transport layer. The light-emitting layer 193 contains an organic compound. The buffer layer 194 can include one or both of an electron-injection layer and an electron-transport layer. The light-emitting device 190 has a function of emitting visible light. Note that the display apparatus 100A may also include a light-emitting device having a function of emitting infrared light.

The light-receiving device 110 includes the pixel electrode 191, a buffer layer 182, an active layer 183, a buffer layer 184, and the common electrode 115 which are stacked in this order. The buffer layer 182 can include a hole-transport layer. The active layer 183 contains an organic compound. The buffer layer 184 can include an electron-transport layer. The light-receiving device 110 has a function of detecting visible light. Note that the light-receiving device 110 may also have a function of detecting infrared light.

This embodiment is described assuming that the pixel electrode 191 functions as an anode and the common electrode 115 functions as a cathode in both the light-emitting device 190 and the light-receiving device 110. In other words, the light-receiving device 110 is driven by application of reverse bias between the pixel electrode 191 and the common electrode 115, so that light entering the light-receiving device 110 can be detected and charge can be generated and extracted as current in the display apparatus 100A.

The pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrodes 191 are positioned over an insulating layer 214. The pixel electrodes 191 can be formed using the same material in the same step. End portions of the pixel electrodes 191 are covered with a partition 216. The two pixel electrodes 191 adjacent to each other are electrically insulated (or electrically separated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided instead of the partition 216.

The common electrode 115 is a layer shared by the light-receiving device 110 and the light-emitting device 190.

The material, thickness, and the like of the pair of electrodes can be the same between the light-receiving device 110 and the light-emitting device 190. Accordingly, the manufacturing cost of the display apparatus can be reduced and the manufacturing process of the display apparatus can be simplified.

The display apparatus 100A includes the light-receiving device 110, the light-emitting device 190, a transistor 131, a transistor 132, and the like between a pair of substrates (a substrate 151 and a substrate 152).

In the light-receiving device 110, the buffer layer 182, the active layer 183, and the buffer layer 184, which are positioned between the pixel electrode 191 and the common electrode 115, can each be referred to as an organic layer (a layer containing an organic compound). The pixel electrode 191 preferably has a function of reflecting visible light. The common electrode 115 has a function of transmitting visible light. Note that in the case where the light-receiving device 110 is configured to detect infrared light, the common electrode 115 has a function of transmitting infrared light. Furthermore, the pixel electrode 191 preferably has a function of reflecting infrared light.

The light-receiving device 110 has a function of detecting light. Specifically, the light-receiving device 110 is a photoelectric conversion device that receives light 122 entering from the outside of the display apparatus 100A and converts the light into an electric signal. The light 122 can also be expressed as light that is emitted from the light-emitting device 190 and then reflected by an object. The light 122 may enter the light-receiving device 110 through a lens or the like provided in the display apparatus 100A.

In the light-emitting device 190, the buffer layer 192, the light-emitting layer 193, and the buffer layer 194, which are positioned between the pixel electrode 191 and the common electrode 115, can be collectively referred to as an EL layer. The EL layer includes at least the light-emitting layer 193. As described above, the pixel electrode 191 preferably has a function of reflecting visible light. The common electrode 115 has a function of transmitting visible light. Note that in the case where the display apparatus 100A includes a light-emitting device that emits infrared light, the common electrode 115 has a function of transmitting infrared light. Furthermore, the pixel electrode 191 preferably has a function of reflecting infrared light.

The light-emitting device included in the display apparatus of this embodiment preferably employs a micro optical resonator (microcavity) structure.

The buffer layer 192 or the buffer layer 194 may have a function as an optical adjustment layer. By changing the thickness of the buffer layer 192 or the buffer layer 194, light of a particular color can be intensified and taken out from each light-emitting device.

The light-emitting device 190 has a function of emitting visible light. Specifically, the light-emitting device 190 is an electroluminescent device that emits light to the substrate 152 side when voltage is applied between the pixel electrode 191 and the common electrode 115 (see light emission 121).

The pixel electrode 191 included in the light-receiving device 110 is electrically connected to a source or a drain of the transistor 131 through an opening provided in the insulating layer 214.

The pixel electrode 191 included in the light-emitting device 190 is electrically connected to a source or a drain of the transistor 132 through an opening provided in the insulating layer 214.

The transistor 131 and the transistor 132 are on and in contact with the same layer (the substrate 151 in FIG. 12A).

At least part of a circuit electrically connected to the light-receiving device 110 and a circuit electrically connected to the light-emitting device 190 are preferably formed using the same material in the same step. In that case, the thickness of the display apparatus can be reduced compared with the case where the two circuits are separately formed, resulting in simplification of the manufacturing steps.

The light-receiving device 110 and the light-emitting device 190 are preferably covered with a protective layer 116. In FIG. 12A, the protective layer 116 is provided on and in contact with the common electrode 115. Providing the protective layer 116 can inhibit entry of impurities such as water into the light-receiving device 110 and the light-emitting device 190, so that the reliability of the light-receiving device 110 and the light-emitting device 190 can be increased. The protective layer 116 and the substrate 152 are bonded to each other with an adhesive layer 142.

A light-shielding layer 158 is provided on a surface of the substrate 152 on the substrate 151 side. The light-shielding layer 158 has openings in a position overlapping with the light-emitting device 190 and in a position overlapping with the light-receiving device 110.

Here, the light-receiving device 110 detects light that is emitted from the light-emitting device 190 and then reflected by an object. However, in some cases, light emitted from the light-emitting device 190 is reflected inside the display apparatus 100A and enters the light-receiving device 110 without through an object. The light-shielding layer 158 can reduce the influence of such stray light. For example, in the case where the light-shielding layer 158 is not provided, light 123 emitted from the light-emitting device 190 is reflected by the substrate 152 and reflected light 124 enters the light-receiving device 110 in some cases. Providing the light-shielding layer 158 can inhibit entry of the reflected light 124 into the light-receiving device 110. Consequently, noise can be reduced, and the sensitivity of a sensor using the light-receiving device 110 can be increased.

For the light-shielding layer 158, a material that blocks light emitted from the light-emitting device can be used. The light-shielding layer 158 preferably absorbs visible light. As the light-shielding layer 158, a black matrix can be formed using a metal material or a resin material containing pigment (e.g., carbon black) or dye, for example. The light-shielding layer 158 may have a stacked-layer structure of at least two layers of a red color filter, a green color filter, and a blue color filter.

[Display Apparatus 100B]

Figure 12B:
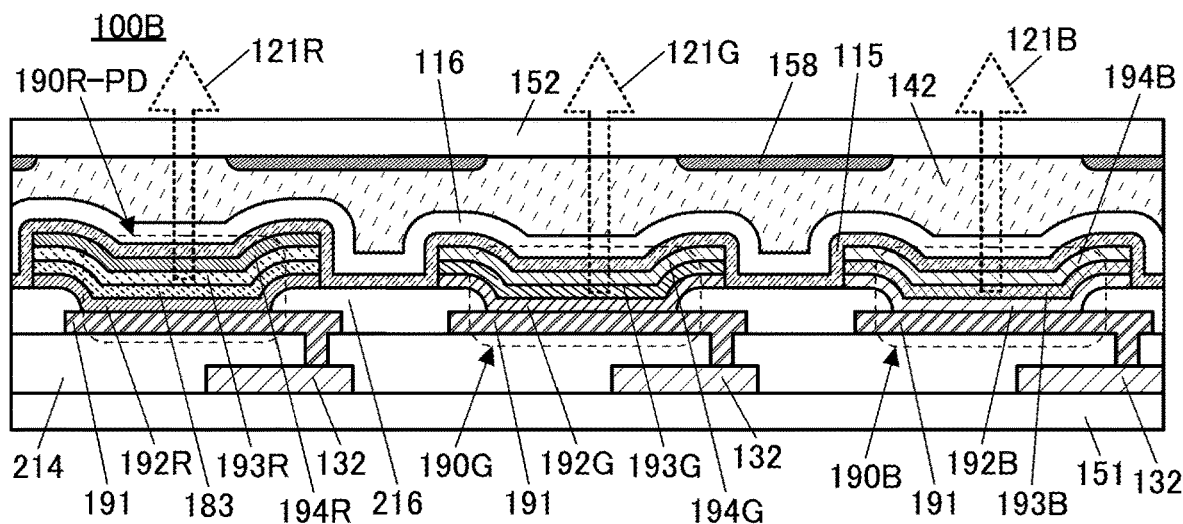
Figure 12C:
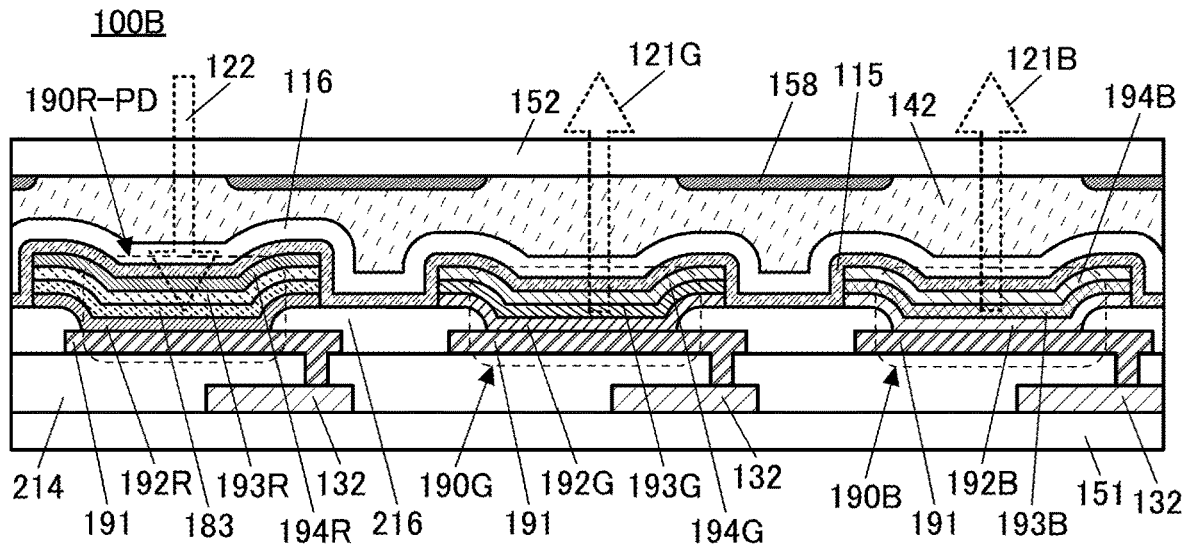

FIG. 12B and FIG. 12C illustrate cross-sectional views of a display apparatus 100B. Note that in the description of the display apparatus below, components similar to those of the above-mentioned display apparatus are not described in some cases.

The display apparatus 100B includes a light-emitting device 190B, a light-emitting device 190G, and a light-emitting and light-receiving device 190R-PD.

The light-emitting device 190B includes the pixel electrode 191, a buffer layer 192B, a light-emitting layer 193B, a buffer layer 194B, and the common electrode 115 which are stacked in this order. The light-emitting device 190B has a function of emitting blue light 121B.

The light-emitting device 190G includes the pixel electrode 191, a buffer layer 192G, a light-emitting layer 193G, a buffer layer 194G, and the common electrode 115 which are stacked in this order. The light-emitting device 190G has a function of emitting green light 121G.

The light-emitting and light-receiving device 190R-PD includes the pixel electrode 191, a buffer layer 192R, the active layer 183, a light-emitting layer 193R, a buffer layer 194R, and the common electrode 115 which are stacked in this order. The light-emitting and light-receiving device 190R-PD has a function of emitting red light 121R and a function of detecting the light 122.

FIG. 12B illustrates a case where the light-emitting and light-receiving device 190R-PD functions as a light-emitting device. FIG. 12B illustrates an example in which the light-emitting device 190B emits blue light, the light-emitting device 190G emits green light, and the light-emitting and light-receiving device 190R-PD emits red light.

FIG. 12C illustrates a case where the light-emitting and light-receiving device 190R-PD functions as a light-receiving device. FIG. 12C illustrates an example in which the light-emitting and light-receiving device 190R-PD detects blue light emitted by the light-emitting device 190B and green light emitted by the light-emitting device 190G.

The display apparatus 100B includes the light-emitting and light-receiving device 190R-PD, the light-emitting device 190G, the light-emitting device 190B, the transistor 132, and the like between a pair of substrates (the substrate 151 and the substrate 152).

The pixel electrode 191 is positioned over the insulating layer 214. The two pixel electrodes 191 adjacent to each other are electrically insulated from each other by the partition 216. The pixel electrode 191 is electrically connected to the source or the drain of the transistor through the opening provided in the insulating layer 214.

The light-emitting and light-receiving device and the light-emitting devices are preferably covered with the protective layer 116. The protective layer 116 and the substrate 152 are bonded to each other with the adhesive layer 142. The light-shielding layer 158 is provided on the surface of the substrate 152 on the substrate 151 side.

[Display Apparatus 100C]

Figure 13A:
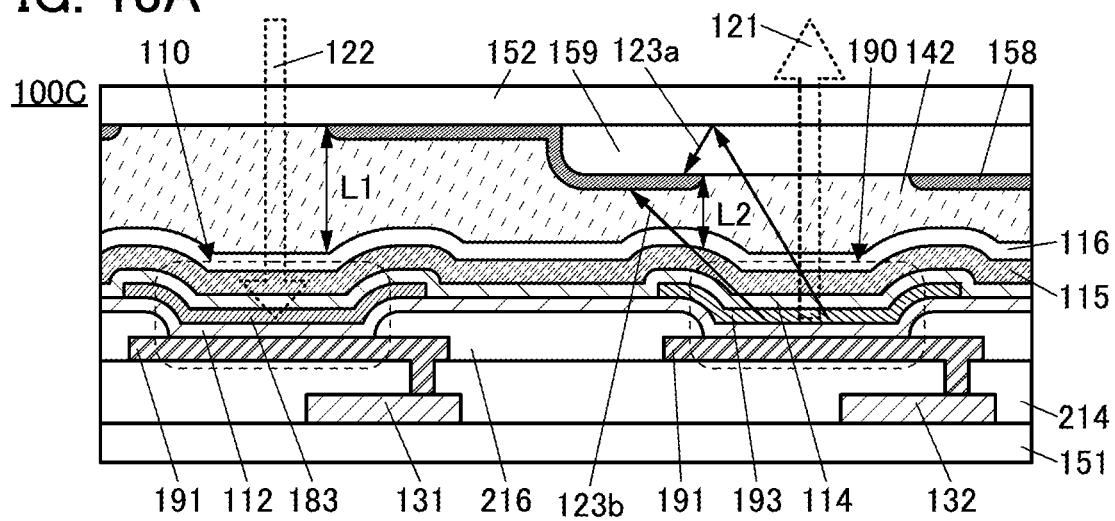
FIG. 13A is a cross-sectional view illustrating an example of a display apparatus.

FIG. 13A illustrates a cross-sectional view of a display apparatus 100C.

The display apparatus 100C includes the light-receiving device 110 and the light-emitting device 190.

The light-emitting device 190 includes the pixel electrode 191, a common layer 112, the light-emitting layer 193, a common layer 114, and the common electrode 115 in this order. The common layer 112 can include one or both of a hole-injection layer and a hole-transport layer. The light-emitting layer 193 contains an organic compound. The common layer 114 can include one or both of an electron-injection layer and an electron-transport layer. The light-emitting device 190 has a function of emitting visible light. Note that the display apparatus 100C may also include a light-emitting device having a function of emitting infrared light.

The light-receiving device 110 includes the pixel electrode 191, the common layer 112, the active layer 183, the common layer 114, and the common electrode 115 which are stacked in this order. The active layer 183 contains an organic compound. The light-receiving device 110 has a function of detecting visible light. Note that the light-receiving device 110 may also have a function of detecting infrared light.

The pixel electrode 191, the common layer 112, the active layer 183, the light-emitting layer 193, the common layer 114, and the common electrode 115 may each have a single-layer structure or a stacked-layer structure.

The pixel electrode 191 is positioned over the insulating layer 214. The two pixel electrodes 191 adjacent to each other are electrically insulated from each other by the partition 216. The pixel electrode 191 is electrically connected to the source or the drain of the transistor through the opening provided in the insulating layer 214.

The common layer 112, the common layer 114, and the common electrode 115 are layers shared by the light-receiving device 110 and the light-emitting device 190. At least some of the layers constituting the light-receiving device 110 and the light-emitting device 190 preferably have common structures, in which case the number of manufacturing steps of the display apparatus can be reduced.

The display apparatus 100C includes the light-receiving device 110, the light-emitting device 190, the transistor 131, the transistor 132, and the like between the pair of substrates (the substrate 151 and the substrate 152).

The light-receiving device 110 and the light-emitting device 190 are preferably covered with the protective layer 116. The protective layer 116 and the substrate 152 are bonded to each other with the adhesive layer 142.

A resin layer 159 is provided on the surface of the substrate 152 on the substrate 151 side. The resin layer 159 is provided in a position overlapping with the light-emitting device 190 and is not provided in a position overlapping with the light-receiving device 110.

Figure 13B:
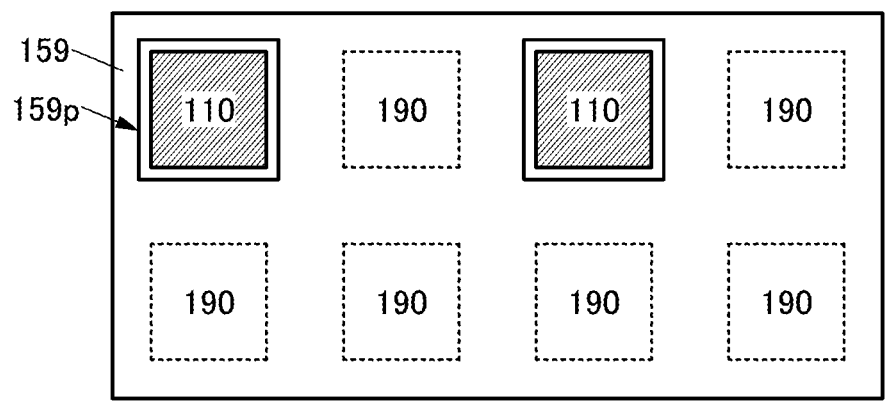
FIG. 13B and FIG. 13C are diagrams each illustrating an example of a top surface layout of a resin layer.
Figure 13C:
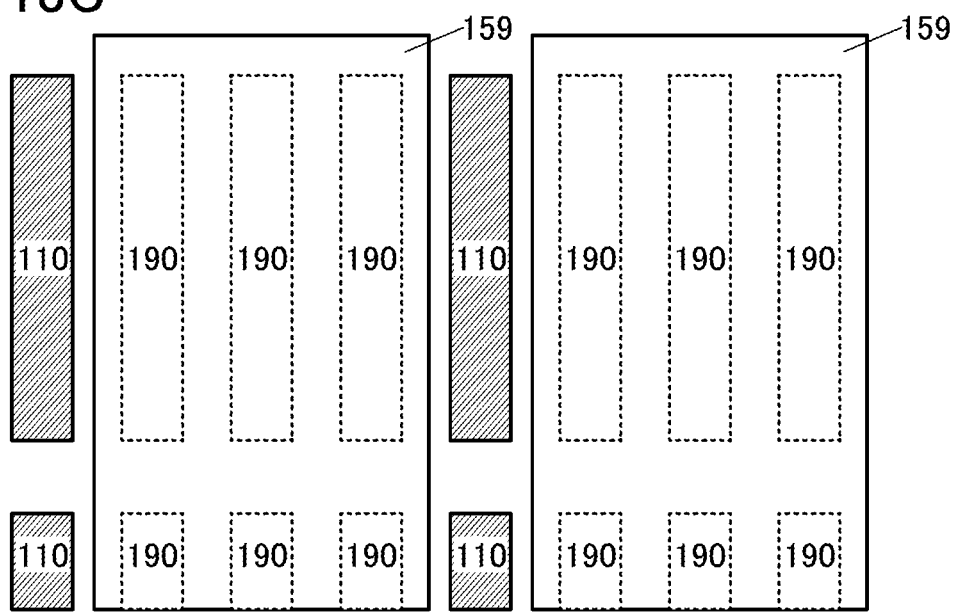

The resin layer 159 can be provided in the position overlapping with the light-emitting device 190 and have an opening 159p in the position overlapping with the light-receiving device 110, as illustrated in FIG. 13B, for example. Alternatively, as illustrated in FIG. 13C, the resin layer 159 can be provided to have an island shape in a position overlapping with the light-emitting device 190 but not in a position overlapping with the light-receiving device 110.

The light-shielding layer 158 is provided on the surface of the substrate 152 on the substrate 151 side and on a surface of the resin layer 159 on the substrate 151 side. The light-shielding layer 158 has openings in a position overlapping with the light-emitting device 190 and in a position overlapping with the light-receiving device 110.

Here, the light-receiving device 110 detects light that is emitted from the light-emitting device 190 and then reflected by an object. However, in some cases, light emitted from the light-emitting device 190 is reflected inside the display apparatus 100C and enters the light-receiving device 110 without through an object. The light-shielding layer 158 can absorb such stray light and thereby reduce entry of stray light into the light-receiving device 110. For example, the light-shielding layer 158 can absorb stray light 123a that has passed through the resin layer 159 and has been reflected by the surface of the substrate 152 on the substrate 151 side. Moreover, the light-shielding layer 158 can absorb stray light 123b before the stray light 123b reaches the resin layer 159. This can inhibit stray light from entering the light-receiving device 110. Consequently, noise can be reduced, and the sensitivity of a sensor using the light-receiving device 110 can be increased. It is particularly preferable that the light-shielding layer 158 be positioned close to the light-emitting device 190, in which case stray light can be further reduced. This is preferable also in terms of improving display quality, because the light-shielding layer 158 positioned close to the light-emitting device 190 can inhibit viewing angle dependence of display.

Providing the light-shielding layer 158 can control the range where the light-receiving device 110 detects light. When the light-shielding layer 158 is positioned apart from the light-receiving device 110 in a direction perpendicular to the substrate 151, the image-capturing range is narrowed, and the image-capturing definition can be increased.

In the case where the resin layer 159 has an opening, the light-shielding layer 158 preferably covers at least part of the opening and at least part of a side surface of the resin layer 159 exposed in the opening.

In the case where the resin layer 159 is provided in an island shape, the light-shielding layer 158 preferably covers at least part of a side surface of the resin layer 159.

Since the light-shielding layer 158 is provided along the shape of the resin layer 159 in such a manner, the distance from the light-shielding layer 158 to the light-emitting device 190 (specifically, the light-emitting region of the light-emitting device 190) is shorter than the distance from the light-shielding layer 158 to the light-receiving device 110 (specifically, the light-receiving region of the light-receiving device 110). Accordingly, noise of the sensor can be reduced, the image-capturing definition can be increased, and viewing angle dependence of display can be inhibited. Thus, both the display quality and imaging quality of the display apparatus can be increased.

The resin layer 159 is a layer that transmits light emitted from the light-emitting device 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light-shielding layer 158 is not limited to the resin layer and may be an inorganic insulating film or the like. As the component becomes thicker, a larger difference occurs between the distance from the light-shielding layer to the light-receiving device and the distance from the light-shielding layer to the light-emitting device. An organic insulating film such as a resin is suitable for the component because it is easily formed to have a large thickness.

In order to compare the distance from the light-shielding layer 158 to the light-receiving device 110 and the distance from the light-shielding layer 158 to the light-emitting device 190, it is possible to use, for example, the shortest distance L1 from an end portion of the light-shielding layer 158 on the light-receiving device 110 side to the common electrode 115 and the shortest distance L2 from an end portion of the light-shielding layer 158 on the light-emitting device 190 side to the common electrode 115. With the shortest distance L2 smaller than the shortest distance L1, stray light from the light-emitting device 190 can be inhibited, and the sensitivity of the sensor using the light-receiving device 110 can be increased. Furthermore, viewing angle dependence of display can be inhibited. With the shortest distance L1 larger than the shortest distance L2, the image-capturing range of the light-receiving device 110 can be narrowed, and the image-capturing definition can be increased.

In addition, when the adhesive layer 142 is provided such that a portion overlapping with the light-receiving device 110 is made thicker than a portion overlapping with the light-emitting device 190, a difference also can be made between the distance from the light-shielding layer 158 to the light-receiving device 110 and the distance from the light-shielding layer 158 to the light-emitting device 190.

More detailed structures of the display apparatus of one embodiment of the present invention are described below with reference to FIG. 14 to FIG. 17.

[Display Apparatus 100D]

Figure 14:
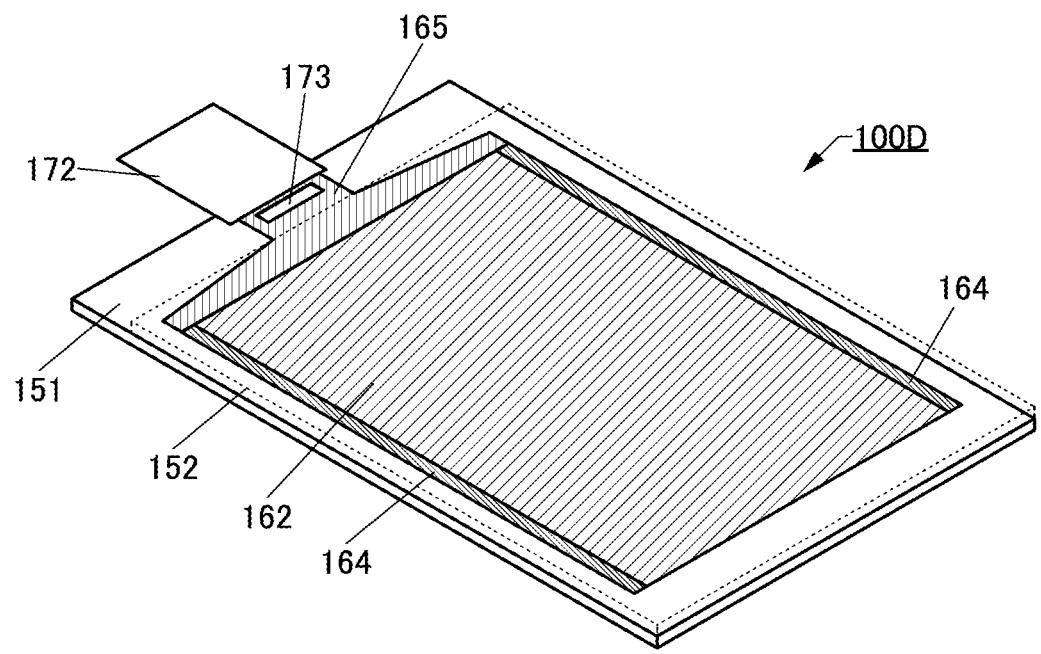
FIG. 14 is a perspective view illustrating an example of a display apparatus.
Figure 15:
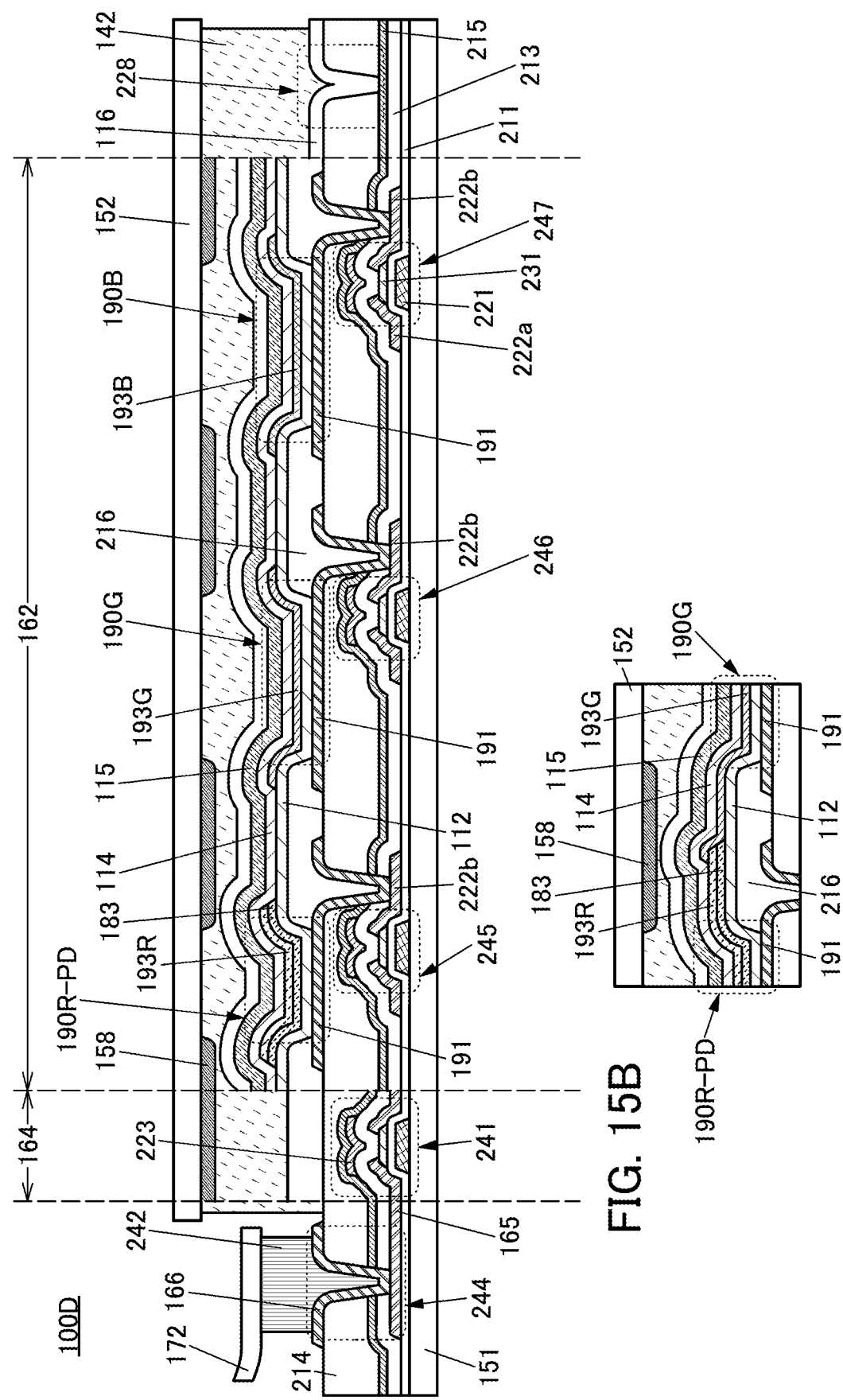
FIG. 15A and FIG. 15B are cross-sectional views illustrating an example of a display apparatus.

FIG. 14 illustrates a perspective view of a display apparatus 100D, and FIG. 15A illustrates a cross-sectional view of the display apparatus 100D.

The display apparatus 100D has a structure in which the substrate 152 and the substrate 151 are bonded to each other. In FIG. 14, the substrate 152 is denoted by a dashed line.

The display apparatus 100D includes a display portion 162, a circuit 164, a wiring 165, and the like. FIG. 14 illustrates an example in which an IC (integrated circuit) 173 and an FPC 172 are mounted on the display apparatus 100D. Thus, the structure illustrated in FIG. 14 can be regarded as a display module including the display apparatus 100D, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 14 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100D and the display module may have a structure that is not provided with an IC. The IC may be provided over the FPC by a COF method or the like.

FIG. 15A illustrates an example of cross sections of part of a region including the FPC 172, part of a region including the circuit 164, part of a region including the display portion 162, and part of a region including an end portion of the display apparatus 100D illustrated in FIG. 14.

The display apparatus 100D illustrated in FIG. 15A includes a transistor 241, a transistor 245, a transistor 246, a transistor 247, the light-emitting device 190B, the light-emitting device 190G, the light-emitting and light-receiving device 190R-PD, and the like between the substrate 151 and the substrate 152.

The substrate 152 and the protective layer 116 are bonded to each other with the adhesive layer 142. A solid sealing structure, a hollow sealing structure, or the like can be employed to seal the light-emitting device 190B, the light-emitting device 190G, and the light-emitting and light-receiving device 190R-PD. In FIG. 15A, the solid sealing structure, where a space surrounded by the substrate 152, the adhesive layer 142, and the insulating layer 214 is sealed with the adhesive layer 142, is employed.

The light-emitting device 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 247 through an opening provided in the insulating layer 214. The transistor 247 has a function of controlling the driving of the light-emitting device 190B. The end portion of the pixel electrode 191 is covered with the partition 216. The pixel electrode 191 contains a material that reflects visible light, and the common electrode 115 contains a material that transmits visible light.

The light-emitting device 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 246 through an opening provided in the insulating layer 214. The transistor 246 has a function of controlling the driving of the light-emitting device 190G.

The light-emitting and light-receiving device 190R-PD has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 245 through an opening provided in the insulating layer 214. The transistor 245 has a function of controlling the driving of the light-emitting and light-receiving device 190R-PD.

Light emitted by the light-emitting device 190B, the light-emitting device 190G, and the light-emitting and light-receiving device 190R-PD is emitted toward the substrate 152 side. Light enters the light-emitting and light-receiving device 190R-PD through the substrate 152 and the adhesive layer 142. For the substrate 152 and the adhesive layer 142, a material having a high visible-light-transmitting property is preferably used.

The pixel electrodes 191 included in the light-emitting device 190B, the light-emitting device 190G, and the light-emitting and light-receiving device 190R-PD can be formed using the same material in the same step. The common layer 112, the common layer 114, and the common electrode 115 are shared by the light-emitting device 190B, the light-emitting device 190G, and the light-emitting and light-receiving device 190R-PD. The light-emitting and light-receiving device 190R-PD has a structure in which the active layer 183 is added to the structure of the red-light-emitting device. The light-emitting device 190B, the light-emitting device 190G, and the light-emitting and light-receiving device 190R-PD can have a common structure except for the active layer 183 and the light-emitting layer 193 of each color. Thus, the display portion 162 of the display apparatus 100D can have a light-receiving function without a significant increase in the number of manufacturing steps.

Note that the light-emitting layer included in the light-emitting device may include a portion overlapping with the light-emitting layer and the active layer included in the light-emitting and light-receiving device. Similarly, the light-emitting layer included in the light-emitting device may include a portion overlapping with the light-emitting layer included in any of the other light-emitting devices. With such a structure, the resolution of the display apparatus can be increased. For example, FIG. 15B illustrates an example in which the light-emitting layer 193G included in the light-emitting device 190G overlaps with the active layer 183 and the light-emitting layer 193R included in the light-emitting and light-receiving device 190R-PD over the partition 216.

The light-shielding layer 158 is provided on the surface of the substrate 152 on the substrate 151 side. The light-shielding layer 158 includes openings in positions overlapping with the light-emitting device 190B, the light-emitting device 190G, and the light-emitting and light-receiving device 190R-PD. Providing the light-shielding layer 158 can control the range where the light-emitting and light-receiving device 190R-PD detects light. As described above, it is preferable to control light entering the light-emitting and light-receiving device by adjusting the position of the opening of the light-shielding layer provided in a position overlapping with the light-emitting and light-receiving device 190R-PD. Furthermore, with the light-shielding layer 158, light can be inhibited from directly entering the light-emitting and light-receiving device 190R-PD from the light-emitting device 190 without through an object. Hence, a sensor with less noise and high sensitivity can be obtained.

The transistor 241, the transistor 245, the transistor 246, and the transistor 247 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100D. This can inhibit entry of impurities from the end portion of the display apparatus 100D through the organic insulating film. Alternatively, the organic insulating film may be formed so that an end portion of the organic insulating film is positioned on the inner side compared to the end portion of the display apparatus 100D, thereby preventing the organic insulating film from being exposed at the end portion of the display apparatus 100D.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

By provision of the protective layer 116 that covers the light-emitting device 190B, the light-emitting device 190G, and the light-emitting and light-receiving device 190R-PD, impurities such as water can be inhibited from entering the light-emitting device 190B, the light-emitting device 190G, and the light-emitting and light-receiving device 190R-PD, leading to an increase in the reliability of the light-emitting device 190B, the light-emitting device 190G, and the light-emitting and light-receiving device 190R-PD.

In a region 228 illustrated in FIG. 15A, an opening is formed in the insulating layer 214. This can inhibit entry of impurities into the display portion 162 from the outside through the insulating layer 214 even when an organic insulating film is used as the insulating layer 214. Thus, the reliability of the display apparatus 100D can be increased.

In the region 228 in the vicinity of an end portion of the display apparatus 100D, the insulating layer 215 and the protective layer 116 are preferably in contact with each other through the opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Thus, the reliability of the display apparatus 100D can be increased.

The protective layer 116 may have a single-layer structure or a stacked-layer structure. For example, the protective layer 116 may have a stacked-layer structure of an organic insulating film and an inorganic insulating film. In that case, an end portion of the inorganic insulating film preferably extends beyond an end portion of the organic insulating film.

Each of the transistor 241, the transistor 245, the transistor 246, and the transistor 247 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 241, the transistor 245, the transistor 246, and the transistor 247. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and any of an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case where the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. In the case where the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. In the case where the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 244 is provided in a region of the substrate 151 that does not overlap with the substrate 152. In the connection portion 244, the wiring 165 is electrically connected to the FPC 172 via a conductive layer 166 and a connection layer 242. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

A variety of optical members can be arranged on an outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outer surface of the substrate 152.

For each of the substrate 151 and the substrate 152, glass, quartz, ceramic, sapphire, resin, or the like can be used. When a flexible material is used for the substrate 151 and the substrate 152, the flexibility of the display apparatus can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

For the structures, materials, and the like of the light-emitting devices 190G and 190B and the light-emitting and light-receiving device 190R-PD, the above description can be referred to.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, and tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display apparatus, and conductive layers (conductive layers functioning as a pixel electrode or a common electrode) included in a light-emitting device and a light-receiving device (or a light-emitting and light-receiving device).

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Apparatus 100E]

Figure 16:
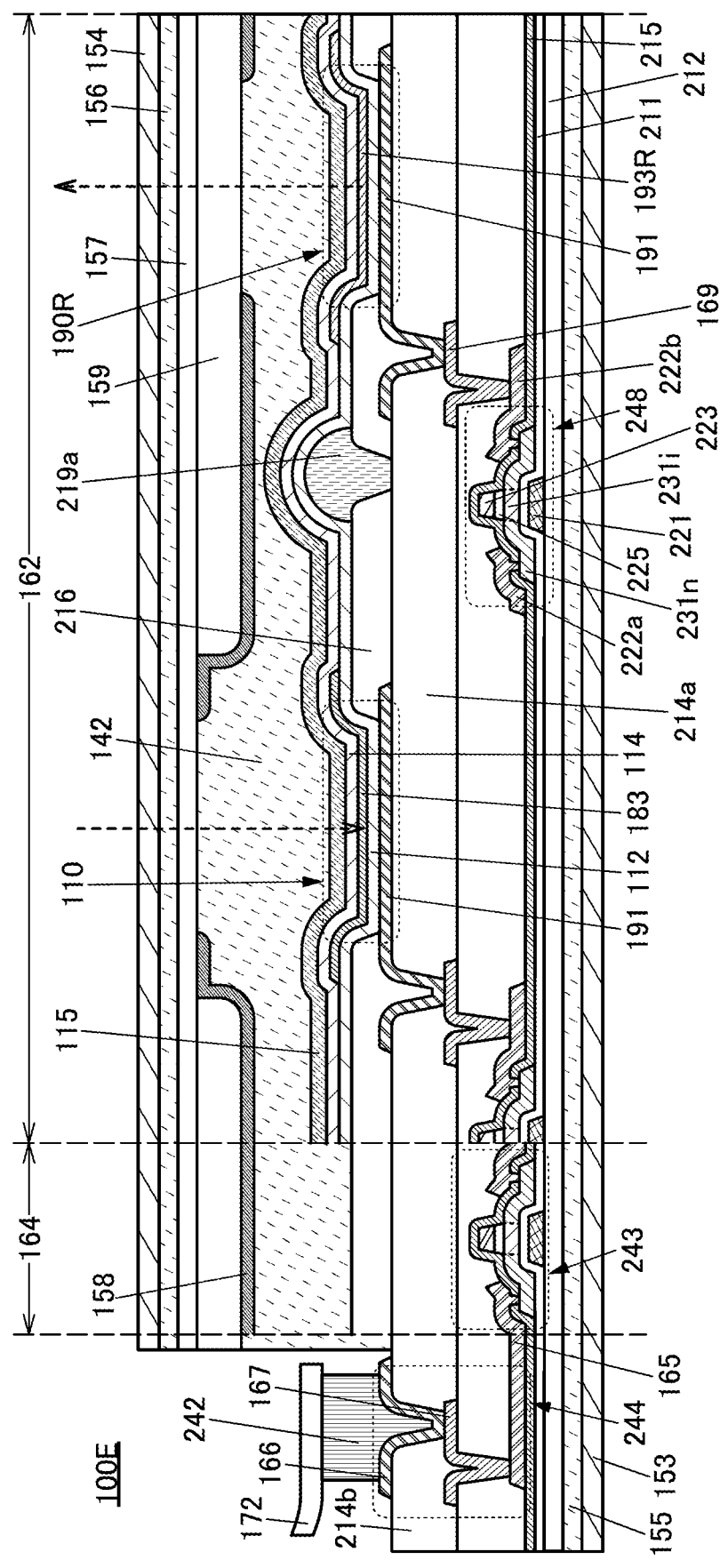
FIG. 16 is a cross-sectional view illustrating an example of a display apparatus.
Figure 17A:
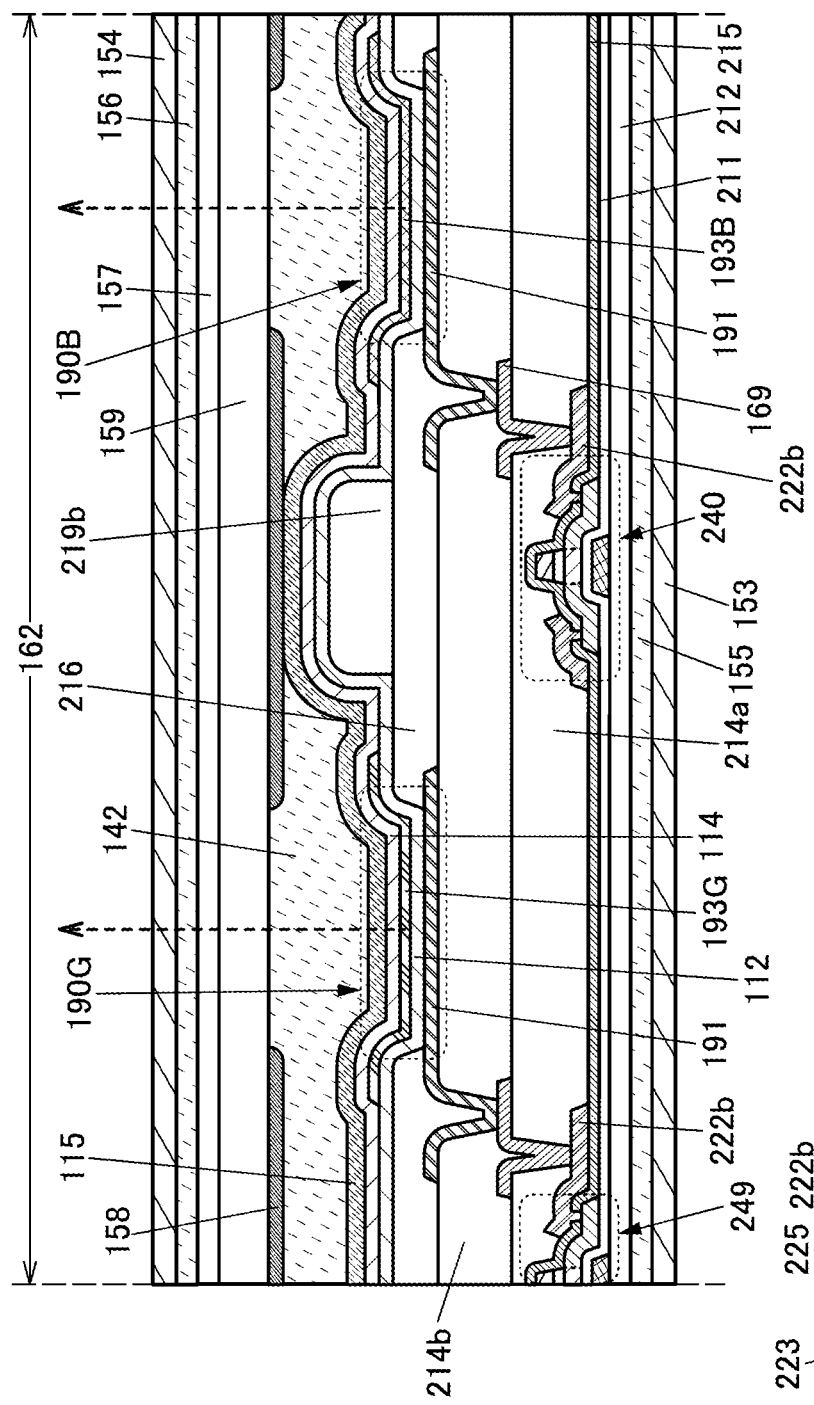
FIG. 17A is a cross-sectional view illustrating an example of a display apparatus.

FIG. 16 and FIG. 17A illustrate cross-sectional views of a display apparatus 100E. A perspective view of the display apparatus 100E is similar to that of the display apparatus 100D (FIG. 14). FIG. 16 illustrates an example of cross sections of part of a region including the FPC 172, part of the circuit 164, and part of the display portion 162 in the display apparatus 100E. FIG. 17A illustrates an example of a cross section of part of the display portion 162 in the display apparatus 100E. FIG. 16 specifically illustrates an example of a cross section of a region including the light-receiving device 110 and the light-emitting device 190R that emits red light in the display portion 162. FIG. 17A specifically illustrates an example of a cross section of a region including the light-emitting device 190G that emits green light and the light-emitting device 190B that emits blue light in the display portion 162.

The display apparatus 100E illustrated in FIG. 16 and FIG. 17A includes a transistor 243, a transistor 248, a transistor 249, a transistor 240, the light-emitting device 190R, the light-emitting device 190G, the light-emitting device 190B, the light-receiving device 110, and the like between a substrate 153 and a substrate 154.

The resin layer 159 and the common electrode 115 are bonded to each other with the adhesive layer 142, and the display apparatus 100E employs a solid sealing structure.

The substrate 153 and the insulating layer 212 are bonded to each other with an adhesive layer 155. The substrate 154 and an insulating layer 157 are bonded to each other with an adhesive layer 156.

To fabricate the display apparatus 100E, first, a first formation substrate provided with the insulating layer 212, the transistors, the light-receiving device 110, the light-emitting devices, and the like and a second formation substrate provided with the insulating layer 157, the resin layer 159, the light-shielding layer 158, and the like are bonded to each other with the adhesive layer 142. Then, the substrate 153 is bonded to a surface exposed by separation of the first formation substrate, and the substrate 154 is bonded to a surface exposed by separation of the second formation substrate, whereby the components formed over the first formation substrate and the second formation substrate are transferred to the substrate 153 and the substrate 154. The substrate 153 and the substrate 154 preferably have flexibility. Accordingly, the flexibility of the display apparatus 100E can be increased.

The inorganic insulating film that can be used as the insulating layer 211, the insulating layer 213, and the insulating layer 215 can be used as the insulating layer 212 and the insulating layer 157.

The light-emitting device 190R has a stacked-layer structure in which the pixel electrode 191, the common layer 112, the light-emitting layer 193R, the common layer 114, and the common electrode 115 are stacked in this order from an insulating layer 214b side. The pixel electrode 191 is connected to a conductive layer 169 through an opening provided in the insulating layer 214b. The conductive layer 169 is connected to the conductive layer 222b included in the transistor 248 through an opening provided in an insulating layer 214a. The conductive layer 222b is connected to a low-resistance region 231n through an opening provided in the insulating layer 215. That is, the pixel electrode 191 is electrically connected to the transistor 248. The transistor 248 has a function of controlling the driving of the light-emitting device 190R.

Similarly, the light-emitting device 190G has a stacked-layer structure in which the pixel electrode 191, the common layer 112, the light-emitting layer 193G, the common layer 114, and the common electrode 115 are stacked in this order from the insulating layer 214b side. The pixel electrode 191 is electrically connected to the low-resistance region 231n of the transistor 249 through the conductive layer 169 and the conductive layer 222b of the transistor 249. That is, the pixel electrode 191 is electrically connected to the transistor 249. The transistor 249 has a function of controlling the driving of the light-emitting device 190G.

The light-emitting device 190B has a stacked-layer structure in which the pixel electrode 191, the common layer 112, the light-emitting layer 193B, the common layer 114, and the common electrode 115 are stacked in this order from the insulating layer 214b side. The pixel electrode 191 is electrically connected to the low-resistance region 231n of the transistor 240 through the conductive layer 169 and the conductive layer 222b of the transistor 240. That is, the pixel electrode 191 is electrically connected to the transistor 240. The transistor 240 has a function of controlling the driving of the light-emitting device 190B.

The light-receiving device 110 has a stacked-layer structure in which the pixel electrode 191, the common layer 112, the active layer 183, the common layer 114, and the common electrode 115 are stacked in this order from the insulating layer 214b side.

The end portion of the pixel electrode 191 is covered with the partition 216. The pixel electrode 191 contains a material that reflects visible light, and the common electrode 115 contains a material that transmits visible light.

Light emitted by the light-emitting devices 190R, 190G, and 190B is emitted toward the substrate 154 side. Light enters the light-receiving device 110 through the substrate 154 and the adhesive layer 142. For the substrate 154, a material having a high visible-light-transmitting property is preferably used.

The pixel electrodes 191 can be formed using the same material in the same step. The common layer 112, the common layer 114, and the common electrode 115 are shared by the light-receiving device 110 and the light-emitting devices 190R, 190G, and 190B. The light-receiving device 110 and the light-emitting device of each color can have a common structure except for the active layer 183 and the light-emitting layer. Thus, the light-receiving device 110 can be incorporated into the display apparatus 100E without a significant increase in the number of manufacturing steps.

The resin layer 159 and the light-shielding layer 158 are provided on a surface of the insulating layer 157 on the substrate 153 side. The resin layer 159 is provided in positions overlapping with the light-emitting devices 190R, 190G, and 190B and is not provided in a position overlapping with the light-receiving device 110. The light-shielding layer 158 is provided to cover the surface of the insulating layer 157 on the substrate 153 side, a side surface of the resin layer 159, and a surface of the resin layer 159 on the substrate 153 side. The light-shielding layer 158 has openings in a position overlapping with the light-receiving device 110 and in positions overlapping with the light-emitting devices 190R, 190G, and 190B. Providing the light-shielding layer 158 can control the range where the light-receiving device 110 detects light. Furthermore, with the light-shielding layer 158, light can be inhibited from directly entering the light-receiving device 110 from the light-emitting devices 190R, 190G, and 190B without through an object. Hence, a sensor with less noise and high sensitivity can be obtained. Providing the resin layer 159 allows the distance from the light-shielding layer 158 to the light-emitting device of each color to be shorter than the distance from the light-shielding layer 158 to the light-receiving device 110. Accordingly, viewing angle dependence of display can be inhibited while noise of the sensor is reduced. Thus, both the display quality and imaging quality can be increased.

As illustrated in FIG. 16, the partition 216 has an opening between the light-receiving device 110 and the light-emitting device 190R. A light-shielding layer 219a is provided to fill the opening. The light-shielding layer 219a is positioned between the light-receiving device 110 and the light-emitting device 190R. The light-shielding layer 219a absorbs light emitted from the light-emitting device 190R. This can inhibit stray light from entering the light-receiving device 110.

A spacer 219b is provided over the partition 216 and positioned between the light-emitting device 190G and the light-emitting device 190B. A top surface of the spacer 219b is preferably closer to the light-shielding layer 158 than atop surface of the light-shielding layer 219a is. For example, the sum of the height (thickness) of the partition 216 and the height (thickness) of the spacer 219b is preferably larger than the height (thickness) of the light-shielding layer 219a. Thus, filling with the adhesive layer 142 can be facilitated. As illustrated in FIG. 17A, the light-shielding layer 158 may be in contact with the common electrode 115 (or the protective layer) in a portion where the spacer 219b and the light-shielding layer 158 overlap with each other.

The connection portion 244 is provided in a region of the substrate 153 that does not overlap with the substrate 154. In the connection portion 244, the wiring 165 is electrically connected to the FPC 172 through a conductive layer 167, the conductive layer 166, and the connection layer 242. The conductive layer 167 can be obtained by processing the same conductive film as the conductive layer 169. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

Each of the transistor 243, the transistor 248, the transistor 249, and the transistor 240 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

In FIG. 16 and FIG. 17A, the insulating layer 225 overlaps with the channel formation region 231i of the semiconductor layer 231 and does not overlap with the low-resistance regions 231n. The structure illustrated in FIG. 16 and FIG. 17A can be formed by processing the insulating layer 225 using the conductive layer 223 as a mask, for example. In FIG. 16 and FIG. 17A, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer that covers the transistor may be provided.

Figure 17B:
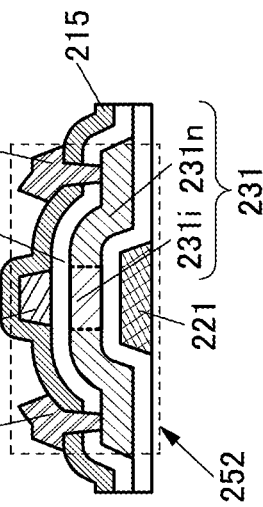
FIG. 17B is a cross-sectional view illustrating an example of a transistor.

Meanwhile, a transistor 252 illustrated in FIG. 17B is an example in which the insulating layer 225 covers a top surface and a side surface of the semiconductor layer. The conductive layer 222a and the conductive layer 222b are connected to the corresponding low-resistance regions 231*n* through openings provided in the insulating layer 225 and the insulating layer 215.

As described above, the display apparatus of one embodiment of the present invention includes at least two kinds of pixels, and a blue subpixel included in one of the pixels emits shorter-wavelength light than a blue subpixel included in the other pixel. When the two blue subpixels employ one or more structures where different light-emitting substances are used, optical adjustment layers have different thicknesses, and light is extracted through a coloring layer, the two kinds of blue subpixels having different visibility can be provided in the display apparatus. In the display apparatus, at least some of pixels have a light-receiving function, which enables the touch or approach of an object to be detected while an image is displayed. In that case, when one of the two kinds of subpixels that emits shorter-wavelength light is used as a subpixel used as a light source, light as the light source is not easily perceived by the user to achieve natural image display.

This embodiment can be combined with the other embodiments as appropriate. In this specification, in the case where a plurality of structure examples are shown in one embodiment, the structure examples can be combined as appropriate.

Embodiment 2

In this embodiment, a display apparatus of one embodiment of the present invention will be described with reference to FIG. 18.

[Pixel Circuit Example 1]

The display apparatus of one embodiment of the present invention includes, in a display portion, first pixel circuits each including a light-receiving device and second pixel circuits each including a light-emitting device. The first pixel circuits and the second pixel circuits are each arranged in a matrix.

Figure 18A:
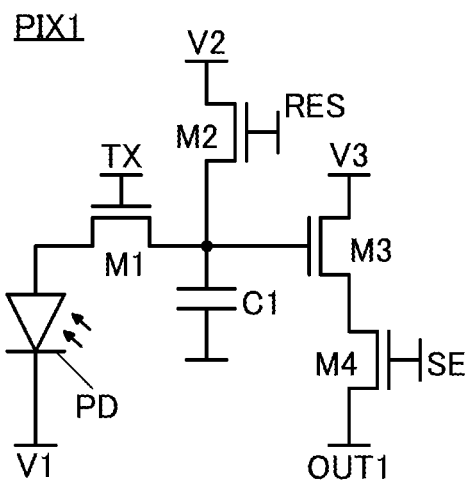
FIG. 18A to FIG. 18C are circuit diagrams each illustrating an example of a pixel circuit.
Figure 18B:
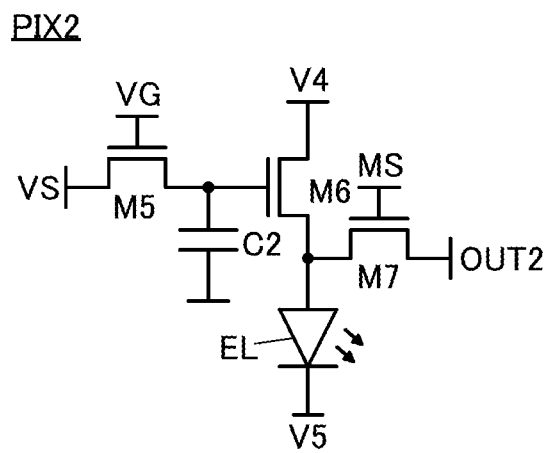

FIG. 18A illustrates an example of the first pixel circuit including a light-receiving device, and FIG. 18B illustrates an example of the second pixel circuit including a light-emitting device.

A pixel circuit PIX1 illustrated in FIG. 18A includes a light-receiving device PD, a transistor M1, a transistor M2, a transistor M3, a transistor M4, and a capacitor C1. Here, an example in which a photodiode is used as the light-receiving device PD is illustrated.

A cathode of the light-receiving device PD is electrically connected to a wiring V1, and an anode thereof is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to the wiring V1, the wiring V2, and the wiring V3. When the light-receiving device PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 18B includes a light-emitting device EL, a transistor M5, a transistor M6, a transistor M7, and a capacitor C2. Here, an example in which a light-emitting diode is used as the light-emitting device EL is illustrated. In particular, an organic EL device is preferably used as the light-emitting device EL.

A gate of the transistor M5 is electrically connected to a wiring VG, one of a source and a drain of the transistor M5 is electrically connected to a wiring VS, and the other of the source and the drain of the transistor M5 is electrically connected to one electrode of the capacitor C2 and a gate of the transistor M6. One of a source and a drain of the transistor M6 is electrically connected to a wiring V4, and the other thereof is electrically connected to an anode of the light-emitting device EL and one of a source and a drain of the transistor M7. A gate of the transistor M7 is electrically connected to a wiring MS, and the other of the source and the drain thereof is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL, in accordance with a potential supplied to the gate. When the transistor M5 is in an on state, a potential supplied to the wiring VS is supplied to the gate of the transistor M6, and the emission luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

The wiring V1, to which the cathode of the light-receiving device PD is electrically connected, and the wiring V5, to which the cathode of the light-emitting device EL is electrically connected, can be provided in the same layer and have the same level of potential.

In the display apparatus of one embodiment of the present invention, it is preferable to use transistors including a metal oxide (also referred to as an oxide semiconductor) in their semiconductor layers where channels are formed (such transistors are also referred to as OS transistors below) as all the transistors included in the pixel circuit PIX1 and the pixel circuit PIX2. An OS transistor has an extremely low off-state current and enables charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are also referred to as Si transistors below) as all the transistors included in the pixel circuit PIX1 and the pixel circuit PIX2. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

In the display apparatus of one embodiment of the present invention, two kinds of transistors are preferably used in the pixel circuit PIX1. Specifically, the pixel circuit PIX1 preferably includes an OS transistor and an LTPS transistor. Changing the material of the semiconductor layer depending on the desired function of the transistor can improve the quality of the pixel circuit PIX1 and increase the accuracy of sensing and image capturing. In that case, in the pixel circuit PIX2, one or both of an OS transistor and an LTPS transistor may be used.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use OS transistors as the transistor M1, the transistor M2, and the transistor M5 each of which is connected in series with the capacitor C1 or the capacitor C2.

A Si transistor is preferably used as the transistor M3. This enables high-speed reading operation of imaging data.

Note that the display apparatus which includes, in the display portion, the first pixel circuits each including a light-receiving device and the second pixel circuits each including a light-emitting device can be driven in any of an image display mode, an image capture mode, and a mode of simultaneously performing image display and image capturing. In the image display mode, a full-color image can be displayed using the light-emitting device, for example. In the image capture mode, an image for image capturing (e.g., a green monochromatic image or a blue monochromatic image) can be displayed using the light-emitting device and image capturing can be performed using the light-receiving device, for example. Fingerprint authentication can be performed in the image capture mode, for example. In the mode of simultaneously performing image display and image capturing, an image for image capturing can be displayed using the light-emitting device and image capturing can be performed using the light-receiving device in some pixels, and a full-color image can be displayed using the light-emitting device in the other pixels, for example.

[Pixel Circuit Example 2]

The display apparatus of one embodiment of the present invention includes, in a display portion, third pixel circuits each including a light-emitting device and light-receiving device and the second pixel circuits each including a light-emitting device. The third pixel circuits and the second pixel circuits are each arranged in a matrix. An example of the second pixel circuit is as described above (FIG. 18B).

Figure 18C:
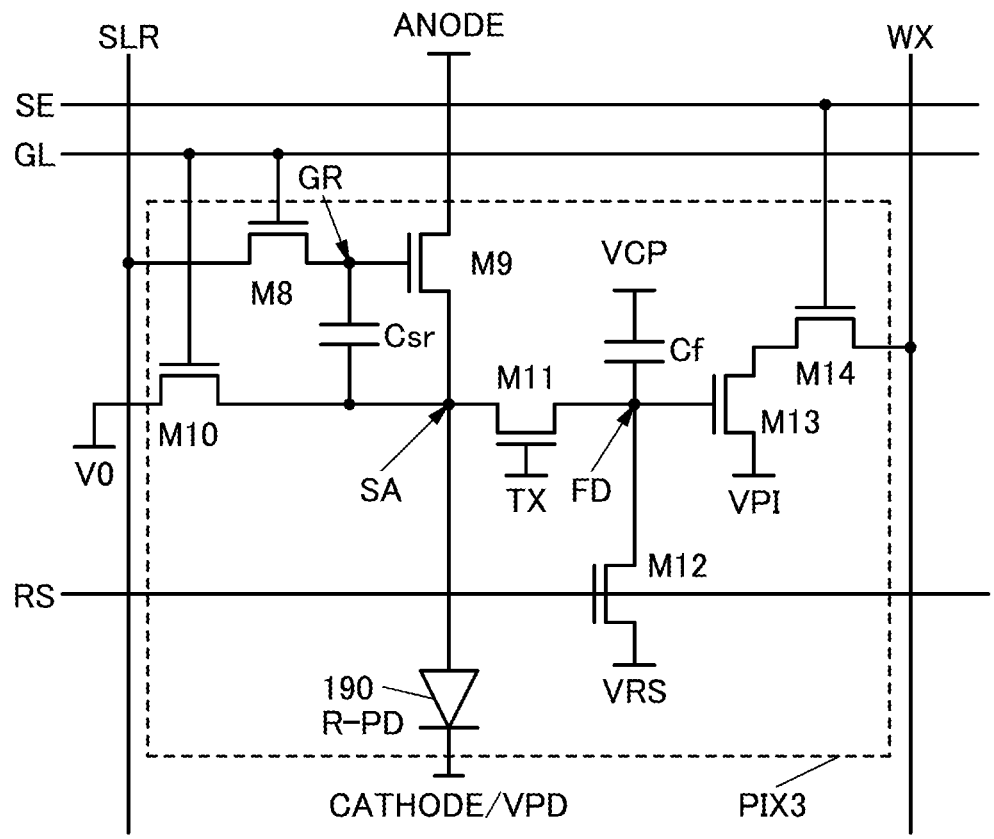

FIG. 18C illustrates an example of the third pixel circuit including a light-emitting and light-receiving device.

A pixel circuit PIX3 illustrated in FIG. 18C includes a light-emitting and light-receiving device 190R-PD that emits red light and has a light-receiving function. For example, a pixel of the display apparatus can be formed of the pixel circuit PIX3, the pixel circuit PIX2 including the light-emitting device that emits green light, and the pixel circuit PIX2 including the light-emitting device that emits blue light.

The pixel circuit PIX3 further includes a transistor M8, a transistor M9, a transistor M10, a transistor M11, a transistor M12, a transistor M13, a transistor M14, a capacitor Csr, and a capacitor Cf. The transistor M8, the transistor M10, the transistor M11, the transistor M12, and the transistor M14 each function as a switch.

A gate of the transistor M8 is electrically connected to a wiring GL, one of a source and a drain of the transistor M8 is electrically connected to a wiring SLR, and the other thereof is electrically connected to a gate of the transistor M9 and one electrode of the capacitor Csr. One of a source and a drain of the transistor M9 is electrically connected to one of a source and a drain of the transistor M10, one of a source and a drain of the transistor M11, the other electrode of the capacitor Csr, and an anode of the light-emitting and light-receiving device 190R-PD, and the other thereof is electrically connected to a wiring ANODE. A gate of the transistor M10 is electrically connected to the wiring GL, and the other of the source and the drain of the transistor M10 is electrically connected to a wiring V0. A gate of the transistor M11 is electrically connected to the wiring TX, and the other of the source and the drain of the transistor M11 is electrically connected to one of a source and a drain of the transistor M12, a gate of the transistor M13, and one electrode of the capacitor Cf. A gate of the transistor M12 is electrically connected to a wiring RS, and the other of the source and the drain of the transistor M12 is electrically connected to a wiring VRS. One of a source and a drain of the transistor M13 is electrically connected to one of a source and a drain of the transistor M14, and the other thereof is electrically connected to a wiring VPI. A gate of the transistor M14 is electrically connected to the wiring SE, and the other of the source and the drain of the transistor M14 is electrically connected to a wiring WX. The other electrode of the capacitor Cf is electrically connected to a wiring VCP. A cathode of the light-emitting and light-receiving device 190R-PD is electrically connected to a wiring CATHODE/VPD.

Signals for controlling operations of the transistors are supplied to the wiring GL, the wiring SE, the wiring TX, and the wiring RS.

In the case where image display is performed, an image signal VdataR is supplied to the wiring SLR.

Predetermined potentials are supplied to the wiring V0, the wiring VPI, the wiring VCP, the wiring VRS, the wiring ANODE, and the wiring CATHODE/VPD. A potential Vo corresponding to black display of the image signal VdataR (e.g., 0 V) is supplied to the wiring V0. A potential higher than a gate voltage range of the transistor M13 is supplied to the wiring VPI. An arbitrary potential (e.g., 0 V) can be supplied to the wiring VCP. A potential lower than that of the wiring CATHODE/VPD is supplied to the wiring VRS. A potential higher than that of the wiring CATHODE/VPD is supplied to the wiring ANODE.

The wiring CATHODE/VPD and the wiring V5 illustrated in FIG. 18B can be provided in the same layer and have the same level of potential.

The transistor M8 and the transistor M10 are controlled with the signal supplied to the wiring GL and function as selection transistors for controlling the selection state of the pixel.

The transistor M9 functions as a driving transistor that controls a current flowing through the light-emitting and light-receiving device 190R-PD in accordance with a potential supplied to the gate.

When the transistor M8 is in a conducting state, the transistor M10 is also in a conducting state at the same time, so that a potential supplied to the wiring SLR (e.g., the image signal VdataR) is supplied to the gate of the transistor M9 and the potential Vo supplied to the wiring V0 is supplied to the other of the source and the drain of the transistor M10. Charge corresponding to the voltage VdataR−Vo is accumulated in the capacitor Csr. The light-emitting and light-receiving device 190R-PD can emit light with a luminance corresponding to the potential of a node GR (the gate potential of the transistor M9).

The transistor M11 is controlled with the signal supplied to the wiring TX and has a function of controlling the timing at which the potential of a node FD changes, in accordance with a current flowing through the light-emitting and light-receiving device 190R-PD. The transistor M12 is controlled with the signal supplied to the wiring RS and has a function of resetting the potential of the node FD connected to the gate of the transistor M13 to a potential supplied to the wiring VRS. The transistor M13 functions as an amplifier transistor that performs output corresponding to the potential of the node FD. The transistor M14 is controlled with the signal supplied to the wiring SE and functions as a selection transistor for reading an output corresponding to the potential of the node FD by an external circuit connected to the wiring WX.

Note that the display apparatus which includes, in the display portion, the third pixel circuits each including a light-emitting and light-receiving device and the second pixel circuits each including a light-emitting device can be driven in any of an image display mode, an image capture mode, and a mode of simultaneously performing image display and image capturing. In the image display mode, a full-color image can be displayed using the light-emitting and light-receiving device and the light-emitting device, for example. In the image capture mode, an image for image capturing (e.g., a green monochromatic image or a blue monochromatic image) can be displayed using the light-emitting device and image capturing can be performed using the light-emitting and light-receiving device, for example. Fingerprint identification can be performed in the image capture mode, for example. In the mode of simultaneously performing image display and image capturing, an image for image capturing can be displayed using the light-emitting device and image capturing can be performed using the light-emitting and light-receiving device in some pixels, and a full-color image can be displayed using the light-emitting and light-receiving device and the light-emitting device in the other pixels, for example.

In the display apparatus of one embodiment of the present invention, OS transistors are preferably used as all the transistors included in the pixel circuit PIX3 and the pixel circuit PIX2. An OS transistor has an extremely low off-state current and enables charge accumulated in a capacitor that is series-connected to the transistor to be held for a long time. Furthermore, the power consumption of the display apparatus can be reduced with the OS transistors.

Alternatively, in the display apparatus of one embodiment of the present invention, Si transistors are preferably used as all the transistors included in the pixel circuit PIX3 and the pixel circuit PIX2. It is particularly preferable to use LTPS transistors. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

Alternatively, in the display apparatus of one embodiment of the present invention, two kinds of transistors are preferably used in the pixel circuit PIX3. Specifically, the pixel circuit PIX3 preferably includes an OS transistor and an LTPS transistor. Changing the material of the semiconductor layer depending on the desired function of the transistor can increase the quality of the pixel circuit PIX3 and the accuracy of sensing and image capturing. In that case, one or both of an OS transistor and an LTPS transistor may be used in the pixel circuit PIX2.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Such a low off-state current enables retention of charge accumulated in a capacitor that is connected in series to the transistor for a long time. Therefore, it is particularly preferable to use OS transistors as the transistor M8, the transistor M10, the transistor M11, and the transistor M12 each of which is connected in series to the capacitor C2, the capacitor Csr, or the capacitor Cf.

A Si transistor is preferably used as the transistor M13. This enables high-speed reading operation of imaging data.

Although n-channel transistors are illustrated as the transistors in FIG. 18A to FIG. 18C, p-channel transistors can also be used. Furthermore, the transistors are not limited to single-gate transistors and may include a back gate.

One or more layers including the transistor and/or the capacitor are preferably provided in a position overlapping with the light-receiving device PD, the light-emitting device EL, or the light-emitting and light-receiving device 190R-PD. Thus, the effective area of each pixel circuit can be reduced, and a high-resolution display portion can be achieved.

This embodiment can be combined with the other embodiments as appropriate.

Embodiment 3

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ $cm^{-3}$, preferably lower than or equal to $1 \times 10^{15}$ $cm^{-3}$, further preferably lower than or equal to $1 \times 10^{13}$ $cm^{-3}$, still further preferably lower than or equal to $1 \times 10^{11}$ $cm^{-3}$, yet further preferably lower than $1 \times 10^{10}$ $cm^{-3}$, and higher than or equal to $1 \times 10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/$cm^3$, preferably lower than or equal to $2 \times 10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate.

Embodiment 4

In this embodiment, electronic devices of embodiments of the present invention are described with reference to FIG. 19 to FIG. 21.

An electronic device in this embodiment includes a display apparatus of one embodiment of the present invention. For example, the display apparatus of one embodiment of the present invention can be used in a display portion of the electronic device. The display apparatus of one embodiment of the present invention has a function of detecting light, and thus can perform biological authentication with the display portion or detect touch (touch or approach) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 19A:
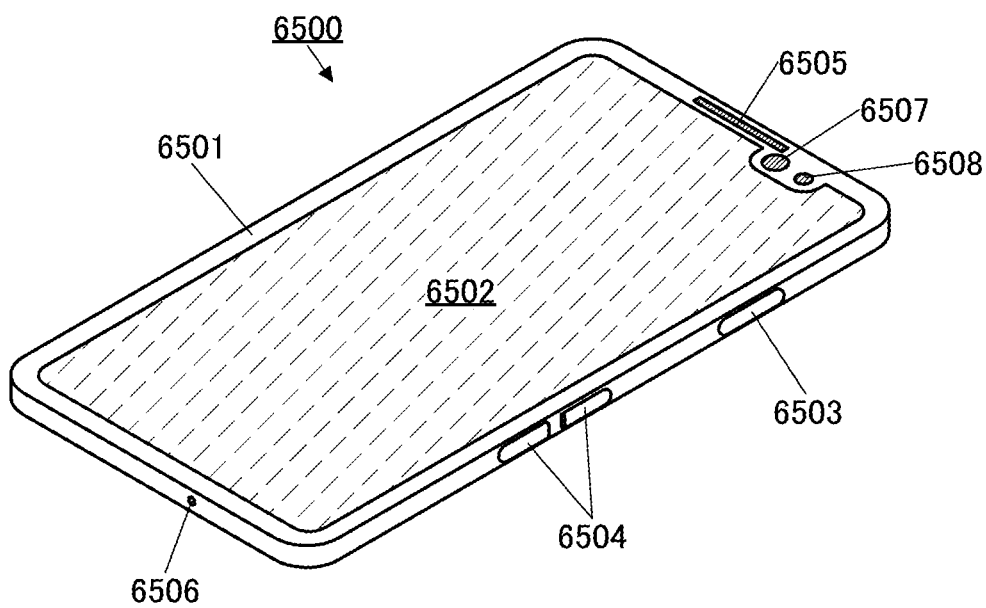
FIG. 19A and FIG. 19B are diagrams each illustrating an example of an electronic device.

An electronic device 6500 illustrated in FIG. 19A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 19B:
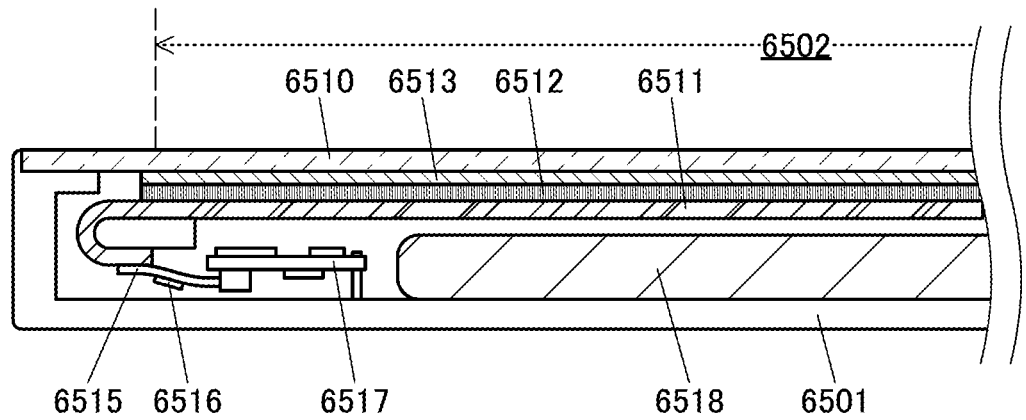

FIG. 19B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 20A:
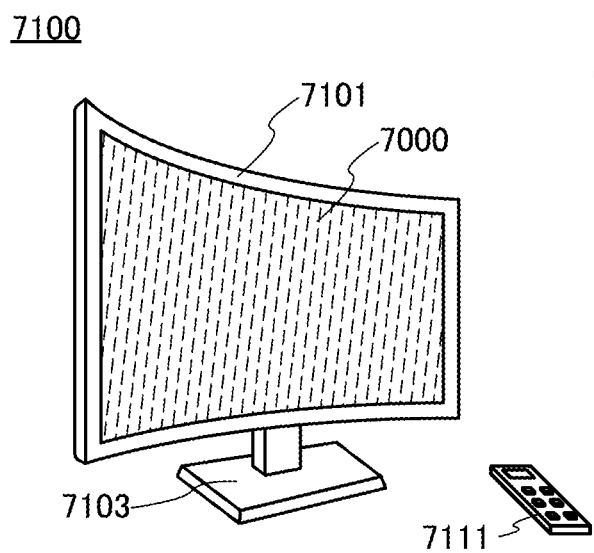
FIG. 20A to FIG. 20D are diagrams each illustrating an example of an electronic device.

FIG. 20A illustrates an example of a television device. In a television device 7100, a display portion 7000 is incorporated in a housing 7101. Here, a structure in which the housing 7101 is supported by a stand 7103 is illustrated.

A display apparatus of one embodiment of the present invention can be used in the display portion 7000.

Operation of the television device 7100 illustrated in FIG. 20A can be performed with an operation switch provided in the housing 7101 or a separate remote controller 7111.

Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 20B:
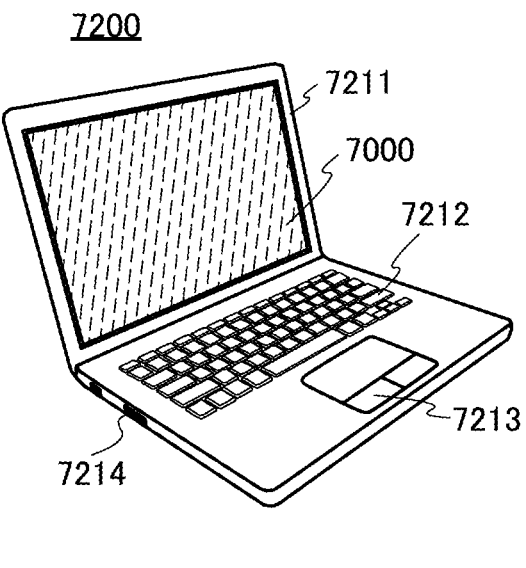

FIG. 20B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display apparatus of one embodiment of the present invention can be used in the display portion 7000.

Figure 20C:
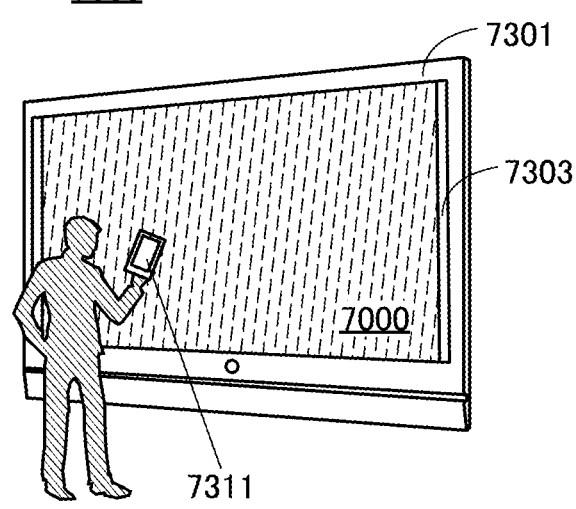
Figure 20D:
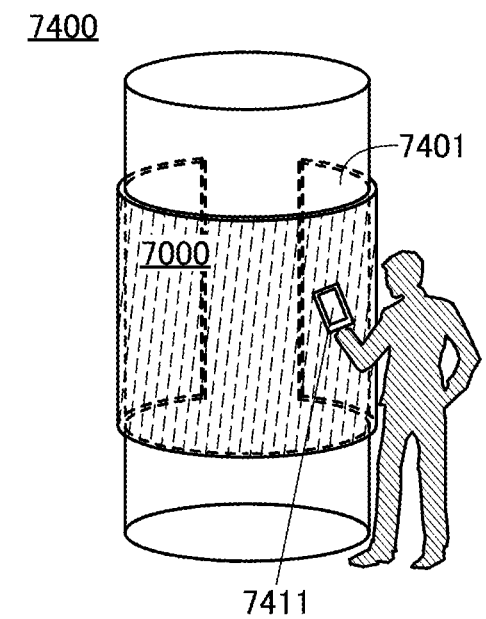

FIG. 20C and FIG. 20D illustrate examples of digital signage.

Digital signage 7300 illustrated in FIG. 20C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 20D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 20C and FIG. 20D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 20C and FIG. 20D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 21A to FIG. 21F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21A to FIG. 21F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 21A to FIG. 21F are described below.

Figure 21A:
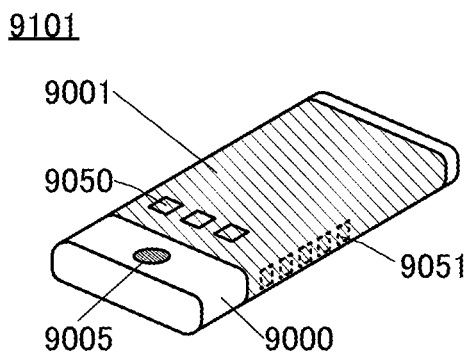
FIG. 21A to FIG. 21F are diagrams each illustrating an example of an electronic device.

FIG. 21A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display characters and image information on its plurality of surfaces. FIG. 21A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 21B:
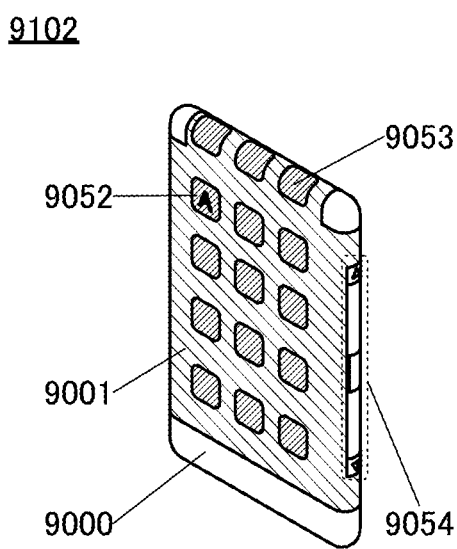

FIG. 21B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer the call, for example.

Figure 21C:
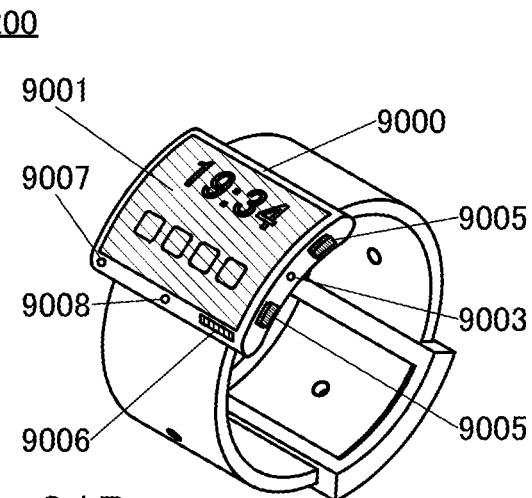

FIG. 21C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 21D:
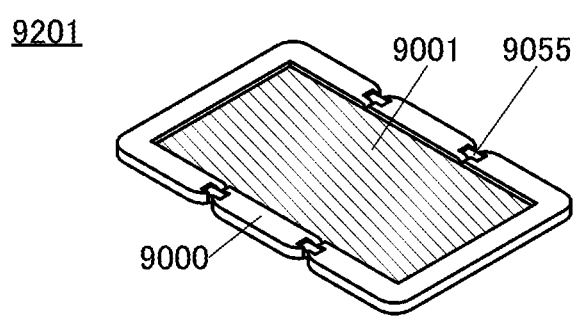
Figure 21E:
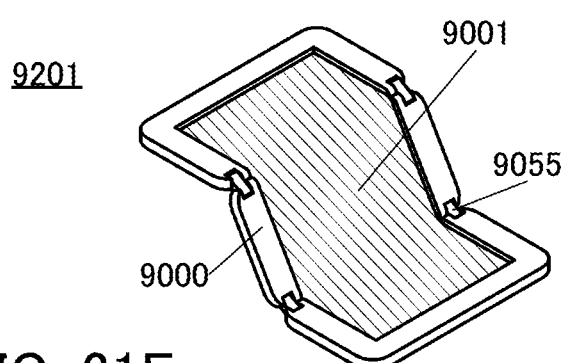
Figure 21F:
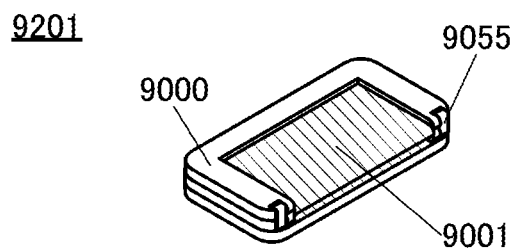

FIG. 21D to FIG. 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

This embodiment can be combined with the other embodiments as appropriate.

REFERENCE NUMERALS

B1: subpixel, B2: subpixel, C1: capacitor, C2: capacitor, L1: shortest distance, L2: shortest distance, M1: transistor, M2: transistor, M3: transistor, M4: transistor, M5: transistor, M6: transistor, M7: transistor, M8: transistor, M9: transistor, M10: transistor, M11: transistor, M12: transistor, M13: transistor, M14: transistor, OUT1: wiring, OUT2: wiring, P11: luminance value, P12: luminance value, P13: luminance value, P14: luminance value, P15: luminance value, P21: luminance value, P22: luminance value, P23: luminance value, P24: luminance value, P25: luminance value, PIX1: pixel circuit, PIX2: pixel circuit, PIX3: pixel circuit, V0: wiring, V1: wiring, V2: wiring, V3: wiring, V4: wiring, V5: wiring, 100A: display apparatus, 100B: display apparatus, 100C: display apparatus, 100D: display apparatus, 100E: display apparatus, 110: light-receiving device, 112: common layer, 114: common layer, 115: common electrode, 116: protective layer, 121: light emission, 121B: light, 121G: light, 121R: light, 122: light, 123: light, 123a: stray light, 123b: stray light, 124: reflected light, 131: transistor, 132: transistor, 142: adhesive layer, 151: substrate, 152: substrate, 153: substrate, 154: substrate, 155: adhesive layer, 156: adhesive layer, 157: insulating layer, 158: light-shielding layer, 159: resin layer, 159p: opening, 162: display portion, 164: circuit, 165: wiring, 166: conductive layer, 167: conductive layer, 169: conductive layer, 172: FPC, 173: IC, 182: buffer layer, 183: active layer, 184: buffer layer, 190: light-emitting device, 190B: light-emitting device, 190G: light-emitting device, 190R: light-emitting device, 190R-PD: light-emitting and light-receiving device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 200A: display apparatus, 200B: display apparatus, 201: substrate, 202: finger, 203: layer including light-receiving device, 204: layer including light-emitting and light-receiving device, 205: functional layer, 207: layer including light-emitting device, 208: stylus, 209: substrate, 211: insulating layer, 212: insulating layer, 213: insulating layer, 214: insulating layer, 214a: insulating layer, 214b: insulating layer, 215: insulating layer, 216: partition, 219a: light-shielding layer, 219b: spacer, 221: conductive layer, 222a: conductive layer, 222b: conductive layer, 223: conductive layer, 225: insulating layer, 228: region, 231: semiconductor layer, 231i: channel formation region, 231n: low-resistance region, 240: transistor, 241: transistor, 242: connection layer, 243: transistor, 244: connection portion, 245: transistor, 246: transistor, 247: transistor, 248: transistor, 249: transistor, 251: substrate, 252: transistor, 255: functional layer, 259: substrate, 261: contact portion, 262: fingerprint, 263: image-capturing range, 266: path, 270B: light-emitting device, 270B1: light-emitting device, 270B2: light-emitting device, 270G: light-emitting device, 270PD: light-receiving device, 270R: light-emitting device, 270R-PD: light-emitting and light-receiving device, 271: pixel electrode, 272: optical adjustment layer, 272B: optical adjustment layer, 272G: optical adjustment layer, 272PD: optical adjustment layer, 272R: optical adjustment layer, 273: active layer, 275: common electrode, 277: electrode, 278: electrode, 280A: display apparatus, 280B: display apparatus, 280C: display apparatus, 280D: display apparatus, 280E: display apparatus, 280F: display apparatus, 280G: display apparatus, 281: hole-injection layer, 282: hole-transport layer, 282B1: hole-transport layer, 282B2: hole-transport layer, 282G: hole-transport layer, 282PD: hole-transport layer, 282R: hole-transport layer, 283: light-emitting layer, 283B: light-emitting layer, 283B1: light-emitting layer, 283B2: light-emitting layer, 283G: light-emitting layer, 283R: light-emitting layer, 284: electron-transport layer, 285: electron-injection layer, 286a: unit, 286b: unit, 287: intermediate layer, 289: layer serving as both light-emitting layer and active layer, 290B: light-emitting device, 295: light-receiving device, 300: pixel, 300a: pixel, 300b: pixel, 300c: pixel, 305: light, 320: target pixel, 320a: target pixel, 320b: target pixel, 330: subpixel, 330a: pixel, 330b: pixel, 330c: pixel, 330d: pixel, 340: finger, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2019-187949 filed on Oct. 11, 2019, the entire contents of which are hereby incorporated herein by reference.

The invention claimed is:

1. A display apparatus comprising:
a first subpixel, a second subpixel, and a third subpixel,
wherein the first subpixel comprises a first light-emitting device configured to emit light with a first color,
wherein the second subpixel comprises a light-receiving device configured to receive light emitted from the first light-emitting device and reflected by an object on or adjacent to a surface of the display apparatus,
wherein the third subpixel comprises a second light-emitting device configured to emit light with a second color,
wherein the light with the first color has a wavelength shorter than or equal to blue light,
wherein the second color is blue,
wherein the wavelength of the light with the first color is shorter than a wavelength of the light with the second color,
wherein the first subpixel is configured to be used as a light source for touch detection, and
wherein the third subpixel is configured to be used for image display.

2. The display apparatus according to claim 1,
wherein the first light-emitting device comprises a first light-emitting layer and a first optical adjustment layer under the first light-emitting layer,
wherein the second light-emitting device comprises a second light-emitting layer and a second optical adjustment layer under the second light-emitting layer, and
wherein a thickness of the first optical adjustment layer is different from a thickness of the second optical adjustment layer.

3. The display apparatus according to claim 1,
wherein the first subpixel further comprises a coloring layer,
wherein the coloring layer and a light-emitting region of the first light-emitting device overlap each other, and
wherein the coloring layer is configured to absorb part of the light emitted from the first light-emitting device.

4. The display apparatus according to claim 1, wherein the first light-emitting device and the second light-emitting device comprise a same light-emitting layer.

5. The display apparatus according to claim 1,
wherein the first light-emitting device comprises a first light-emitting layer including a first light-emitting substance,
wherein the second light-emitting device comprises a second light-emitting layer including a second light-emitting substance, and
wherein the first light-emitting substance is configured to emit shorter-wavelength light than the second light-emitting substance.

6. The display apparatus according to claim 1,
wherein the light-receiving device is configure to receive the light emitted from the first light-emitting device and to convert the light into an electric signal.

7. The display apparatus according to claim 1,
wherein the second subpixel comprises a light-emitting and light-receiving device,
wherein the light-emitting and light-receiving device is configured:
to emit light; and
to receive the light emitted from the first light-emitting device and to convert the light into an electric signal, and
wherein the light emitted from the light-emitting and light-receiving device has a longer wavelength than the light emitted from the first light-emitting device.

8. The display apparatus according to claim 1,
wherein the first subpixel and the second subpixel belong to a first pixel, and
wherein the third subpixel belongs to a second pixel.

9. The display apparatus according to claim 1,
wherein the first subpixel belongs to a first pixel,
wherein the second subpixel belongs to a second pixel, and
wherein the third subpixel belongs to a third pixel.

10. The display apparatus according to claim 9,
wherein the first pixel further comprises a fourth subpixel,
wherein the second subpixel comprises a fifth subpixel,
wherein the third subpixel comprises a sixth subpixel, and
wherein the fourth subpixel, the fifth subpixel and the sixth subpixel are configured to emit light with a same color.

11. An electronic device comprising:
the display apparatus according to claim 1.

12. A display apparatus comprising:
a first subpixel, a second subpixel, and a third subpixel,
wherein the first subpixel comprises a first light-emitting device configured to emit light with a first color,
wherein the second subpixel comprises a light-receiving device configured to receive light emitted from the first light-emitting device and reflected by an object on or adjacent to a surface of the display apparatus,
wherein the third subpixel comprises a second light-emitting device configured to emit light with a second color,
wherein the second color is blue,
wherein a wavelength of the light with the first color is shorter than a wavelength of the light with the second color,
wherein the first subpixel is configured to be used as a light source for touch detection,
wherein the third subpixel is configured to be used for image display,
wherein the first light-emitting device comprises:
a first pixel electrode;
a first light-emitting layer over the first pixel electrode; and
a first part of a common electrode overlapping with the first light-emitting layer, and
wherein the light-receiving device comprises:
a second pixel electrode;
an active layer over the second pixel electrode; and
a second part of the common electrode overlapping with the active layer.

13. The display apparatus according to claim 12,
wherein the first light-emitting device comprises a first optical adjustment layer under the first light-emitting layer,
wherein the second light-emitting device comprises a second light-emitting layer and a second optical adjustment layer under the second light-emitting layer, and
wherein a thickness of the first optical adjustment layer is different from a thickness of the second optical adjustment layer.

14. The display apparatus according to claim 13, wherein the first light-emitting layer and the second light-emitting layer comprise a same light-emitting substance.

15. The display apparatus according to claim 12,
wherein the first light-emitting layer includes a first light-emitting substance,
wherein the second light-emitting device comprises a second light-emitting layer including a second light-emitting substance, and
wherein the first light-emitting substance is configured to emit shorter-wavelength light than the second light-emitting substance.

16. The display apparatus according to claim 12,
wherein the first subpixel and the second subpixel belong to a first pixel, and
wherein the third subpixel belongs to a second pixel.

17. The display apparatus according to claim 12,
wherein the first subpixel belongs to a first pixel,
wherein the second subpixel belongs to a second pixel, and
wherein the third subpixel belongs to a third pixel.

18. An electronic device comprising:
the display apparatus according to claim 12.

* * * * *